(12) United States Patent
Nishimura et al.

(10) Patent No.: US 6,828,078 B2
(45) Date of Patent: Dec. 7, 2004

(54) COMPOSITION HAVING REFRACTIVE INDEX SENSITIVELY CHANGEABLE BY RADIATION AND METHOD FOR FORMING REFRACTIVE INDEX PATTERN

(75) Inventors: Isao Nishimura, Tokyo (JP); Nobuo Bessho, Tokyo (JP); Atsushi Kumano, Tokyo (JP); Tsutomu Shimokawa, Tokyo (JP); Kenji Yamada, Kyoto (JP)

(73) Assignee: JSR Corporation, Tokyo (JP)

( * ) Notice: Subject to any disclaimer, the term of this patent is extended or adjusted under 35 U.S.C. 154(b) by 323 days.

(21) Appl. No.: 10/110,237

(22) PCT Filed: Aug. 24, 2001

(86) PCT No.: PCT/JP01/07275

§ 371 (c)(1),
(2), (4) Date: Apr. 23, 2002

(87) PCT Pub. No.: WO02/19034

PCT Pub. Date: Mar. 7, 2002

(65) Prior Publication Data

US 2003/0064303 A1 Apr. 3, 2003

(30) Foreign Application Priority Data

| Aug. 29, 2000 | (JP) | 2000-258524 |
| Sep. 1, 2000 | (JP) | 2000-265483 |
| Oct. 24, 2000 | (JP) | 2000-324508 |
| Nov. 13, 2000 | (JP) | 2000-345764 |
| Nov. 27, 2000 | (JP) | 2000-360075 |
| Jan. 26, 2001 | (JP) | 2001-018765 |

(51) Int. Cl.$^7$ .................. G03F 7/004; G03F 7/36; C08L 83/14; C08L 101/00; G02B 3/00

(52) U.S. Cl. .................. 430/270.1; 430/290; 430/1; 430/2; 430/280.1; 430/5

(58) Field of Search .................. 430/290, 1, 2, 430/280.1, 270.1, 5

(56) References Cited

U.S. PATENT DOCUMENTS

| 3,894,253 A | | 7/1975 | Willyoung |
| 3,915,706 A | * | 10/1975 | Limburg et al. ............ 430/290 |
| 3,940,507 A | | 2/1976 | Fech, Jr. et al. |
| 4,247,611 A | | 1/1981 | Sander et al. |
| 4,778,256 A | * | 10/1988 | Serizawa ................... 430/2 |
| 5,128,223 A | * | 7/1992 | Gillberg-LaForce et al. ............ 430/290 |
| 5,168,542 A | * | 12/1992 | Chakravorty et al. ....... 385/132 |

(List continued on next page.)

FOREIGN PATENT DOCUMENTS

| EP | 0 041 657 | 12/1981 | |
| EP | 0 225 454 | 6/1987 | |
| EP | 441594 B1 * | 10/1998 | ............ G02B/1/10 |
| JP | 45-011712 | 4/1970 | |

(List continued on next page.)

OTHER PUBLICATIONS

C. Berti, et al., Makromol. Chem., vol. 189, pp. 1323–1330, "Polymers with Thiocarbonate and Dithiocarbonate Moieties from Aliphatic Dithiols. Syntheses and Characterization", 1988.

(List continued on next page.)

Primary Examiner—Cynthia Hamilton
(74) Attorney, Agent, or Firm—Oblon, Spivak, McClelland, Maier & Neustadt, P.C.

(57) ABSTRACT

A radiation sensitive refractive index changing composition comprising (A) a decomposable compound, (B) a non-decomposable compound having a lower refractive index than the decomposable compound (A), (C) a radiation sensitive decomposer and (D) a stabilizer. By exposing the composition to radiation through a pattern mask, the above components (C) and (A) of an exposed portion are decomposed and a refractive index difference is made between the exposed portion and unexposed portion, thereby forming a pattern having different refractive indices.

27 Claims, 1 Drawing Sheet

U.S. PATENT DOCUMENTS

Figure 1:
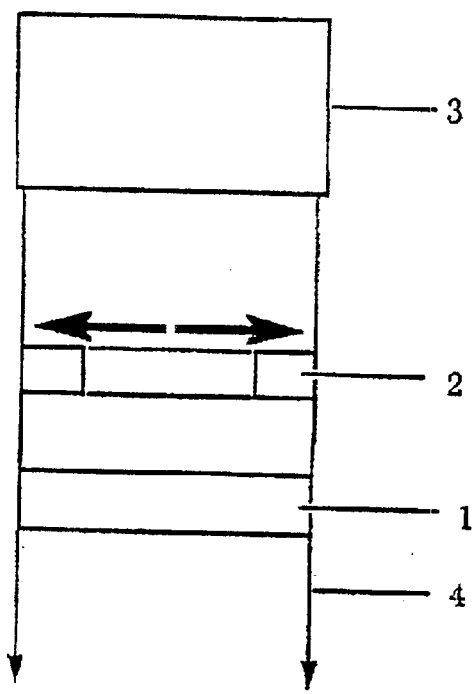

| | | | |
|---|---|---|---|
| 5,627,010 A | | 5/1997 | Pai et al. |
| 5,958,648 A | | 9/1999 | Nishimura et al. |
| 6,124,076 A | * | 9/2000 | Dhar et al. ............... 430/281.1 |
| 6,368,775 B1 | * | 4/2002 | Potter et al. ................ 430/290 |
| 6,399,267 B1 | | 6/2002 | Nishimura et al. |

FOREIGN PATENT DOCUMENTS

| | | | |
|---|---|---|---|
| JP | 55-009433 | 3/1980 | |
| JP | 56-017345 | 2/1981 | |
| JP | 57-031674 | 2/1982 | |
| JP | 60-037549 | 2/1985 | |
| JP | 62-025705 | 2/1987 | |
| JP | 62-136638 | 6/1987 | |
| JP | 62-190211 | 8/1987 | |
| JP | 63-097945 | 4/1988 | |
| JP | 64-003647 | 1/1989 | |
| JP | 2-146544 | 6/1990 | |
| JP | 3-192310 | 8/1991 | |
| JP | 4-303843 | 10/1992 | |
| JP | 4-330444 | 11/1992 | |
| JP | 5-060931 | 3/1993 | |
| JP | 7-056026 | 3/1995 | |
| JP | 7-056354 | 3/1995 | |
| JP | 7-092313 | 4/1995 | |
| JP | 8-336911 | 12/1996 | |
| JP | 8-337609 | 12/1996 | |
| JP | 9-133813 | 5/1997 | |
| JP | 9-178901 | 7/1997 | |
| WO | WO 93/19505 | 9/1993 | |
| WO | WO 94/04949 | 3/1994 | |
| WO | WO 96/42036 A1 * | 12/1996 | ............. G03F/7/20 |
| WO | 97/44714 | 11/1997 | |

OTHER PUBLICATIONS

W. H. Carothers, et al., Journal of American Chemical Society, vol. 54, pp. 1579–1587, "Studies of Polymerization and Ring Formation. XV. Artificial Fibers from Synthetic Linear Condensation Superpolymers", Apr. 1932.

A. Conix, Journal of Polymer Science, vol. 29, pp. 343–353, "Aromatic Polyanhydrides, A New Class of High Melting Fiber–Forming Polymers", 1958.

A. J. Domb, Macromolecules, vol. 25, pp. 12–17, "Synthesis and Characterization of Biodegradable Aromatic Anhydride Copolymers", 1992.

A. J. Domb, et al., Macromolecules, vol. 21, pp. 1925–1929, "Poly(Anhydrides). 2. One–Step Polymerization Using Phosgene or Diphosgene as Coupling Agents", 1988.

J. M. J. Frechet, et al., Makromol. Chem., Rapid Commun., vol. 7, pp. 121–126, "Design and Synthesis of Novel Allylic and Benzylic Copolycarbonates Susceptible to Acidolytic or Thermolytic Depolymerization", 1986.

E. Kobayashi, et al., Polymer Journal, vol. 22, No. 9, pp. 803–813, "Polyaddition of Dithiol Compounds to Divinyl Compounds: The Kinetics of the Model Addition Reaction of Thiophenols to Styrenes", 1990.

E. Kobayashi, et al., Makromol. Chem., vol. 187, pp. 2525–2533, "Addition Polymerization of 1,4–Diethynylbenzene with 1,4–Bezenedithiol and Properties of the Resulting Copolymer" 1986.

H. R. Kricheldorf, et al., Makromol. Chem., vol. 11, pp. 83–88, "Synthesis of Polyanhydrides from Trimethylsilyl Dicarboxylates and Dicarbonyl Chlorides", 1990.

E. N. Kumpanenko, et al., Journal of Polymer Science, Part A–1, vol. 8, pp. 2375–2381, "Kinetics of Thermal and Acidic Degradation of Poly–1,3–Dioxolane", 1970.

S. Lazcano, et al., Makromol. Chem., vol. 189, pp. 2229–2238, "Oxidation of Poly(2,2–Dimethyltrimethylene Sulfide) in Solution", 1988.

K. W. Leong, et al., Macromolecules, vol. 20, No. 4, pp. 705–712, "Synthesis of Polyanhydrides: Melt–Polycondensation, Dehydrochlorination, and Dehydrative Coupling", Apr. 1987.

T. Nishikubo, et al., Macromolecules, vol. 29, pp. 5529–5534, "New Synthesis of Poly(Silyl Ether) and Poly(Germyl Ether) by Addition Reactions of Biosepoxides with Dimethyldiphenoxysilane and Dimethyldiphenoxygermane", 1996.

N. Okui, et al., Polymer, vol. 17, pp. 1086–1090, "Studies of the Chemical Degradation of Polysiloxanes by Hydrofluoric Acid:1. Poly(Tetramethyl–P–Silphenylene Siloxane", Dec. 1976.

W. Podkoscielny, et al., Journal of Applied Polymer Science, vol. 35, pp. 85–101. "Linear Polythioesters. X111.* Products of Polycondensation of Isomeric Di(Mercaptomethyl)—Dimethylbenzenes with Adipoyl and Sebacoyl Chlorides", 1988.

W. Podkoscielny, et al., Journal of Polymer Science, vol. 14, pp. 655–662, "Linear Polythioesters. I. Products of Interfacial Polycondensation of 4,4'–Di(Mercaptomethyl) Benzophenone with Terephthaloyl, Isophthaloyl, and Phthaloyl Chlorides", 1976.

W. Podkoscielny, et al., Journal of Polymer Science, vol. 22, pp. 1579–1586, "Linear Polythioesters. VIII.* Products of Interfacial Polycondesation of 1,4–Di(Mercaptomethyl)—Tetramethylbenzene with Isomeric Phthaloyl Chlorides", 1984.

W. Podkoscielny, et al., Journal of Polymer Science, vol. 17, pp. 2429–2438, "Linear Polythioesters. II. Products of Interfacial Polycondensation of 1,4–Di(Mercaptomethyl)—Naphthalene, 1,5–Di(Mercaptomethyl) Naphthalene and a Mixture of 1,4–and 1,5–Di(Mercaptomethyl)– Naphthalene with Terephthaloyl and Isophthaloyl Chlorides", 1979.

M. Sato, Makromol. Chem., Rapid Commun., vol. 5, pp. 151–155, "Preparation of a Polysulfone by Polycondensation of Disodium 4,4'–Oxydibenzenesulfinate with Bis-(Chloromethyl) Ketone", 1984.

R. P. Simonds, et al., Makromol. Chem., vol. 179, pp. 1689–1697, "Cationic Degradation of Poly(Propylene Sulfide)", 1978.

A. Zochniak, et al., J. Macromol. Sci.–Chem., vol. 7, pp. 1265–1271, "Products of Polyaddition of 1,5–Pentanediol Dithioglycolate with 2,4 –Toleyne Diisocyanate and with 4,4–Diphenylmethane Diisocyanate", 1975.

U.S. Appl. No. 10/110,237, Nishimura, et al., filed Apr. 23, 2002.

U.S. Appl. No. 10/415,102, Nishimura, et al., filed Apr. 30, 2003.

U.S. Appl. No. 10/381,589, Nishimura, et al., filed Apr. 1, 2003.

U.S. Appl. No. 09/840,130, Nishimura, et al., filed Apr. 24, 2001.

U.S. Appl. No. 09/946,359, Nishimura, et al., filed Sep. 6, 2001.

U.S. Appl. No. 10/275,285, Nishimura, et al., filed Nov. 13, 2002.

U.S. Appl. No. 10/257,397, Nishimura, et al., filed Oct. 18, 2002.

U.S. Appl. No. 10/089,154, Suzuki, et al., filed Mar. 27, 2002.

* cited by examiner

COMPOSITION HAVING REFRACTIVE INDEX SENSITIVELY CHANGEABLE BY RADIATION AND METHOD FOR FORMING REFRACTIVE INDEX PATTERN

DESCRIPTION

1. Field of the Invention

The present invention relates to a radiation sensitive refractive index changing composition, a refractive index pattern forming method, a refractive index pattern and an optical material. More specifically, it relates to a novel radiation sensitive refractive index changing composition which is used in the optoelectronic and display fields, a refractive index pattern forming method, a refractive index pattern and an optical material.

2. Prior Art

In the current society called "multi-media society", refractive index distribution type optically molded products each consisting of different refractive index regions are in great demand. The products include not only optical fibers for transmitting information but also optical diffraction gratings having a periodical change in refractive index, optical memories to which information is written at sites having different refractive indices, optically coupled elements such as optical IC's having a fine refractive index pattern, optical control elements, optical modulation elements and optical transmission elements.

The refractive index distribution type optically molded products are divided into two types: one having a continuous refractive index distribution, such as GI type optical fibers (to be referred to as "GRIN optically molded products" hereinafter) and the other having a discontinuous refractive index distribution, such as optical diffraction gratings and SI type optical waveguides.

The GRIN optically molded products are attracting much attention as the next-generation optically molded products. For example, a GI type optical fiber whose refractive index is reduced from the center axis of the core of the optical fiber to the periphery in a parabolic form enables the transmission of a great volume of information. A GRIN lens whose refractive index continuously changes therein is used as a reading lens for use in copiers, spherical lens for connecting fibers, or micro-lens, making use of its characteristic features that it has refractive power even with a flat surface and that it is free from spherical aberration.

A large number of methods of producing the above GRIN optically molded products have been proposed up till now. For example, JP-A 9-133813, JP-A 8-336911, JP-A 8-337609, JP-A 3-192310, JP-A 5-60931 (the term "JP-A" as used herein means an "unexamined published Japanese patent application"), WO93/19505 and WO94/04949 disclose a method of obtaining a GI type optical fiber by dispersing low molecular weight compounds or a monomer into a polymer and continuously distributing its concentration. JP-A 62-25705 discloses that a GI type rod-like optically molded product or optical fiber is obtained by photo-copolymerizing two or more vinyl monomers having different diffraction indices and reactivity rations. Further, JP-A 7-56026 discloses a method of obtaining a refractive index distribution by forming a polymer A having a photo-reactive functional group, dispersing a compound B having a lower refractive index than the polymer A into the polymer A to form the concentration distribution of the compound B and photo-reacting the polymer A with the compound B.

Some methods of producing GRIN optically molded products of an inorganic material have also been proposed. One of them is, for example, a method of producing a GI type rod by adding high-refractive index thallium to rod-like glass essentially composed of silicon or lead, immersing the glass in a molten solution containing low-refractive index potassium, and forming a potassium concentration distribution by ion exchange.

A GRIN lens can be obtained likewise by applying the above method to a short rod, that is, lens-like optically molded product. Alternatively, the GI type rod produced by the above method may be sliced.

As one of methods of producing an optically molded product having a fine refractive index pattern, such as the above optical diffraction grating or optical IC, there is known a technology for obtaining a change in refractive index by causing a photochemical reaction in a molded product by the irradiation of light. For instance, in the case of an inorganic material, glass doped with germanium is irradiated with light to change its refractive index to produce an optical diffraction grating. In the case of an organic material, the above technology is known as a photochromic reaction or photo bleaching and JP-A 7-92313 discloses a technology for obtaining an optical diffraction grating by causing a change in refractive index by irradiating a material containing low molecular weight compounds having photochemical reactivity dispersed in a polymer with a laser beam. Further, JP-A 9-178901 has recently proposed that this technology is applied to the production of a GRIN optically molded product. This method provides a continuous refractive index distribution in a depth direction with respect to irradiation, making use of the fact that light irradiated onto a molded product is absorbed and weakened in intensity.

However, in the refractive index distributions obtained with the above conventional materials, the maximum refractive index difference is about 0.001 to 0.02 and it is difficult to provide a wider refractive index distribution in order to prevent an optical loss and suppress the malfunction of a circuit.

When the above conventional materials are used under the condition that light having a wavelength close to the wavelength used for changing the refractive index passes therethrough after a refractive index distribution is formed, it is impossible to prevent such a phenomenon that a gradual change in refractive index occurs, thereby deteriorating the materials.

SUMMARY OF THE INVENTION

The present invention has been made in view of the above problems of the prior art.

That is, it is an object of the present invention to provide a radiation sensitive refractive index changing composition whose refractive index of materials is changed by a simple method, whose changed refractive index difference is sufficiently large, and which can provide a stable refractive index pattern and a stable optical material regardless of use conditions.

It is another object of the present invention to provide a radiation sensitive refractive index changing composition which forms fine pores upon exposure to radiation, retains the formed fine pores stably, and provides a refractive index pattern having high film strength although it has a large number of fine pores.

It is still another object of the present invention to provide a method of forming a refractive index pattern from the above composition of the present invention.

It is a further object of the present invention to provide a refractive index pattern or an optical material produced by the above method of the present invention.

Other objects and advantages of the present invention will become apparent from the following description.

Means for Solving the Problem

According to the present invention, firstly, the above objects and advantages of the present invention are attained by a radiation sensitive refractive index changing composition comprising (A) a decomposable compound, (B) a non-decomposable compound having a lower refractive index than the decomposable compound (A), (C) a radiation sensitive decomposer and (D) a stabilizer.

Secondly, the above objects and advantages of the present invention are attained by a refractive index pattern forming method comprising exposing a radiation sensitive refractive index changing composition comprising (A) a decomposable compound, (B) a non-decomposable compound having a lower refractive index than the decomposable compound (A), (C) a radiation sensitive decomposer and (D) a stabilizer to radiation and heating to react the stabilizer (D) with the decomposable compound (A) of an unexposed portion.

Thirdly, the above objects and advantages of the present invention are attained by a refractive index pattern forming method comprising exposing a refractive index changing composition comprising (A) a decomposable compound, (B) a non-decomposable compound having a lower refractive index than the decomposable compound (A) and (C) a radiation sensitive decomposer to radiation through a pattern mask and treating the composition with (D) a stabilizer to react the decomposable compound (A) of an unexposed portion with the stabilizer (D).

In the fourth place, the above objects and advantages of the present invention are attained by a refractive index pattern forming method comprising exposing a refractive index changing composition comprising (A) a decomposable compound, (B) a non-decomposable compound having a lower refractive index than the decomposable compound (A) and (C) a radiation sensitive decomposer to radiation through a pattern mask and heating to decompose the decomposable polymer of an unexposed portion.

In the fifth place, the above objects and advantages of the present invention are attained by a refractive index pattern formed by any one of the above refractive index pattern forming methods.

In the sixth place, the above objects and advantages of the present invention are attained by an optical material formed by any one of the above refractive index pattern forming methods.

BRIEF DESCRIPTION OF THE ACCOMPANYING DRAWINGS

Figure 2:
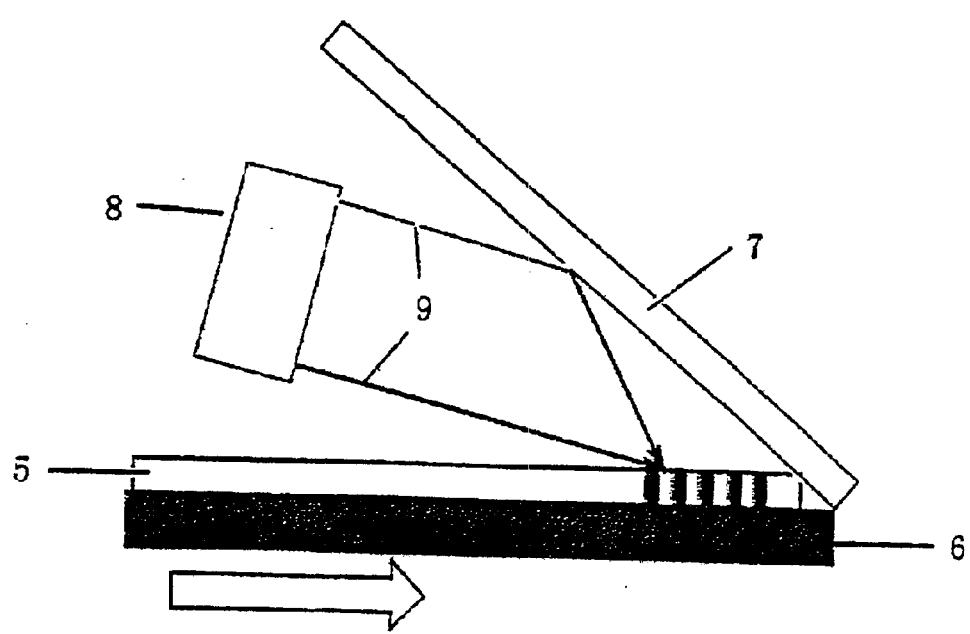

FIG. 1 is a schematic diagram of an apparatus for irradiating light to form a lens from the refractive index changing composition of the present invention; and FIG. 2 is a schematic diagram of an apparatus for irradiating light to form a diffraction grating from the refractive index changing composition of the present invention.

In the present invention, the term "refractive index patterns" means a refractive index distribution type material consisting of regions having different refractive indices.

A detailed description is subsequently given of each component of a refractive index changing material used in the refractive index pattern forming method of the present invention.

(A) Decomposable Compound

The decomposable compound (A) used in the present invention can be an acid decomposable compound or a base decomposable compound and its refractive index is preferably 1.5 to 1.9. The weight average molecular weight of the decomposable compound (A) is preferably 100 to 500,000, more preferably 100 to 300,000.

The acid decomposable compound is selected from compounds having at least one structure selected from the group consisting of structures represented by the following formulas (1) to (8). These compounds may be used alone or in combination of two or more.

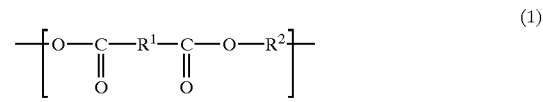

(In the formula (1), $R^1$ is an alkylene group, alkylene-arylene-alkylene group or arylene group, and $R^2$ is an alkylene group, alkylene-arylene-alkylene group, arylene group, alkylsilylene group or alkylgermylene group.)

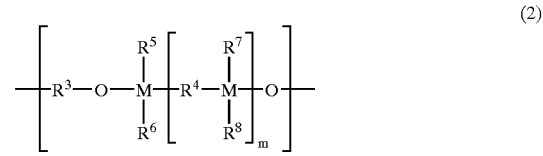

(In the formula (2), M is Si or Ge, $R^3$ is an alkylene group, alkylene-arylene-alkylene group, arylene group, alkylsilylene group or alkylgermylene group, $R^4$ is an oxygen atom, alkylene group, alkylene-arylene-alkylene group, arylene group or single bond, $R^5$, $R^6$, $R^7$ and $R^8$ are each independently a hydrogen atom, alkyl group, aryl group, alkoxy group or thioalkyl group, and m is an integer of 0 to 2.)

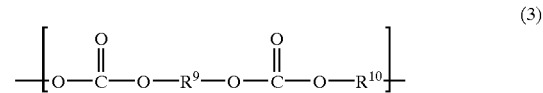

(In the formula (3), $R^9$ and $R^{10}$ are each independently an alkylene group, alkylene-arylene-alkylene group, arylene group, alkylsilylene group or alkylgermylene group.)

(In the formula (4), $R^{11}$ is an oxyalkylene group or single bond, and $R^{12}$ is a hydrogen atom, alkyl group, alkylene-arylene-alkylene group or aryl group.)

(In the formula (5), $R^{13}$ is a hydrogen atom, alkyl group or aryl group.)

$$\left[\begin{array}{c}\text{CH}-\text{O}-\text{CH}-\text{O}\\ \underbrace{\phantom{xxx}}_{R^{14}}\end{array}\right] \quad (6)$$

(In the formula (6), $R^{14}$ is an alkylene group or a structure represented by the following formula (6)-1, (6)-2 or (6)-3.)

(6)-1

(In the formula (6)-1, $R^{15}$, $R^{16}$, $R^{17}$ and $R^{18}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms.)

$$-O-R^{19}-O- \quad (6)\text{-}2$$

(In the formula (6)-2, $R^{19}$ is an alkylene group.)

$$-NH-R^{20}-NH- \quad (6)\text{-}3$$

(In the formula (6)-3, $R^{20}$ is an alkylene group.)

$$\left[\begin{array}{c}\text{C}-\text{O}-\text{C}-R^{21}\\ \parallel\phantom{xx}\parallel\\ \text{O}\phantom{xx}\text{O}\end{array}\right] \quad (7)$$

(In the formula (7), $R^{21}$ is an alkylene group, alkylene-arylene-alkylene group or arylene group.)

(8)

wherein, $R^{22}$, $R^{23}$, $R^{24}$ and $R^{25}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms.

The base decomposable compound is selected from compounds having at least one structure selected from the group consisting of structures represented by the following formulas (9) to (12). These compounds may be used alone or in combination of two or more.

(9)

(In the formula (9), $R^{26}$ is an alkylene group, aralkylene group or arylene group, $R^{27}$ is an alkylene group, aralkylene group, arylene group, alkylene-arylene-alkylene group, alkylsilylene group or alkylgermylene group, $R^{28}$, $R^{29}$, $R^{30}$ and $R^{31}$ are each independently a hydrogen atom, alkyl group, aryl group, alkoxyl group or thioalkyl group, and i and j are each independently 0 or 1.)

$$\left[\begin{array}{c}\text{S}-\text{C}-R^{32}-\text{C}-\text{S}-R^{33}\\ \parallel\phantom{xxxxx}\parallel\\ \text{O}\phantom{xxxxx}\text{O}\end{array}\right] \quad (10)$$

(In the formula (10), $R^{32}$ is an alkylene group, aralkylene group or arylene group, and $R^{33}$ is an alkylene group, aralkylene group, arylene group, alkylene-arylene-alkylene group, alkylsilylene group or alkylgermylene group.)

$$\left[\begin{array}{c}\text{O}\phantom{xxxxx}\text{O}\\ \parallel\phantom{xxxxx}\parallel\\ \text{NH}-\text{C}-\text{S}-R^{34}-\text{S}-\text{C}-\text{NH}-R^{35}\end{array}\right] \quad (11)$$

(In the formula (11), $R^{34}$ and $R^{35}$ are each independently an alkylene group, aralkylene group, arylene group, alkylene-arylene-alkylene group, alkylsilylene group or alkylgermylene group.)

$$\left[\begin{array}{c}\text{O}\phantom{xxxxx}\text{O}\\ \parallel\phantom{xxxxx}\parallel\\ \text{O}-\text{C}-\text{S}-R^{36}-\text{S}-\text{C}-\text{O}-R^{37}\end{array}\right] \quad (12)$$

(In the formula (12), $R^{36}$ and $R^{37}$ are each independently an alkylene group, aralkylene group, arylene group, alkylene-arylene-alkylene group, alkylsilylene group or alkylgermylene group.)

All the above alkylene-arylene-alkylene groups each independently have a structure represented by the following formula (13) or (14):

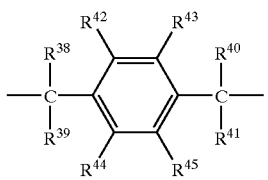
(13)

(In the formula (13), $R^{38}$, $R^{39}$, $R^{40}$ and $R^{41}$ are each independently a hydrogen atom, chain alkyl group having 1 to 6 carbon atoms or aryl group having 6 to 10 carbon atoms, and $R^{42}$, $R^{43}$, $R^{44}$ and $R^{45}$ are each independently a hydrogen atom, chlorine atom, bromine atom, hydroxyl group, mercapto group, alkoxy group, thioalkyl group, alkylester group, alkylthioester group, aryl group, cyano group or nitro group,)

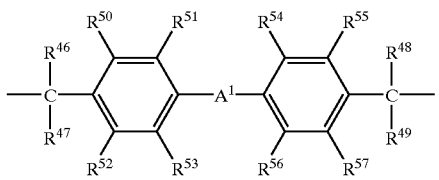
(14)

(14), $R^{46}$, $R^{47}$, $R^{48}$ and $R^{49}$ are each independently a hydrogen atom, chain alkyl group having 1 to 6 carbon atoms or aryl group having 6 to 10 carbon atoms, $R^{50}$, $R^{51}$, $R^{52}$, $R^{53}$, $R^{54}$, $R^{55}$, $R^{56}$ and $R^{57}$ are each independently a hydrogen atom, chlorine atom, bromine atom, hydroxyl group, mercapto group, alkoxy group, thioalkyl group, alkylester group, alkylthioester group, aryl group, cyano group or nitro group, $A^1$ is —S—, —O—, —SO$_2$—, —CO—, —COO—, —OCOO—, —CH$_2$— or —C($R^{58}$)$_2$—, and $R^{58}$ is a chain alkyl group having 1 to 6 carbon atoms.)

All the above arylene groups each independently have a structure represented by the following formula (15):

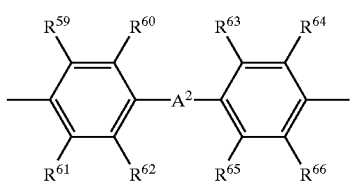
(15)

wherein $R^{59}$ to $R^{66}$ are each independently a hydrogen atom, chlorine atom, bromine atom, hydroxyl group, mercapto group, alkoxy group, thioalkyl group, alkylester group, alkylthioester group, aryl group, cyano group or nitro group, $A^2$ is —S—, —O—, —SO$_2$—, —CO—, —COO—, —OCOO—, —CH$_2$— or —C($R^{67}$)$_2$—, and $R^{67}$ is a chain alkyl group having 1 to 6 carbon atoms.

All the above alkylsilylene groups each independently have a structure represented by the following formula (16):

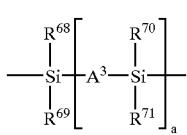
(16)

wherein $R^{68}$, $R^{69}$, $R^{70}$ and $R^{71}$ are each independently a hydrogen atom, chain alkyl group having 1 to 6 carbon atoms or aryl group having 6 to 10 carbon atoms, $A^3$ is —O—, alkylene group or arylene group, and a is an integer of 0 or 1.

All the above alkylgermylene groups each independently have a structure represented by the following formula (17):

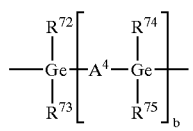
(17)

wherein $R^{72}$, $R^{73}$, $R^{74}$ and $R^{75}$ are each independently a hydrogen atom, chain alkyl group having 1 to 6 carbon atoms or aryl group having 6 to 10 carbon atoms, $A^4$ is —O—, alkylene group or arylene group, and b is an integer of 0 or 1.

Preferably, the alkylene groups in the above formulas (16) and (17) are each independently a linear, branched or cyclic alkylene group having 1 to 10 carbon atoms, such as methylene, 1,2-ethylene, 1,3-trimethylene or 1,10-decamethylene, and the hydrogen atoms of the above groups may be substituted by, for example, a chlorine atom, bromine atom, hydroxyl group, mercapto group, alkoxy group, thioalkyl group, alkylester group, alkylthioester group, aryl group or cyano group.

Preferably, the alkyl groups of all the above alkyl groups, alkoxy groups, thioalkyl groups, alkylester groups and alkylthioester groups are each independently a linear, branched or cyclic alkyl group having 1 to 10 carbon atoms, and the hydrogen atoms of the above groups may be substituted by a chlorine atom, bromine atom, hydroxyl group, mercapto group, alkoxy group, thioalkyl group, alkylester group, alkylthioester group, aryl group or cyano group.

All the above aryl groups are each independently a phenyl group, naphthyl group, anthracenyl group or biphenyl group, and the hydrogen atoms of the above groups may be substituted by a chlorine atom, bromine atom, hydroxyl group, mercapto group, alkoxy group, thioalkyl group, alkylester group, alkylthioester group, cyano group or nitro group.

The chain alkyl group having 1 to 6 carbon atoms in the above formulas (6)-1 and (8) may be linear or branched, as exemplified by methyl, ethyl, n-propyl, i-propyl, n-butyl, i-butyl, sec-butyl, t-butyl, n-pentyl, neopentyl, n-hexyl and thexyl.

The alkoxyl group having 1 to 6 carbon atoms maybe linear or branched, as exemplified by methoxy, ethoxy, n-propoxy, i-propoxy, n-butoxy, i-butoxy, sec-butoxy, t-butoxy, n-pentyloxy, neopentyloxy, n-hexyloxy and thexyloxy.

The alkylthio group having 1 to 6 carbon atoms may be linear or branched, as exemplified by methylthio, ethylthio, n-propylthio, i-propylthio, n-butylthio, i-butylthio, sec-butylthio, t-butylthio, n-pentylthio, neopentylthio, and n-hexylthio.

Examples of the haloalkyl group having 1 to 6 carbon atoms include trifluoromethyl, pentafluoroethyl, heptafluoropropyl, chloromethyl, 2-chloroethyl, 3-chloropropyl, 1-chloromethylethyl, 4-chlorobutyl, 2-chloromethylpropyl, 5-chloropentyl, 3-chloromethylbutyl, 2-chloroethylpropyl, 6-chlorohexyl, 3-chloromethylpentyl, 4-chloromethylpentyl, 2-chloroethylbutyl, bromomethyl, 2-bromoethyl, 3-bromopropyl, 1-bromomethylethyl, 4-bromobutyl, 2-bromomethylpropyl, 5-bromopentyl, 3-bromomethylbutyl, 2-bromoethylpropyl, 6-bromohexyl, 3-bromomethylpentyl, 4-bromomethylpentyl and 2-bromoethylbutyl.

Examples of the haloalkoxyl group having 1 to 6 carbon atoms include trifluoromethoxy, pentafluoroethoxy, heptafluoropropoxy, chloromethoxy, 2-chloroethoxy, 3-chloropropoxy, 1-chloromethylethoxy, 4-chlorobutoxy, 2-chloromethylpropoxy, 5-chloropentyloxy, 3-chloromethylbutoxy, 2-chloroethylpropoxy, 6-chlorohexyloxy, 3-chloromethylpentyloxy, 4-chloromethylpentyloxy, 2-chloroethylbutoxy, bromomethoxy, 2-bromoethoxy, 3-bromopropoxy, 1-bromomethylethoxy, 4-bromobutoxy, 2-bromomethylpropoxy, 5-bromopentyloxy, 3-bromomethylbutoxy, 2-bromoethylpropoxy, 6-bromohexyloxy, 3-bromomethylpentyloxy, 4-bromomethylpentyloxy and 2-bromoethylbutoxy.

Examples of the haloalkylthio group having 1 to 6 carbon atoms include trifluoromethylthio, pentafluoroethylthio, heptafluoropropylthio, chloromethylthio, 2-chloroethylthio, 3-chloropropylthio, 1-chloromethylethylthio, 4-chlorobutylthio, 2-chloromethylpropylthio, 5-chloropentylthio, 3-chloromethylbutylthio, 2-chloroethylpropylthio, 6-chlorohexylthio, 3-chloromethylpentylthio, 4-chloromethylpentylthio, 2-chloroethylbutylthio, bromomethylthio, 2-bromoethylthio, 3-bromopropylthio, 1-bromomethylethylthio, 4-bromobutylthio, 2-bromomethylpropylthio, 5-bromopentylthio, 3-bromomethylbutylthio, 2-bromoethylpropylthio, 6-bromohexylthio, 3-bromomethylpentylthio, 4-bromomethylpentylthio and 2-bromoethylbutylthio.

Examples of the hydroxyalkyl group having 1 to 6 carbon atoms include hydroxymethyl, 2-hydroxyethyl, 3-hydroxypropyl, 1-hydroxymethylethyl, 4-hydroxybutyl, 2-hydroxymethylpropyl, 5-hydroxypentyl, 3-hydroxymethylbutyl, 2-hydroxyethylpropyl, 6-hydroxyhexyl, 3-hydroxymethylpentyl, 4-hydroxymethylpentyl and 2-hydroxyethylbutyl.

Examples of the mercaptoalkyl group having 1 to 6 carbon atoms include mercaptomethyl, 2-mercaptoethyl, 3-mercaptopropyl, 1-mercaptomethylethyl, 4-mercaptobutyl, 2-mercaptomethylpropyl, 5-mercaptopentyl, 3-mercaptomethylbutyl, 2-mercaptoethylpropyl, 6-mercaptohexyl, 3-mercaptomethylpentyl, 4-mercaptomethylpentyl and 2-mercaptoethylbutyl.

Examples of the hydroxyalkoxyl group having I to 6 carbon atoms include hydroxymethoxy, 2-hydroxyethoxy, 3-hydroxypropoxy, 1-hydroxymethylethoxy, 4-hydroxybutoxy, 2-hydroxymethylpropoxy, 5-hydroxypentyloxy, 3-hydroxymethylbutoxy, 2-hydroxyethylpropoxy, 6-hydroxyhexyloxy, 3-hydroxymethylpentyloxy, 4-hydroxymethylpentyloxy and 2-hydroxyethylbutoxy.

Examples of the mercaptoalkylthio group having 1 to 6 carbon atoms include mercaptomethylthio, 2-mercaptoethylthio, 3-mercaptopropylthio, 1-mercaptomethylethylthio, 4-mercaptobutylthio, 2-mercaptomethylpropylthio, 5-mercaptopentylthio, 3-mercaptomethylbutylthio, 2-mercaptoethylpropylthio, 6-mercaptohexylthio, 3-mercaptomethylpentylthio, 4-mercaptomethylpentylthio and 2-mercaptoethylbutylthio.

Examples of the aryl group having 6 to 10 carbon atoms include phenyl, tolyl, xylyl, cumenyl and 1-naphthyl.

Examples of the aralkyl group having 7 to 11 carbon atoms include benzyl, α-methylbenzyl, phenethyl and naphthylmethyl.

Methods of producing acid decomposable compounds having structures represented by the above formulas (1) to (7) in the present invention as a recurring unit, for example, are already known.

Methods of producing a compound having a structure represented by the above formula (1) are disclosed by Polymer Bull., 1. 199 (1978), JP-A 62-136638, EP 225,454, U.S. Ser. No. 806,597, JP-A 4-303843, JP-A 7-56354 and the like.

Methods of producing a compound having a structure represented by the above formula (2) are disclosed by Macromolecules 29, 5529 (1996), Polymer 17, 1086 (1976), JP-A 60-37549 and the like.

Methods of producing a compound having a structure represented by the above formula (3) are disclosed by Electrochem. Soc., Solid State Sci. Technol., 133(1) 181 (1986), J. Imaging Sci., 30(2)59 (1986), Macromol. Chem., Rapid Commun., 7, 121(1986) and the like.

Methods of producing a compound having a structure represented by the above formula (4) are disclosed by USP 3,894,253, JP-A 62-190211, JP-A 2-146544, Macromol. Chem., 23, 16(1957), JP-A63-97945, PolymerSci., A-1, 8, 2375(1970), U.S. Pat. No. 4,247,611, EP 41,657, JP-A 57-31674, JP-A 64-3647, JP-A 56-17345 and the like.

Methods of producing a compound having a structure represented by the above formula (5) are disclosed by Prepr. Eur. Disc Meet. Polymer Sci., Strasbourg, p.106 (1978), Macromol. Chem., 179, 1689 (1978) and the like.

Methods of producing a compound having a structure represented by the above formula (6) are disclosed by U.S. Pat. Nos. 3,894,253, 3,940,507, JP-A 62-190211 and the like.

Methods of producing a compound having a structure represented by the above formula (7) are disclosed by J. Am. Chem. Soc., 54, 1579 (1932), J. Polym. Sci., 29, 343 (1958), J. Polym. Sci., Part A, Polym. Chem., 25, 3373 (1958), Macromolecules, 25, 12, (1992), Macromolecules, 20, 705, (1997), Macromolecules, 21, 1925, (1998), Macromol. Chem., Rapid Commun., 11, 83 (1990) and the like.

A compound having a structure represented by the above formula (8) can be produced by cationically or anionically polymerizing a compound represented by the following formula (8)-1 in a solvent in the presence of a molecular weight modifier as required:

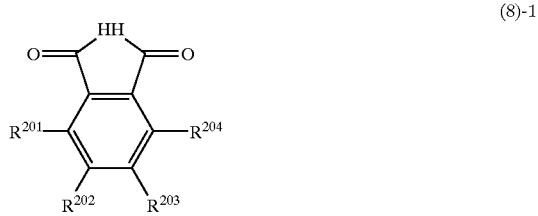

(8)-1 wherein $R^{201}$, $R^{202}$, $R^{203}$ and $R^{204}$ are each independently a group selected from groups represented by $R^{22}$, $R^{23}$, $R^{24}$ and $R^{25}$ in the formula (8).

The compound represented by the above formula (8) may be a copolymer of one or more compounds selected from the group consisting of a compound represented by the following formula (8)-2, a compound represented by the following formula (8)-3 and a monomer other than these and a compound represented by the above formula (8)-1. In this case, the total amount of the one or more compounds selected from the group consisting of a compound represented by the following formula (8)-2, a compound represented by the following formula (8)-3 and a monomer other than these may be 100 parts or less by weight based on 100 parts by weight of the compound represented by the above formula (8)-1:

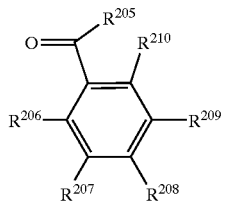
(8)-2 wherein $R^{205}$ is a hydrogen atom or alkyl group having 1 to 10 carbon atoms, and $R^{206}$, $R^{207}$, $R^{208}$, $R^{209}$ and $R^{210}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms, aralkyl group having 7 to 11 carbon atoms, or two out of $R^{206}$, $R^{207}$, $R^{208}$, $R^{209}$ and $R^{210}$ may be bonded together to form a 4- to 7-membered ring together with carbon atoms bonded thereto,

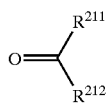
(8)-3 wherein $R^{211}$ and $R^{212}$ are each independently a hydrogen atom, alkyl group having 1 to 10 carbon atoms, haloalkyl group having 1 to 10 carbon atoms, hydroxyalkyl group having 1 to 10 carbon atoms, mercaptoalkyl group having 1 to 10 carbon atoms, aryl group having 6 to 10 carbon atoms, aralkyl group having 7 to 11 carbon atoms, (polyethylene glycol)ethyl group having 1 to 5 ethyleneoxy recurring units, (polypropylene glycol) propyl group having 1 to 5 propyleneoxy recurring units, (polyethylene sulfide)ethyl group having 1 to 5 recurring units or (polypropylene sulfide)propyl group having 1 to 5 recurring units.

Examples of the monomer other than these include compounds having two aldehyde groups in one molecule such as glyoxal, succinaldehyde, glutaraldehyde, malealdehyde, 1,8-octanedialdehyde, m-phthalaldehyde, p-phthalaldehyde, 2,3-naphthalenedicarboxyaldehyde, 2,3-anthracenedicarboxyaldehyde, 9,10-anthracenedicarboxyaldehyde, 4,4'-bisbenzaldehyde, 2,5-dimethoxy-1,4-dicarboxyaldehyde, 2,2'-(ethylenedioxy)dibenzaldehyde, 2,2'-biphenyldicarboxyaldehyde, bis(2-formylphenyl)ether and 6,6'-dihydroxy-5,5'-dimethoxy-[1,1'-biphenyl]-3,3'-dicarboxyaldehyde; and compounds having three or more aldehyde groups in one molecule such as salicylaldehydechromium complex, aluminumformylacetate, (1,1',3',1''')-terphenyl-2,6,2''',6'''-tetracarbaldehyde, 2-hydroxybenzene-1,3,5-tricarbaldehyde and 1,2,4,5-tetra(p-formylphenyl)benzene.

Compounds obtained by substituting the hydrogen atoms of the above compounds by an alkoxyl group having 1 to 10 carbon atoms, haloalkyl group having 1 to 10 carbon atoms, haloalkoxyl group having 1 to 10 carbon atoms, haloalkylthio group having 1 to 10 carbon atoms, hydroxyalkyl group having 1 to 10 carbon atoms, mercaptoalkyl group having 1 to 10 carbon atoms, hydroxyalkoxyl group having 1 to 10 carbon atoms, mercaptoalkylthio group having 1 to 10 carbon atoms, aryl group having 6 to 10 carbon atoms, aralkyl group having 7 to 11 carbon atoms, (polyethylene glycol)ethyl group having 1 to 5 recurring units or (polypropylene glycol)propyl group having 1 to 5 recurring units may also be used.

Cationic polymerization and/or anionic polymerization for the production of the compound having a structure represented by the above formula (8) may be carried out in the presence of an anionic polymerization catalyst, coordination anionic polymerization catalyst or cationic polymerization catalyst. Typical examples of the anionic polymerization catalyst or the coordination anionic polymerization catalyst include alkali metals such as sodium and lithium; alkyl metal compounds such as s-butyl lithium; alkali metal complex compounds such as sodium/naphthalene; alkali metal alkoxides such as sodium methoxide; amines such as n-butylamine and diethylamine; quaternary ammonium salts such as ammonium stearate and tetrabutylammonium acetate; and tetravalent organic tin compounds such as dibutyltin dilaurate, tributyltin chloride and diethyltin dilaurate.

Typical examples of the cationic polymerization catalyst include tin tetrachloride, tin tetrabromide, titanium tetrachloride, aluminum trichloride, zinc chloride, boron trifluoride, boron trifluoride-diethyl etherate, perchloric acid, acetyl perchlorate, p-toluenesulfonic acid, triethyloxonium tetrafluoroborate, triethyl aluminum and diethylaluminum chloride.

Examples of the polymerization solvent include aliphatic hydrocarbons such as hexane, heptane and cyclohexane; aromatic hydrocarbons such as benzene, toluene and xylene; aliphatic hydrocarbon halides such as methylene chloride, ethylene chloride and carbon tetrachloride; and aromatic hydrocarbon halides such as chlorobenzene and orthodichlorobenzene. These organic solvents may be used alone or in admixture of two or more. The organic solvent is preferably dehydrated and purified to the full.

The molecular weight modifier which is optionally coexistent in the production of this polymer is preferably dissolved or dispersed in a reaction system uniformly and an alcohol or a carboxylic acid may be used as the molecular weight modifier.

Examples of the alcohol include methyl alcohol, ethyl alcohol, hexyl alcohol, cyclohexyl alcohol and benzyl alcohol. Examples of the carboxylic acid include formic acid, acetic acid, propionic acid, lauric acid, palmitic acid and benzoic acid. The amount of the molecular weight modifier is suitably adjusted according to the molecular weight of a polymer of interest and can be easily determined experimentally.

The reaction temperature is preferably set to a range of −200 to 50° C. However, in consideration of the freezing point and boiling point of the organic solvent, it is more preferably set to a range of −100 to 30° C. in most cases. The reaction time is not particularly limited but can be suitably set to a range of 100 hours or less. After the passage of a predetermined polymerization time, for example, the obtained reaction mixture is filtered and the obtained solid is washed with ion exchange water and vacuum dried to produce the compound having a structure represented by the above formula (8) of interest. Since the hydroxyl group at a terminal of a hemiacetal type molecule formed by the above polymerization reaction slightly lacks thermal stability, it is capped at the terminal of molecule in accordance with a method known as means of capping a polyacetal-based polymer, such as esterification, etherification or urethanation as required, to improve its stability.

Methods of producing base decomposable compounds having structures represented by the above formulas (9) to (12) as recurring units are also known.

Methods of producing a compound having a structure represented by the above formula (9) are disclosed by Macromol. Chem., Rapid Commun., 5, 151 (1984), Macromol. Chem., 189, 2229 (1988), Macromol. Chem., 187, 2525 (1986), Polym. J., 22, 803 (1990) and the like.

Methods of producing a compound having a structure represented by the above formula (10) are disclosed by J. Polym. Sci., 47, 1523 (1993), J. Appl. Polym. Sci., 35, 85 (1985), J. Polym. Sci., Polym. Chem. Ed., 22, 1579 (1984), J. Polym. Sci., Polym. Chem. Ed., 14, 655 (1976), J. Polym. Sci., Polym. Chem. Ed., 17, 2429 (1979) and the like.

Methods of producing a compound having a structure represented by the above formula (11) are disclosed by J. Macromol. Sci. -Chem., A9, 1265 (1975) and the like.

Methods of producing a compound having a structure represented by the above formula (12) are disclosed by Polym. Bull., 14, 85 (1985), Macromol. Chem., 189, 1323 (1988) and the like.

(B) Non-decomposable Compound

The non-decomposable compound (B) used in the present invention is stable to an acid or base and preferably has high optical transparency. The refractive index of the component (B) can be suitably set and adjusted to a preferred value according to application purpose. The refractive index $n_B$ of the compound (B) is smaller than the refractive index $n_A$ of the polymer A and particularly preferably satisfies the following expression (1).

$$n_A - n_B \geq 0.05 \tag{1}$$

The non-decomposable compound (B) may be a non-decomposable polymer.

Examples of the non-decomposable polymer (B) include an acrylic-based resin, urethane-based resin, polyester-based resin, polycarbonate-based resin, norbornene-based resin, styrene-based resin, polyether sulfone-based resin, silicon resin, polyamide resin, polyimide resin, polysiloxane-based resin, fluorinated resin, polybutadiene-based resin, vinylether-based resin and vinylester-based resin. A preferred non-decomposable polymer (B) can be suitably selected according to the refractive index of the decomposable polymer (A) used. To increase the difference between the refractive index of the decomposable polymer (A) and the refractive index of the non-decomposable polymer (B) and to reduce a transmission loss though the optical path is long, a non-decomposable polymer (B) having a fluorine atom substituted f or the hydrogen atom of the above resin may be advantageously used.

Illustrative examples of the non-decomposable polymer (B) include the following polymers (the figures within parentheses are refractive index values measured by d-ray): polyvinylidene fluoride (1.42), polydimethylsiloxane (1.43), polytrifluoroethyl methacrylate (1.44), polyoxypropylene (1.45), polyvinylisobutyl ether (1.45), polyvinylethyl ether (1.45), polyoxyethylene (1.46), polyvinylbutyl ether (1.46), polyvinylpentyl ether (1.46), polyvinylhexyl ether (1.46), poly(4-methyl-1-pentene) (1.46 to 1.47), cellulose acetate butyrate (1.46 to 1.49), poly(4-fluoro-2-trifluoromethylstyrene) (1.46), polyvinyloctyl ether (1.46), poly(vinyl 2-ethylhexyl ether) (1.46), polyvinyldecyl ether (1.46), poly(2-methoxyethyl acrylate) (1.46), polybutyl acrylate (1.46), polybutyl acrylate (1.47), poly(t-butyl methacrylate) (1.46), polyvinyldodecyl ether (1.46), poly(3-ethoxypropyl acrylate) (1.47), polyoxycarbonyl tetramethylene (1.47), polyvinyl propionate (1.47), polyvinyl acetate (1.47), polyvinylmethyl ether (1.47), polyethyl acrylate (1.47), ethylene-vinyl acetate copolymer (1.47 to 1.50), (80% to 20% of vinylacetate)cellulose propionate (1.47 to 1.49), cellulose acetate propionate (1.47), benzyl cellulose (1.47 to 1.58), phenol-formaldehyde resin (1.47 to 1.70), cellulose triacetate (1.47 to 1.48), polyvinylmethyl ether (isotactic) (1.47), poly(3-methoxypropyl acrylate) (1.47), poly(2-ethoxyethyl acrylate) (1.47), polymethyl acrylate (1.47 to 1.48), polyisopropyl methacrylate (1.47), poly(1-decene) (1.47), polypropylene (atactic, density of 0.8575g/cm$^3$) (1.47), poly(vinyl sec-butyl ether) (isotactic) (1.47), polydodecyl methacrylate (1.47), polyoxyethylene oxysuccinoyl (1.47), (polyethylene succinate) polytetradecyl methacrylate (1.47), ethylene-propylene copolymer (EPR-rubber) (1.47to 1.48), polyhexadecyl methacrylate (1.48), polyvinyl formate (1.48), poly(2-fluoroethyl methacrylate) (1.48), polyisobutyl methacrylate (1.48), ethyl cellulose (1.48), polyvinyl acetal (1.48 to 1.50), cellulose acetate (1.48 to 1.50), cellulose tripropionate (1.48 to 1.49), polyoxymethylene (1.48), polyvinyl butyral (1.48 to 1.49), poly (n-hexyl methacrylate) (1.48), poly(n-butyl methacrylate) (1.48), polyethylidene dimethacrylate (1.48), poly(2-ethoxyethyl methacrylate) (1.48), polyoxyethylene oxymaleoyl (1.48), (polyethylene maleate) poly(n-propyl methacrylate) (1.48), poly(3,3,5-trimethylcyclohexyl methacrylate) (1.49), polyethyl methacrylate (1.49), poly(2-nitro-2-methylpropyl methacrylate) (1.49), polytriethylcarbinyl methacrylate (1.49), poly(1,1-diethylpropyl methacrylate) (1.49), polymethylmethacrylate (1.49), poly (2-decyl-1,3-butadiene) (1.49), polyvinyl alcohol (1.49 to 1.53), polyethyl glycolate methacrylate (1.49), poly(3-methylcyclohexyl methacrylate) (1.49), poly(cyclohexyl α-ethoxyacrylate) (1.50), methyl cellulose (low viscosity) (1.50), poly(4-methylcyclohexyl methacrylate) (1.50), polydecamethylene glycol dimethacrylate (1.50), polyurethane (1.50 to 1.60), poly(1,2-butadiene) (1.50), polyvinyl formal (1.50), poly(2-bromo-4-trifluoromethylstyrene) (1.50), cellulose nitrate (1.50 to 1.51), poly(sec-butyl α-chloroacrylate) (1.50), poly(2-heptyl-1,3-butadiene) (1.50), poly(ethyl α-chloroacrylate) (1.50), poly(2-isopropyl-1,3-butadiene) (1.50), poly(2-methylcyclohexyl methacrylate) (1.50), polypropylene (density of 0.9075 g/cm$^3$)(1.50), polyisobutene (1.51), polybornyl methacrylate (1.51), poly(2-t-butyl-1,3-butadiene) (1.51), polyethylene glycol dimethacrylate (1.51), polycyclohexyl methacrylate (1.51), poly(cyclohexanediol-1,4-dimethacrylate) (1.51), butyl rubber (unvulcanized) (1.51), polytetrahydrofurfuryl methacrylate (1.51), guttapercha (β) (1.51), polyethylene ionomer (1.51), polyoxyethylene (high molecular weight) (1.51 to 1.54), polyethylene (density of 0.914 g/cm$^3$) (1.51), (density of 0.94 to 0.945 g/cm$^3$) (1.52 to 1.53), (density of 0.965 g/cm$^3$) (1.55), poly(1-methylcyclohexyl methacrylate) (1.51), poly(2-hydroxyethylmethacrylate) (1.51), polyvinyl chloroacetate (1.51), polybutene (isotactic) (1.51), polyvinylmethacrylate (1.51), poly(N-butyl-methacrylamide) (1.51), guttapercha (α) (1.51), terpene resin (1.52), poly(1,3-butadiene) (1.52), shellac (1.51 to 1.53), poly(methyl α-chloroacrylate) (1.52), poly(2-chloroethyl methacrylate) (1.52), poly(2-diethylaminoethyl methacrylate) (1.52), poly(2-chlorocyclohexylmethacrylate) (1.52), poly(1,3-butadiene) (35% of cis-form; 56% of trans-form 1.5180; 7% of 1,2- bond-form), natural rubber (1.52), polyallyl methacrylate (1.52), polyvinyl chloride +40% of dioctyl phthalate (1.52), polyacrylonitrile (1.52), polymethacrylonitrile (1.52), poly (1,3-butadiene) (rich with cis type) (1.52), butadiene-acrylonitrile copolymer (1.52), polymethyl isopropenyl ketone (1.52), polyisoprene (1.52), polyester resin rigid (about 50% of styrene) (1.52 to 1.54), poly(N-(2-methoxyethyl)methacrylamide) (1.52), poly(2,3-dimethylbutadiene) (methyl rubber) (1.53), vinyl chloride-vinyl acetate copolymer (95/5 to 90/10) (1.53 to 1.54), polyacrylic acid (1.53), poly(1,3-dichloropropyl methacrylate) (1.53), poly(2-chloro-1-(chloromethyl)ethyl methacrylate) (1.53), polyacrolein (1.53), poly(1-vinyl-2-pyrrolidone) (1.53), rubber hydrochloride (1.53to 1.55), nylon 6; nylon 6,6; nylon 6,10 (molded product) (1.53), butadiene-styrene copolymer (about 30% of styrene) (1.53), poly(cyclohexyl-α-chloroacrylate) block copolymer (1.53), poly(2-chloroethyl-α-chloroacrylate) (1.53), butadiene-styrene copolymer (about 75/25) (1.54), poly(2-aminoethyl methacrylate) (1.54), polyfurfuryl methacrylate (1.54), poly-butylmercaptylmethacrylate (1.54), poly(1-phenyl-n-amyl methacrylate) (1.54), poly(N-methyl-methacrylamide) (1.54), cellulose (1.54), polyvinyl chloride (1.54 to 1.55), urea formaldehyde resin (1.54 to 1.56), poly(sec-butyl α-bromoacrylate) (1.54), poly(cyclohexyl α-bromoacrylate) (1.54), poly(2-bromoethyl methacrylate) (1.54), polydihydroabietic acid (1.54), polyabietic acid (1.546), polyethylmercaptyl methacrylate (1.55), poly(N-allylmethacrylamide) (1.55), poly(1-phenylethyl methacrylate) (1.55), polyvinylfuran (1.55), poly(2-vinyltetrahydrofuran) (1.55), poly (vinylchloride)+40% of tricresyl phosphate (1.55), poly(p-methoxybenzyl methacrylate) (1.55), polyisopropyl methacrylate) (1.55), poly(p-isopropylstyrene) (1.55), polychloroprene (1.55 to 1.56), poly(oxyethylene-α-benzoate-ω-methacrylate) (1.56), poly(p,p'-xylylenyl dimethacrylate) (1.56), poly(1-phenylallyl methacrylate) (1.56), poly(p-cyclohexylphenyl methacrylate) (1.56), poly(2-phenylethyl methacrylate) (1.56), poly(oxycarbonyloxy-1,4-phenylene-1-propyl) (1.56), poly(1-(o-chlorophenyl)ethyl methacrylate) (1.56), styrene-maleic anhydride copolymer (1.56), poly(1-phenylcyclohexyl methacrylate) (1.56), poly (oxycarbonyloxy-1,4-phenylene-1,3-dimethyl-butylidene-1, 4-phenylene) (1.57), poly(methyl α-bromoacrylate) (1.57), polybenzyl methacrylate (1.57), poly(2-(phenylsulfonyl) ethyl methacrylate) (1.57), poly(m-cresyl methacrylate) (1.57), styrene-acrylonitrile copolymer (about 75/25) (1.57), poly(oxycarbonyloxy-1,4-phenylene isobutylidene-1,4-phenylene) (1.57), poly(o-methoxyphenyl methacrylate) (1.57), polyphenyl methacrylate (1.57), poly(o-cresyl methacrylate) (1.57), polydiallyl phthalate (1.57), poly(2,3-dibromopropyl methacrylate) (1.57), poly(oxycarbonyloxy-1,4-phenylene-1-methyl-butylidene-1, 4-phenylene) (1.57), poly(oxy-2,6-dimethylphenylene) (1.58), polyoxyethylene oxyterephthaloyl (amorphous) (1.58), polyethylene terephthalate (1.51 to 1.64), polyvinyl benzoate (1.58), poly (oxycarbonyloxy-1,4-phenylenebutylidene-1,4-phenylene) (1.58), poly(1,2-diphenylethyl methacrylate) (1.58), poly(o-chlorobenzyl methacrylate) (1.58), 25 poly (oxycarbonyloxy-1,4-phenylene-sec-butylidene-1,4-phenylene) (1.58), polyoxypentaerythritoloxyphthaloyl (1.58), poly(m-nitrobenzyl methacrylate) (1.58), poly (oxycarbonyloxy-1,4-phenyleneisopropylidene-1,4-phenylene) (1.59), poly(N-(2-phenylethyl)methacrylamide) (1.59), poly(4-methoxy-2-methylstyrene) (1.59), poly(o-methylstyrene) (1.59), polystyrene (1.59), poly (oxycarbonyloxy-1,4-phenylenecyclohexylidene-1,4-phenylene) (1.59), poly(o-methoxystyrene) (1.59), polydiphenylmethyl methacrylate (1.59), poly (oxycarbonyloxy-1,4-phenyleneethylidene-1,4-phenylene) (1.59), poly(p-bromophenyl methacrylate) (1.60), poly(N-benzylmethacrylamide) (1.60), poly(p-methoxystyrene) (1.60), polyvinylidene chloride (1.60 to 1.63), polysulfide ("Thiokol") (1.6 to 1.7), poly(o-chlorodiphenylmethyl methacrylate) (1.60), poly(oxycarbonyloxy-1,4-(2,6-dichloro)phenylene-isopropylidene-1,4-(2,6-dichloro) phenylene) (1.61), poly(oxycarbonyloxybis(1,4-(3,5-dichlorophenylene)))poly pentachlorophenyl methacrylate (1.61), poly(o-chlorostyrene) (1.61), poly(phenyl α-bromoacrylate) (1.61), poly(p-divinylbenzene) (1.62), poly(N-vinylphthalimide) (1.62), poly(2,6-dichlorostyrene) (1.62), poly(β-naphthyl methacrylate) (1.63), poly(α-naphthylcarbinyl methacrylate) (1.63), polysulfone (1.63), poly(2-vinylthiophene) (1.64), poly(α-naphthyl methacrylate) (1.64), poly(oxycarbonyloxy-1,4-phenylenediphenyl-methylene-1,4-phenylene) (1.65), poly-vinylphenyl sulfide (1.66), butylphenol formaldehyde resin (1.66), urea-thiourea-formaldehyde resin (1.66), polyvinyl naphthalene (1.68), polyvinyl carbazole (1.68), naphthalene-formaldehyde resin (1.70), phenol-formaldehyde resin (1.70), polypentabromophenyl methacrylate (1.71) and the like.

Out of these, compounds having a d-ray refractive index of 1.6 or less are preferred and compounds having a d-ray refractive index of 1.5 or less are more preferred.

The weight average molecular weight of the non-decomposable compound (B) is preferably 100 to 500,000, more preferably 100 to 200,000.

A compound represented by the following formula (18), hydrolysate or condensate thereof is also used as the non-decomposable compound (B):

$$R^{213}{}_n Si(OR^{214})_{4-n} \qquad (18)$$

wherein $R^{213}$ and $R^{214}$ may be the same or different and each a monovalent organic group, and n is an integer of 0 to 2.

Examples of the monovalent organic group in the above formula (18) include alkyl group, aryl group, allyl group and glycidyl group. Examples of the alkyl group include methyl, ethyl, propyl and butyl, out of which an alkyl group having 1 to 5 carbon atoms is preferred. The alkyl group maybe linear or branched and may contain a halogen atom such as fluorine atom substituted for a hydrogen atom. Examples of the aryl group in the above formula (18) include phenyl and naphthyl. n is preferably 1 or 2 in the above formula (18).

Illustrative examples of the alkylalkoxysilane represented by the above formula (18) include methyl trimethoxysilane, methyl triethoxysilane, methyl tri-n-propoxysilane, methyl triisopropoxysilane, methyl tri-n-butoxysilane, methyl tri-sec-butoxysilane, methy tri-tert-butoxysilane, methyl triphenoxysilane, ethyl trimethoxysilane, ethyl triethoxysilane, ethyl tri-n-propoxysilane, ethyl trisopropoxysilane, ethyl tri-n-butoxysilane, ethyl tri-sec-butoxysilane, ethyl tri-tert-butoxysilane, ethyl triphenoxysilane, n-propyl trimethoxysilane, n-propyl triethoxysilane, n-propyl tri-n-propoxysilane, n-propyl triisopropoxysilane, n-propyl tri-n-butoxysilane, n-propyl tri-sec-butoxysilane, n-propyl tri-tert-butoxysilane, n-propyl triphenoxysilane, isopropyl trimethoxysilane, isopropyl triethoxysilane, isopropyl tri-n-propoxysilane, isopropyl triisopropoxysilane, isopropyl tri-n-butoxysilane, isopropyl tri-sec-butoxysilane, isopropyl tri-tert-butoxysilane, isopropyl triphenoxysilane, n-butyl trimethoxysilane, n-butyl triethoxysilane, n-butyl tri-n-propoxysilane, n-butyl triisopropoxysilane, n-butyl tri-n-butoxysilane, n-butyl tri-sec-butoxysilane, n-butyl tri-tert-butoxysilane, n-butyl triphenoxysilane, sec-butyl trimethoxysilane, sec-butyl isotriethoxysilane, sec-butyl tri-n-propoxysilane, sec-butyl triisopropoxysilane, sec-butyl tri-n-butoxysilane, sec-butyl tri-sec-butoxysilane, sec-butyl tri-tert-butoxysilane, sec-butyl triphenoxysilane, tert-butyl trimethoxysilane, tert-butyl triethoxysilane, tert-butyl tri-n-propoxysilane, tert-butyl triisopropoxysilane, tert-butyl tri-n-butoxysilane, tert-butyl tri-sec-butoxysilane, tert-butyl tri-tert-butoxysilane, tert-butyl triphenoxysilane, cyclohexyl trimethoxysilane, cyclohexyl triethoxysilane, cyclohexyl tri-n-propoxysilane, cyclohexyl trilsopropoxysilane, cyclohexyl tri-n-butoxysilane, cyclohexyl tri-sec-butoxysilane, cyclohexyl tri-tert-butoxysilane, cyclohexyl triphenoxysilane, norbornyl trimethoxysilane, norbornyl triethoxysilane, norbornyl tri-n-propoxysilane, norbornyl triisopropoxysilane, norbornyl tri-n-butoxysilane, norbornyl tri-sec-butoxysilane, norbornyl tri-tert-butoxysilane, norbornyl triphenoxysilane, phenyl trimethoxysilane, phenyl triethoxysilane, phenyl tri-n-propoxysilane, phenyl triisopropoxysilane, phenyl tri-n-butoxysilane, phenyl tri-sec-butoxysilane, phenyl tri-tert-butoxysilane, phenyl triphenoxysilane, dimethyl dimethoxysilane, dimethyl diethoxysilane, dimethyl di-n-propoxysilane, dimethyl diisopropoxysilane, dimethyl di-n-butoxysilane, dimethyl di-sec-butoxysilane, dimethyl di-tert-butoxysilane, dimethyl diphenoxysilane, diethyl dimethoxysilane, diethyl diethoxysilane, diethyl di-n-propoxysilane, diethyl diisopropoxysilane, diethyl di-n-butoxysilane, diethyl di-sec-butoxysilane, diethyl di-tert-butoxysilane, diethyl diphenoxysilane, di-n-propyl dimethoxysilane, di-n-propyl diethoxysilane, di-n-propyl di-n-propoxysilane, di-n-propyl dilsopropoxysilane, di-n-propyl di-n-butoxysilane, di-n-propyl di-sec-butoxysilane, di-n-propyl di-tert-butoxysilane, di-n-propyl diphenoxysilane, diisopropyl dimethoxysilane, diisopropyl diethoxysilane, diisopropyl di-n-propoxysilane, diisopropyl diisopropoxysilane, diisopropyl di-n-butoxysilane, diisopropyl di-sec-butoxysilane, diisopropyl di-tert-butoxysilane, diisopropyl diphenoxysilane, di-n-butyl dimethoxysilane, di-n-butyl diethoxysilane, di-n-butyl di-n-propoxysilane, di-n-butyl diisopropoxysilane, di-n-butyl di-n-butoxysilane, di-n-butyl di-sec-butoxysilane, di-n-butyl di-tert-butoxysilane, di-n-butyl diphenoxysilane, di-sec-butyl diniethoxysilane, di-sec-butyl diethoxysilane, di-sec-butyl di-n-propoxysilane, di-sec-butyl diisopropoxysilane, di-sec-butyl di-n-butoxysilane, di-sec-butyl di-sec-butoxysilane, di-sec-butyl di-tert-butoxysilane, di-sec-butyl diphenoxysilane, di-tert-butyl dimethoxysilane, di-tert-butyl diethoxysilane, di-tert-butyl di-n-propoxysilane, di-tert-butyl diisopropoxysilane, di-tert-butyl di-n-butoxysilane, di-tert-butyl di-sec-butoxysilane, di-tert-butyl di-tert-butoxysilane, di-tert-butyl diphenoxysilane, di-tert-butyl dimethoxysilane, dicyclohexyl diethoxysilane, di-tert-butyl di-n-propoxysilane, dicyclohexyl diisopropoxysilane, dicyclohexyl di-n-butoxysilane, dicyclohexyl di-sec-butoxysilane, dicyclohexyl di-tert-butoxysilane, dicyclohexyl diphenoxysilane, di-tert-butyl dimethoxysilane, dinorbornyl diethoxysilane, di-tert-butyl di-n-propoxysilane, dinorbornyl diisopropoxysilane, dinorbornyl di-n-butoxysilane, dinorbornyl di-sec-butoxysilane, dinorbornyl di-tert-butoxysilane, dinorbornyl diphenoxysilane, diphenyl dimethoxysilane, diphenyl diethoxysilane, diphenyl di-n-propoxysilane, diphenyl diisopropoxysilane, diphenyl di-n-butoxysilane, diphenyl di-sec-butoxysilane, diphenyl di-tert-butoxysilane, phenyl diphenoxysilane, γ-aminopropyl trimethoxysilane, γ-aminopropyl triethoxysilane, γ-glycidyloxypropyl trimethoxysilane, γ-glycidyloxypropyl triethoxysilane, γ-trifluoropropyl trimethoxysilane and γ-trifluoropropyl triethoxysilane. Compounds containing fluorine atoms substituted for some or all of the hydrogen atoms of the above compounds may also be used. These alkylalkoxysilanes may be used alone or in combination of two or more.

Out of the compounds represented by the above formula (18), alkyltrialkoxysilanes of the formula (18) in which n is 1 are particularly preferred. Out of these, methyl trimethoxysilane and methyl triethoxysilane are preferred. When methyl trimethoxysilane and/or methyl triethoxysilane are/is used in an amount of 70 mol % or more based on the total of all the alkylalkoxysilanes, a cured product having good balance between heat resistance and refractive index is obtained. A hydrolysate and condensate of a compound represented by the above formula (18) are more preferred than the compound represented by the above formula (18). When the component (B) is a condensate of a compound represented by the above formula (18), it preferably has a weight average molecular weight of 500 to 100,000 in terms of polystyrene.

When a hydrolysate and/or condensate of a compound represented by the above formula (18) are/is used as the component (B), a hydrolytic reaction and/or a condensation reaction are/is carried out in the presence of water and a suitable catalyst as will be described hereinbelow.

Stated more specifically, the compound represented by the above formula (18) is dissolved in a suitable organic solvent and water is intermittently or continuously added to this solution. The catalyst may be dissolved or dispersed in the organic solvent in advance, or dissolved or dispersed in water to be added.

The temperature for carrying out the hydrolytic reaction and/or condensation reaction is generally 0 to 100° C., preferably 15 to 80° C.

Water for carrying out the hydrolysis and/or condensation of the compound represented by the above formula (18) is not particularly limited but preferably ion exchange water.

The amount of water is preferably 0.25 to 3 mols, particularly preferably 0.3 to 2.5 mols based on 1 mol of the total of groups represented by $R^{214}O-$ of the compound represented by the above formula (18).

The catalyst for carrying out the hydrolysis and/or condensation of the compound represented by the above formula (18) is a metal chelate compound, organic acid, inorganic acid, organic base or inorganic base.

Illustrative examples of the metal chelate compound used as a catalyst include titanium chelate compounds such as triethoxy.mono(acetylacetonato)titanium, tri-n-propoxy.mono(acetylacetonato)titanium, tri-i-propoxy.mono(acetylacetonato)titanium, tri-n-butoxy.mono(acetylacetonato)titanium, tri-sec-butoxy.mono(acetylacetonato)titanium, tri-t-butoxy.mono(acetylacetonato)titanium, diethoxy.bis (acetylacetonato) titanium, di-n-propoxy.bis(acetylacetonato)titanium, di-i-propoxy.bis(acetylacetonato)titanium, di-n-butoxy.bis(acetylacetonato)titanium, di-sec-butoxy.bis(acetylacetonato)titanium, di-t-butoxy.bis(acetylacetonato)titanium, monoethoxy.tris(acetylacetonato)titanium, mono-n-propoxy.tris(acetylacetonato)titanium, mono-i-propoxy.tris(acetylacetonato)titanium, mono-n-butoxy.tris(.acetylacetonato)titanium, mono-sec-butoxy.tris(acetylacetonato)titanium, mono-t-butoxy.tris(acetylacetonato)titanium, tetrakis(acetylacetonato) titanium, triethoxy.mono(ethylacetoacetate)titanium, tri-n-propoxy.mono(ethylacetoacetate)titanium, tri-i-propoxy.mono(ethylacetoacetate)titanium, tri-n- butoxy.mono(ethylacetoacetate)titanium, tri-sec-butoxy.mono(ethylacetoacetate)titanium, tri-t-butoxy.mono(ethylacetoacetate)titanium, diethoxy.bis(ethylacetoacetate)titanium, di-n-propoxy.bis(ethylacetoacetate)titanium, di-i-propoxy.bis(ethylacetoacetate)titanium, di-n-butoxy.bis(ethylacetoacetate)titanium, di-sec-butoxy.bis(ethylacetoacetate)titanium, di-t-butoxy.bis(ethylacetoacetate)titanium, monoethoxy.tris(ethylacetoacetate)titanium, mono-n-propoxy.tris(ethylacetoacetate)titanium, mono-i-propoxy.tris(ethylacetoacetate)titanium, mono-n-butoxy.tris(ethylacetoacetate)titanium, mono-sec-butoxy.trig(ethylacetoacetate)titanium, mono-t-butoxy.tris(ethylacetoacetate)titanium, tetrakis(ethylacetoacetate)titanium, mono(acetylacetonato)tris(ethylacetoacetate)titanium, bi(acetylacetonato)bis(ethylacetoacetate)titanium and tris(acetylacetonato)mono(ethylacetoacetate)titanium; zirconium chelate compounds such as triethoxy.monox(acetylacetonato)azirconium, tri-n-propoxy.mono(acetylacetonato)azirconium, tri-i-propoxy.mono(acetylacetonato)zirconium, tri-n-butoxy.mono(acetylacetonato)zirconium, tri-sec-butoxy.mono(acetylacetonato)zirconium, tri-t-butoxy.mono(acetylacetonato)zirconium, diethoxy.bis(acetylacetonato)zirconium, di-n-propoxy.bis(acetylacetonato)zirconium, di-i-propoxy.bis(acetylacetonato)zirconium, di-n-butoxy.bis(acetylacetonato)zirconium, di-sec-butoxy.bis(acetylacetonato)zirconium, di-t-butoxy.bis(acetylacetonato)zirconium, monoethoxy.tris(acetylacetonato)zirconium, mono-n-propoxy.tris(acetylacetonato)zirconium, mono-i-propoxy.tris(acetylacetonato)zirconium, mono-n-butoxy.tris(acetylacetonato)zirconium, mono-sec-butoxy.tris(acetylacetonato)zirconium, mono-t-butoxy.tris(acetylacetonato)zirconium, tetrakis(acetylacetonato)zirconium, triethoxy.mono(ethylacetoacetate)zirconium, tri-n-propoxy.mono(ethylacetoacetate)zirconium, tri-i-propoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethylacetoacetate)zirconium, diethoxy.bis(ethylacetoacetate)zirconium, di-n-propoxy.bis(ethylacetoacetate)zirconium, di-i-propoxy.bis(ethylacetoacetate)zirconium, di-n-butoxy.bis(ethylacetoacetate)zirconium, di-sec-butoxy.bis(ethylacetoacetate)zirconium, di-t-butoxy.bis(ethylacetoacetate)zirconium, monoethoxy.tris(ethylacetoacetate)zirconium, mono-n-propoxy.tris(ethylacetoacetate)zirconium, mono-i-propoxy.tris(ethylacetoacetate)zirconium, mono-n-butoxy.tris(ethylacetoacetate)zirconium, mono-sec-butoxy.tris(ethylacetoacetate)zirconium, mono-t-butoxy.tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium and tris(acetylacetonato)mono(ethylacetoacetate)zirconium; and aluminum chelate compounds such as tris(acetylacetonato)aluminum and tris(ethylacetoacetate)aluminum.

Examples of the organic acid used as a catalyst include acetic acid, propionic acid, butanoic acid, pentanoic acid, hexoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochioroacetic acid, dichloroacetic acid, trichioroacetic acid, trifluoroacetic acid, formic acid, malonic acid, sulfonic acid, phthalic acid, fumaric acid, citric acid and tartaic acid.

Examples of the inorganic acid used as a catalyst include hydrochloric acid, nitric acid, sulfuric acid, hydrofluoric acid and phosphoric acid.

Examples of the organic base used as a catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene and tetramethylammonium hydroxide.

Examples of the inorganic base used as a catalyst include ammonia, sodium hydroxide, potassium hydroxide, barium hydroxide and calcium hydroxide.

Out of these, a metal chelate compound, an organic acid or an inorganic acid is preferably used as a catalyst and a titanium chelate compound or an organic acid is more preferably used.

These compounds may be used alone or in combination of two or more as a catalyst.

The amount of the catalyst is generally 0.001 to 10 parts by weight, preferably 0.01 to 10 parts by weight based on 100 parts by weight of the compound represented by the above formula (18) in terms of $SiO_2$.

Further, it is preferred to remove the residual water and an alcohol formed as a reaction by-product after the hydrolysis and/or condensation of the compound represented by the above formula (18).

The amount of the component (B) is preferably 10 to 95 parts by weight, more preferably 10 to 90 parts by weight, much more preferably 20 to 90 parts by weight, particularly preferably 20 to 70 parts by weight based on 100 parts by weight of the total of the components (A) and (B). When the amount of the component (B) is smaller than 10 parts by weight, the obtained refractive index changing material is apt to be brittle and when the amount is larger than 90 parts by weight, the obtained refractive index difference tends to be small.

(C) Radiation Sensitive Decomposer

The radiation sensitive decomposer (C) used in the present invention can be a radiation sensitive acid generator or a radiation sensitive base generator. In this case, it is preferred to use a radiation sensitive acid generating agent as the radiation sensitive decomposer (C) when an acid decomposable polymer is used as the decomposable polymer (A) and a radiation sensitive base generator as the radiation sensitive decomposer (C) when a base decomposable polymer is used as the decomposable polymer (A).

The above radiation sensitive acid generator may be a trichloromethyl-s-triazine, diaryl iodonium salt, triaryl sulfonium salt, quaternary ammonium salt or sulfonic acid ester.

Examples of the trichloromethyl-s-triazine include 2,4,6-tris(trichloromethyl)-s-triazine, 2-phenyl-4,6-bis(trichloromethyl)-s-triazine, 2-(4-chlorophenyl)-4,6-bis(trichloromethyl)-s-triazine, 2-(3-chlorophenyl)-4,6-bis(trichloromethyl)-s-triazine, 2-(2-chlorophenyl)-4,6-bis(trichloromethyl)-s-triazine, 2-(4-methoxyphenyl)-4,6-bis(trichloromethyl)-s-triazine, 2-(3-methoxyphenyl)-4,6-bis(trichloromethyl)-s-triazine, 2-(2-methoxyphenyl)-4,6-bis(trichloromethyl)-s-triazine, 2-(4-methylthiophenyl)-4,6-bis(trichloromethyl)-s-triazine, 2-(3-methylthiophenyl)-4,6-bis(trichloromethyl)-s-triazine, 2-(2-methylthiophenyl)-4,6-bis(trichloromethyl)-s-triazine, 2-(4-methoxynaphthyl)-4,6-bis (trichloromethyl)-s-triazine, 2-(3-methoxynaphthyl)-4,6-bis (trichloromethyl)-s-triazine, 2-(2-methoxynaphthyl)-4,6-bis (trichloromethyl)-s-triazine, 2-(4-methoxy-β-styryl)-4,6-bis (trichloromethyl)-s-triazine, 2-(3-methoxy-β-styryl)-4,6-bis (trichloromethyl)-s-triazine, 2-(2-methoxy-β-styryl)-4,6-bis (trichloromethyl)-s-triazine, 2-(3,4,5-trimethoxy-β-styryl)-4,6-bis(trichloromethyl)-s-triazine, 2-(4-methylthio-β-styryl)-4,6-bis(trichloromethyl)-s-triazine, 2-(3-methylthio-β-styryl)-4,6-bis(trichloromethyl)-s-triazine, 2-(3-methylthio-β-styryl) -4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis (trichloromethyl)-s-triazine and 2-[2-(4-diethylamino-2-methylphenyl)ethenyl]-4,6-bis(trichloromethyl)-s-triazine.

Examples of the above diaryl iodonium salt include diphenyliodonium tetrafluoroborate, diphenyliodonium hexafluorophosphonate, diphenyliodoniumhexafluoroarsenate, diphenyliodonium trifluoromethane sulfonate, diphenyliodonium trifluoroacetate, diphenyliodonium-p-toluene sulfonate, diphenyliodonium butyltris(2,6-difluorophenyl)borate, diphenyliodonium hexyltris(p-chlorophenyl)borate, diphenyliodonium hexyltris(3-trifluoromethylphenyl)borate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethane sulfonate, 4-methoxyphenylphenyliodonium trifluoroacetate, 4-methoxyphenylphenyliodonium-p-toluene sulfonate, 4-methoxyphenylphenyliodonium butyltris(2,6-difluorophenyl)borate, 4-methoxyphenylphenyliodonium hexyltris(p-chlorophenyl)borate, 4-methoxyphenylphenyliodonium hexyltris(3-trifluoromethylphenyl)borate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, bis(4-tert-butylphenyl)iodonium-p-toluene sulfonate, bis(4-tert-butylphenyl)iodonium butyltris(2,6-difluorophenyl)borate, bis(4-tert-butylphenyl)iodonium hexyltris(p-chlorophenyl)borate and bis(4-tert-butylphenyl)iodonium hexyltris(3-trifluoromethylphenyl)borate.

Examples of the above triaryl sulfonium salt include triphenylsulfonium tetrafluoroborate, triphenylsulfonium hexafluorophosphonate, triphenylsulfonium hexafluoroarsenate, triphenylsulfonium trifluoromethane sulfonate, triphenylsulfonium trifluoroacetate, triphenylsulfonium-p-toluene sulfonate, triphenylsulfonium butyltris(2,6-difluorophenyl)borate, triphenylsulfonium hexyltris(p-chlorophenyl)borate, triphenylsulfonium hexyltris(3-trifluoromethylphenyl)borate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethane sulfonate, 4-methoxyphenyldiphenylsulfonium trifluoroacetate, 4-methoxyphenyldiphenylsulfonium-p-toluene sulfonate, 4-methoxyphenyldiphenylsulfonium butyltris(2,6-difluorophenyl)borate, 4-methoxyphenyldiphenylsulfonium hexyltris(p-chlorophenyl)borate, 4-methoxyphenyldiphenylsulfonium hexyltris(3-trifluoromethylphenyl)borate, 4-phenylthiophenyldiphenylsulfonium tetrafluoroborate, 4-phenylthiophenyldiphenylsulfonium hexafluorophosphonate, 4-phenylthiophenyldiphenylsulfonium hexafluoroarsenate, 4-phenylthiophenyldiphenylsulfonium trifluoromethane sulfonate, 4-phenylthiophenyldiphenylsulfonium trifluoroacetate, 4-phenylthiophenyldiphenylsulfonium-p-toluene sulfonate, 4-phenylthiophenyldiphenylsulfonium butyltris(2,6-difluorophenyl)borate, 4-phenylthiophenyldiphenylsulfonium hexyltris(p-chlorophenyl)borate, 4-phenylthiophenyldiphenylsulfonium hexyltris(3-trifluoromethylphenyl)borate, 4-hydroxy-1-naphthalenyl)dimethylsulfonium tetrafluoroborate, 4-hydroxy-1-naphthalenyl)dimethylsulfonium hexafluorophosphonate, 4-hydroxy-1-naphthalenyl) dimethylsulfonium hexafluoroarsenate, 4-hydroxy-1-naphthalenyl)dimethylsulfonium trifluoromethane sulfonate, 4-hydroxy-1-naphthalenyl)dimethylsulfonium trifluoroacetate, 4-hydroxy-1-naphthalenyl) dimethylsulfonium-p-toluene sulfonate, 4-hydroxy-1-naphthalenyl)dimethylsulfonium butyltris(2,6-difluorophenyl)borate, 4-hydroxy 1-naphthalenyl) dimethylsulfonium hexyltris(p-chlorophenyl)borate and 4-hydroxy-1-naphthalenyl)dimethylsulfonium hexyltris(3-trifluoromethylphenyl)borate.

Examples of the above quaternary ammonium salt include tetramethylammonium tetrafluoroborate, tetramethylammonium hexafluorophosphonate, tetramethylammonium hexafluoroarsenate, tetramethylammonium trifluoromethane sulfonate, tetramethylammonium trifluoroacetate, tetramethylammonium-p-toluene sulfonate, tetramethylammonium butyltris(2,6-difluorophenyl)borate, tetramethylammonium hexyltris(p-chlorophenyl)borate, tetramethylammonium hexyltris(3-trifluoromethylphenyl)borate, tetrabutylammonium tetrafluoroborate, tetrabutylammonium hexafluorophosphonate, tetrabutylammonium hexafluoroarsenate, tetrabutylammonium trifluoromethane sulfonate, tetrabutylammonium trifluoroacetate, tetrabutylammonium-p-toluene sulfonate, tetrabutylammonium butyltris(2,6-difluorophenyl)borate, tetrabutylammonium hexyltris(p-chlorophenyl)borate, tetrabutylammonium hexyltris(3-trifluoromethylphenyl)borate, benzyltrimethylammonium tetrafluoroborate, benzyltrimethylammonium hexafluorophosphonate, benzyltrimethylammonium hexafluoroarsenate, benzyltrimethylammonium trifluoromethane sulfonate, benzyltrimethylammonium trifluoroacetate, benzyltrimethylammonium-p-toluene sulfonate, benzyltrimethylammonium butyltris(2,6-difluorophenyl)borate, benzyltrimethylammonium hexyltris (p-chlorophenyl)borate, benzyltrimethylammonium hexyltris(3-trifluoromethylphenyl)borate, benzyldimethylphenylammonium tetrafluoroborate, benzyldimethylphenylammonium hexafluorophosphonate, benzyldimethylphenylammonium hexafluoroarsenate, benzyldimethylphenyiammonium trifluoromethane sulfonate, benzyldimethylphenylammonium trifluoroacetate, benzyldimethylphenylammonium-p-toluene sulfonate, benzyldimethylphenylammonium butyltris(2,6-difluorophenyla)borate, benzyldimethylphenylammonium hexyltris(p-chlorophenyl)borate, benzyldimethylphenylammonium hexyltris(3-trifluoromethylphenyl) borate, N-cinnamylideneethylphenylammonium tetrafluoroborate, N-cinnamylideneethylphenylammonium hexafluorophosphonate, N-cinnamylideneethylphenylammonium hexafluoroarsenate, N-cinnamylideneethylphenylammonium trifluoromethane sulfonate, N-cinnamylideneethylphenylammonium trifluoroacetate, N-cinnamylideneethylphenylammonium-p- toluene sulfonate, N-cinnamylideneethylphenylammonium butyltris(2,6-difluorophenyl)borate, N-cinnamylideneethylphenylammonium hexyltris(p-chlorophenyl)borate and N-cinnamylideneethylphenylammonium hexyltris(3-trifluoromethylphenyl)borate.

Examples of the above sulfonic acid ester include α-hydroxymethylbenzoin-p-toluenesulfonic acid ester, α-hydroxymethylbenzoin-trifluoromethanesulfonic acid ester, α-hydroxymethylbenzoin-methanesulfonic acid ester, pyrogallol-tri(p-toluenesulfonic acid)ester, pyrogallol-tri (trifluoromethanesulfonic acid) ester, 2,4-pyrogallol-trimethanesulfonic acid ester, 2,4-dinitrobenzyl-p-toluenesulfonic acid ester, 2,4-dinitrobenzyl-trifluoromethanesulfonic acid ester, 2,4-dinitrobenzyl-methanesulfonic acid ester, 2,4-dinitrobenzyl-1,2-naphthoquinonediazido-5-sulfonic acid ester, 2,6-dinitrobenzyl-p-toluenesulfonic acid ester, 2,6-dinitrobenzyl-trifluoromethanesulfonic acid ester, 2,6-dinitrobenzyl-methanesulfonic acid ester, 2,6-dinitrobenzyl-1,2-naphthoquinonediazido-5-sulfonic acid ester, 2-nitrobenzyl-p-toluenesulfonic acid ester, 2-nitrobenzyl-trifluoromethanesulfonic acid ester, 2-nitrobenzyl-methanesulfonic acid ester, 2-nitrobenzyl-1,2-naphthoquinonediazido-5-sulfonic acid ester, 4-nitrobenzyl-p-toluenesulfonic acid ester, 4-nitrobenzyl-trifluoromethanesulfonic acid ester, 4-nitrobenzyl-methanesulfonic acid ester, 4-nitrobenzyl-1,2-naphthoquinonediazido-5-sulfonic acid ester,N-hydroxynaphthalimide-p-toluenesulfonic acid ester, N-hydroxynaphthalimide-trifluoromethanesulfonic acid ester, N-hydroxynaphthalimide-methanesulfonic acid ester, N-hydroxy-5-norbornene-2,3-dicarboxyimide-p-toluensulfonic acid ester, N-hydroxy-5-norbornene-2,3-dicarboxyimidetrifluoromethanesulfonic acid ester, N-hydroxy-5-norbornene-2,3-dicarboxyimidemethanesulfonic acid ester, 2,4,6,3',4',5'-hexahydroxybenzophenone-1,2-naphthoquinonediazido-4-sulfonic acid ester and 1,1,1-tri(p-hydroxyphenyl)ethane-1,2-naphthoquinonediazido-4-sulfonic acid ester.

Out of these compounds, 2-(3-chlorophenyl)-bis(4,6-trichloromethyl)-s-triazine, 2-(4-methoxyphenyl)-bis(4,6-trichloromethyl)-s-triazine, 2-(4-methylthiophenyl)-bis(4,6-trichloromethyl)-s-triazine, 2-(4-methoxy-β-styryl)-bis(4,6-trichloromethyl)-s-triazine, 2-piperonyl-bis(4,6-trichloromethyl)-s-triazine, 2-[2-(furan-2-yl)ethenyl]-bis(4,6-trichloromethyl)-s-triazine, 2-[2-(5-methylfuran-2-yl)ethenyl]-bis(4,6-trichloromethyl)-s-triazine, 2-[2-(4-diethylamino-2-methylphenyl)ethenyl]-bis(4,6-trichloromethyl)-s-triazine and 2-(4-methoxynaphthyl)-bis(4,6-trichloromethyl)-s-triazine are preferred as trichloromethyl-s-triazines; diphenyliodonium trifluoroacetate, diphenyliodonium trifluoromethane sulfonate, 4-methoxyphenylphenyliodonium trifluoromethane sulfonate and 4-methoxyphenylphenyliodonium trifluoroacetate are preferred as diaryliodonium salts; triphenylsulfonium trifluoromethane sulfonate, triphenylsulfonium trifluoroacetate, 4-methoxyphenyldiphenylsulfonium trifluoromethane sulfonate, 4-methoxyphenyldiphenylsulfonium trifluoroacetate, 4-phenylthiophenyldiphenylsulfonium trifluoromethane sulfonate and 4-phenylthiophenyldiphenylsulfonium trifluoroacetate are preferred as triarylsulfonium salts; tetramethylammonium butyltris(2,6-difluorophenyl)borate, tetramethylammonium hexyltris(p-chlorophenyl)borate, tetramethylammonium hexyltris(3-trifluoromethylphenyl)borate, benzyldimethylphenylammonium butyltris(2,6-difluorophenyl)borate, benzyldimethylphenylammonium hexyltris(p-chlorophenyl)borate and benzyldimethylphenylammonium hexyltris(3-trifluoromethylphenyl)borate are preferred as quaternary ammonium salts; and 2,6-dinitrobenzyl-p-toluenesulfonic acid ester, 2,6-dinitrobenzyl-trifluoromethanesulfonic acid ester, N-hydroxynaphthalimide-p-toluenesulfonic acid ester and N-hydroxynaphthalimide-trifluoromethanesulfonic acid ester are preferred as sulfonic acid esters.

What are disclosed by JP-A 4-330444, "Polymer", pp. 242-248, vol. 46, No. 6 (1997) and U.S. Pat. No. 5,627,010 are advantageously used as the above radiation sensitive base generator. However, the radiation sensitive base generator is not limited to these if it generates a base upon exposure to radiation.

The radiation sensitive base generator in the present invention is preferably an optically active carbamate such as triphenyl methanol, benzyl carbamate or benzoin carbamate; amide such as O-carbamoyl hydroxylamide, O-carbamoyloxime, aromatic sulfonamide, alpha-lactam or N-(2-allylethynyl)amide, or other amide; oxime ester, α-aminoacetophenone or cobalt complex.

Examples of the radiation sensitive base generator include compounds represented by the following formulas (19) to (29):

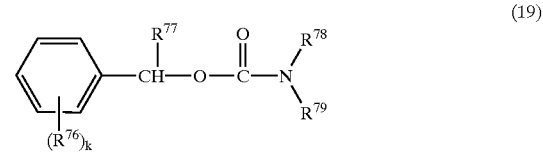

(19)

wherein $R^{76}$ is an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group, aryl group, fluorine atom, chlorine atom or bromine atom, k is an integer of 0 to 3, $R^{77}$ is a hydrogen atom, alkyl group having 1 to 6 carbon atoms or aryl group, and $R^{78}$ and $R^{79}$ are each independently a hydrogen atom, alkyl group having 1 to 6 carbon atoms, aryl group or benzyl group, or $R^{78}$ and $R^{79}$ may be bonded together to form a cyclic structure having 5 to 6 carbon atoms together with a nitrogen atom bonded thereto,

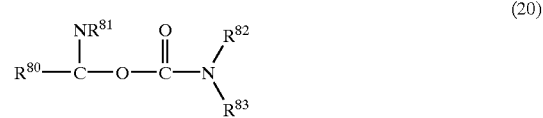

(20)

wherein $R^{80}$ is an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{81}$ is a hydrogen atom, alkyl group having 1 to 6 carbon atoms or aryl group, and $R^{82}$ and $R^{83}$ are each independently a hydrogen atom, alkyl group having 1 to 6 carbon atoms, aryl group or benzyl group, or $R^{82}$ and $R^{83}$ may be bonded together to form a cyclic structure having 5 to 6 carbon atoms together with a nitrogen atom bonded thereto,

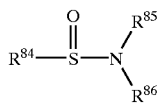
(21)

wherein $R^{84}$ is an alkyl group having 1 to 6 carbon atoms or aryl group, and $R^{85}$ and $R^{86}$ are each independently a hydrogen atom, alkyl group having 1 to 6 carbon atoms, aryl group or benzyl group, or $R^{85}$ and $R^{86}$ may be bonded together to form a cyclic structure having 5 to 6 carbon atoms together with a nitrogen atom bonded thereto,

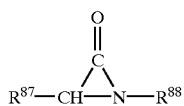
(22)

wherein $R^{87}$ and $R^{88}$ are each independently an alkyl group having 1 to 6 carbon atoms or aryl group,

(23)

wherein $R^{89}$, $R^{90}$ and $R^{91}$ are each independently an alkyl group having 1 to 6 carbon atoms or aryl group,

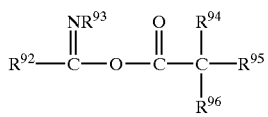
(24)

wherein $R^{92}$ is an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{93}$ is a hydrogen atom, alkyl group having 1 to 6 carbon atoms or aryl group, and $R^{94}$, $R^{95}$ and $R^{96}$ are each independently a hydrogen atom, alkyl group having 1 to 6 carbon atoms, aryl group or benzyl group,

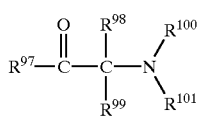
(25)

wherein $R^{97}$ is an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{98}$ and $R^{99}$ are each independently a hydrogen atom, hydroxyl group, mercapto group, cyano group, phenoxy group, alkyl group having 1 to 6 carbon atoms, fluorine atom, chlorine atom, bromine atom or aryl group, and $R^{100}$ and $R^{101}$ are each independently a hydrogen atom, alkyl group having 1 to 6 carbon atoms, aryl group or benzyl group, or $R^{100}$ and $R^{101}$ may be bonded together to form a cyclic structure having 5 to 6 carbon atoms together with a nitrogen atom bonded thereto,

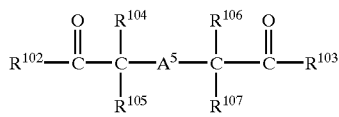
(26)

wherein $R^{102}$ and $R^{103}$ are each independently an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{104}$ to $R^{107}$ are each independently a hydrogen atom, hydroxyl group, mercapto group, cyano group, phenoxy group, alkyl group having 1 to 6 carbon atoms, fluorine atom, chlorine atom, bromine atom or aryl group, and $A^5$ is a divalent atomic group formed by excluding two hydrogen atoms bonded to one or two nitrogen atoms of a monoalkylamine, piperazine, aromatic diamine or aliphatic diamine,

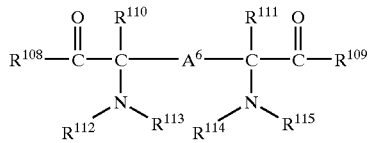
(27)

wherein $R^{108}$ and $R^{109}$ are each independently an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{110}$ and $R^{111}$ are each independently a hydrogen atom, hydroxyl group, mercapto group, cyano group, phenoxy group, alkyl group having 1 to 6 carbon atoms, fluorine atom, chlorine atom, bromine atom or aryl group, $R^{112}$ to $R^{115}$ are each independently a hydrogen atom, alkyl group having 1 to 6 carbon atoms, aryl group or benzyl group, or $R^{112}$ and $R^{113}$ and $R^{114}$ and $R^{115}$ may be bonded together to form a cyclic structure having 5 to 6 carbon atoms together with nitrogen atoms bonded thereto, and $A^6$ is an alkylene group having 1 to 6 carbon atoms, cyclohexylene group, phenylene group or single bond,

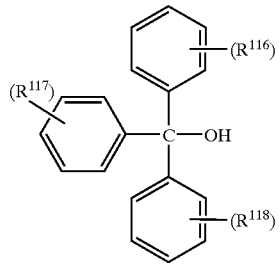
(28)

wherein $R^{116}$ to $R^{118}$ are each independently a hydrogen atom, fluorine atom, chlorine atom, bromine atom, alkyl group having 1 to 6 carbon atoms, alkenyl group having 1 to 6 carbon atoms, alkynyl group having 1 to 6 carbon atoms, alkoxy group having 1 to 6 carbon atoms or aryl group,

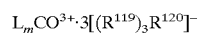
(29)

wherein L is at least one ligand selected from the group consisting of ammonia, pyridine, imidazole, ethylene diamine, trimethylene diamine, tetramethylene diamine, hexamethylene diamine, propylene diamine, 1,2-cyclohexane diamine, N,N-diethylethylene diamine and diethylene triamine, m is an integer of 2 to 6, $R^{119}$ is an aryl group, and $R^{120}$ is an alkyl group having 1 to 18 carbon atoms.

In all the above formulas (19) to (29), the alkyl group may be linear, branched or cyclic. The aryl group includes an alkenyl group such as vinyl or propylenyl; alkynyl group such as acetylenyl; phenyl group, naphthyl group and anthracenyl group, and also what contain a fluorine atom, chlorine atom, bromine atom, haloalkyl group, hydroxyl group, carboxyl group, mercapto group, cyano group, nitro group, azido group, dialkylamino group, alkoxy group or thioalkyl group substituted for the hydrogen atoms of the above groups.

Out of these radiation sensitive base generators, preferred are 2-nitrobenzylcyclohexyl carbamate, triphenyl methanol, o-carbamoylhydroxylamide, o-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexamminecobalt(III) tris(triphenylmethylborate) and 2-benzyl-2-dimethylamino-1-(4-morpholinophenyl)-butanone.

The above radiation sensitive decomposer (C) is preferably used in an amount of 0.01 part or more by weight, more preferably 0.05 part or more by weight based on 100 parts by weight of the total of the decomposable polymer (A) and the non-decomposable compound (B). When the amount of the component (C) is smaller than 0.01 part by weight, sensitivity to radiation tends to be lower. The upper limit value is preferably 30 parts by weight, more preferably 20 parts by weight.

(D) stabilizer

The stabilizer (D) used in the present invention has the function of stabilizing the residual decomposable polymer (A) existent in the refractive index changing material after exposure to radiation to provide stability to an acid or base. This stabilization prevents a change in refractive index and hence the deterioration of a refractive index pattern formed by the method of the present invention even when it is used under the condition that light having a wavelength close to the wavelength used to change the refractive index passes therethrough.

Examples of the above stabilizer (D) include amino compound, epoxy compound, thuirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound and silyl compound (silyl halide compound and other silyl compound).

Examples of the above amino compound include ammonia, trimethylamine, triethylamine, tripropylamine, tributylamine, tripentylamine, trihexylamine, tricyclohexylamine, triphenylamine, tribenzylamine, aniline, ethylenediamine, diethylenetriamine, triethylenetetramine, tetraethylenepentamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane 1,12-diaminododecane, 1,4-diaminocyclohexane, 1,3-cyclohexanebis(methylamine), 2,2',2"-triaminotriethylamine 1,4-diamino-2,2,3,3-tetrafluoropentane 1,5-diamino-2,2,3,3,4,4-hexafluoropentane, melamine, benzoguanaxnine, acetoguanamine, acryloguanamine, paramine, amidol, m-phenylenediamine, p-phenylenediamine, p,p'-diaminodiphenylmethane, diaminodiphenylsulfone, 1,8-diaminonaphthalene, 3,5-diamino-1,2,4-triazole, 2-chloro-4, 6-diamino-S-triazine 2,6-diaminopyridine, 3,3'-diaminobenzidine, bis(4-aminophenyl)ether, m-xylylenediamine, p-xylylenediamine, 1,2,4,5-benzenetetramine, 2,4-diamino-1,3,5-triazine, 4,4'-diaminobenzophenone, 3,3',4,4'-tetraaminobenzophenone, triaminobenzene, 4,4'-thiodianiline, 2,3,5,6-tetrabromo-p-xylylenediamine 2,3,5,6 -tetrachloro-p-xylylenediamine, 4,5-methylenedioxy-1,2-phenylenediamine and 2,2'-bis(5-aminopyridyl)sulfide.

The above epoxy compound is a bisphenol A epoxy resin, bisphenol F epoxy resin, phenol novolak epoxy resin, cresol novolak epoxy resin, cyclic aliphatic epoxy resin or aliphatic polyglycidyl ether., Examples of commercially available products of the above compounds are given below. Commercially available products of the bisphenol A epoxy resin include Epicoat 1001, 1002, 1003, 1004, 1007, 1009, 1010 and 828 (of Yuka Shell Epoxy Co., Ltd.), those of the bisphenolF epoxy resin include Epicoat 807 (of Yuka Shell Co., Ltd.), those of the phenol novolak epoxy resin include Epicoat 152 and 154 (of Yuka Shell Epoxy Co., Ltd.) and EPPN201 and 202 (of Nippon Kayaku Co., Ltd.), those of the cresol novolak epoxy resin include EOCN-102, EOCN-103S, EOCN-104S, EOCN-1020, EOCN-1025 and EOCN-1027 (of Nippon Kayaku Co., Ltd.) and Epicoat 180S75 (of Yuka Shell Epoxy Co., Ltd.), those of the cyclic aliphatic epoxy resin include CY175, CY177and CY179 (of CIBA-GEIGYA.G.), ERL-4234, ERL-4299, ERL-4221 and ERL-4206 (of U.C.C. Co., Ltd.), Showdyne 509 (of Showa Denko K. K.), Araldyte CY-182, CY-192 and CY-184 (of CIBA-GEIGY A.G.), Epichlon 200 and 400 (of Dainippon Ink and Chemicals, Inc.), Epicoat 871 and 872 (of Yuka Shell EpoxyCo.,Ltd.) and ED-5661and ED-5662 (of Ceranies Coating Co., Ltd.), and those of the aliphatic polyglycidyl ether include Epolite 100MF (of Kyoeisha Kagaku Co., Ltd.) and Epiol TMP (of NOF Corporation).

Besides the above compounds, phenylglycidyl ether, butylglycidyl ether, 3,3,3-trifluoromethylpropylene oxide, styrene oxide, hexafluoropropylene oxide, cyclohexene oxide, N-glycidylphthalimide, (nonafluoro-N-butyl) epoxide, perfluoroethylglycidyl ether, epichlorohydrin, epibromohydrin, N,N-diglycidylaniline and 3-[2-(perfluorohexyl)ethoxy]-1,2-epoxypropane may be advantageously used as an epoxy compound.

Examples of the above thiirane compound include those obtained by substituting the epoxy groups of the above epoxy compounds with an ethylene sulfide group as shown in J. Org. Chem., 28, 229 (1963), for example.

Examples of the above oxetane compound include bis[(3-ethyl-3-oxetanylmethoxy)methyl]benzene (trade name of XDO, of Toagosei Chemical Industry Co., Ltd.), bis[(3-ethyl-3-oxetanylmethoxy)methyl-phenyl]methane, bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl] hexafluoropropane, tri[(3-ethyl -3-oxetanylmethoxy) methyl]benzene and tetra[(3-ethyl-3-oxetanylmethoxy) methyl]benzene.

The above alkoxymethyl melamine compound, alkoxymethyl benzoguanamine compound, alkoxymethyl glycoluril compound and alkoxymethyl urea compound are obtained by substituting the methylol groups of a methylol melamine compound, methylol benzoguanamine compound, methylol glycoluril compound and methylol urea compound with an alkoxymethyl group, respectively. The type of the alkoxymethyl group is not particularly limited, as exemplified by methoxymethyl group, ethoxymethyl group, propoxymethyl group and butoxymethyl group.

Commercially available products of the above compounds include Simel 300, 301, 303, 370, 325, 327, 701, 266, 267, 238, 1141, 272, 202, 1156, 1158, 1123, 1170 and 1174, and UFR65 and 300 (of Mitsui Sianamid Co., Ltd.), and Nicalack Mx-750, Mx-032, Mx-706, Mx-708, Mx-40, Mx-31, Ms-11 and Mw-30 (of Sanwa Chemical Co., Ltd.).

Examples of the above isocyanate compound include phenylene-1,3-diisocyanate, phenylene-1,4-diisocyanate, 1-methoxyphenylene-2,4-diisocyanate, 1-methylphenylene-2,4-diisocyanate, 2,4-tolylene diisocyanate, 2,6-tolylene diisocyanate, 1,3-xylylene diisocyanate, 1,4-xylylene diusocyanate, biphenylene-4,4'-diisocyanate, 3,3'-dimethoxybiphenylene-4,4'-diisocyanate, 3,3'-dimethylbiphenylene-4,4'-diisocyanate, diphenylmethane-2,4'-diisocyanate, diphenylmethane-4,4'-diisocyanate, 3,3'-dimethoxydiphenylmethane-4,4'-diisocyanate, 3,3'-dimethyldiphenylmethane-4,4'-diisocyanate, naphthylene-1,5-diisocyanate, cyclobutylene-1,3-diisocyanate, cyclopentylene-1,3-diisocyanate, cyclohexylene-1,3-diisocyanate, cyclohexylene-1,4-diisocyanate, 1-methylcyclohexylene-2,4-diisocyanate, 1-methylcyclohexylene-2,6-diisocyanate, 1-isocyanate-3,3,5-trimethyl-5-isocyanate methylcyclohexane, cyclohexane-1,3-bis(methylisocyanate), cyclohexane-1,4-bis(methylisocyanate), isophorone diisocyanate, dicyclohexylmethane-2,4'-diisocyanate, dicyclohexylmethane-4,4'-diisocyanate, ethylene diisocyanate, tetramethylene-1,4-diisocyanate, hexamethylene-1,6-diisocyanate, dodecamethylene-1,12-diisocyanate, lysine diisocyanate methyl ester and prepolymers having an isocyanate at both terminals obtained from a reaction between a stoichiometrically excessive amount of an organic diisocyanate thereof and a bifunctional active hydrogen-containing compound.

The above diisocyanate may be used in combination with an organi polyisocyanate having a functionality of 3 or more, such as phenyl-1,3,5-triisocyanate, diphenylmethane-2,4,4'-truisocyanate, diphenylmethane-2,5,4'-triisocyanate, triphenylmethane-2,4',4''-triisocyanate, triphenylmethane-4,4',4''-truisocyanate, diphenylmethane-2,4,2',4'-tetraisocyanate, diphenylmethane-2,5,2',5'-tetraisocyanate, cyclohexane-1,3,5-triisocyanate, cyclohexane-1,3,5-tris (methylisocyanate), 3,5-dimethylcyclohexane-1,3,5-tris (methylisocyanate), 1,3,5-trimethylcyclohexane-1,3,5-tris (methylisocyanate), dicyclohexylmethane-2,4,2'-triisocyanate, dicyclohexylmethane-2,4,4'-triisocyanate or a prepolymer having an isocyanate at a terminal obtained from a reaction between a stoichiometrically excessive amount of an organic polyisocyanate having a functionality of 3 or more and a polyfunctional active hydrogen-containing compound having a functionality of 2 or more.

Examples of the above cyanate compound include 1,3-dicyanate benzene, 1,4-dicyanate benzene, 1,3,5-tricyanate benzene, 1,3-, 1,4-, 1,6-, 1,8-, 2,6- or 2,7-dicyanate naphthalene, 1,3,6-tricyanate naphthalene, 2,2'- or 4,4'-dicyanate biphenyl, bis(4-cyanatephenyl)methane, 2,2-bis (4-cyanatephenyl)propane, 2,2'-bis(3,5-dichloro-4-cyanatephenyl)propane, 2,2-bis(4-cyanatephenyl)ethane, bis(4-cyanatephenyl)ether, bis(4-cyanatephenyl)thioether, bis(4-cyanatephenyl)sulfone, 1,1,1,3,3,3-hexafluoro-2,2-bis (4-cyanatephenyl)propane, tris(4-cyanatephenyl)phosphite, tris(4-cyanatephenyl)phosphate and benzene polynuclear polyisocyanate compounds obtained from a reaction between a phenol resin and a cyan halide (for example, JP-B 45-11712 and JP-B 55-9433) (the term "JP-B" as used herein means an "examined Japanese patent publication"). A divalent cyanate compound derived from a bisphenol such as 2,2-bis(4-cyanatephenyl)propane is particularly preferred because it is easily acquired, has excellent moldability and provides favorable properties to the final cured product. A polycyanate obtained by reacting an initial condensate of a phenol and formaldehyde with a cyan halide is also useful.

Examples of the above oxazoline compound include 2,2'-bis(2-oxazoline), 4-furan-2-ylmethylene-2-phenyl-4H-oxazol-5-one, 1,4-bis(4,5-dihydro-2-oxazolyl)benzene, 1,3-bis(4,5-dihydro-2-oxazolyl)benzene, 2,3-bis(4-isopropenyl-2-oxazolin-2-yl)butane, 2,2'-bis-4-benzyl-2-oxazoline, 2,6-bis(isopropyl-2-oxazolin-2-yl)pyridine, 2,2'-isopropylidenebis(4-tert-butyl-2-oxazoline), 2,2'-isopropylidenebis(4-phenyl-2-oxazoline), 2,2'-methylenebis (4-tert-butyl-2-oxazoline) and 2,2'-methylenebis(4-phenyl-2-oxazoline).

Examples of the above oxazine compound include 2,2'-bis(2-oxazine), 4-furan-2-ylmethylene-2-phenyl-4H-oxazyl-5-one, 1,4-bis(4,5-dihydro-2-oxazyl)benzene, 1,3-bis(4,5-dihydro-2-oxazyl)benzene, 2,3-bis(4-isopropenyl-2-oxazin-2-yl)butane, 2,2'-bis-4-benzyl-2-oxazine, 2,6-bis (isopropyl-2-oxazin-2-yl)pyridine, 2,2'-isopropylidenebis (4-tert-butyl-2-oxazine), 2,2'-isopropylidenebis(4-phenyl-2-oxazine), 2,2'-methylenebis(4-tert-butyl-2-oxazine) and 2,2'-methylenebis(4-phenyl-2-oxazine).

Examples of the above silyl halide compound include tetrahalogenosilanes such as tetrachlorosilane, tetrabromosilane, tetraiodosilane, trichlorobromosilane and dichlorodibromosilane; monoalkyltrihalogenosilanes such as methyltrichlorosilane, methyldichlorobromosilane and cyclohexyltrichlorosilane; monoaryltrihalogenosilanes such as phenyltrichlorosilane, naphthyltrichlorosilane, 4-chlorophenyltrichlorosilane and phenyldichlorobromosilane; monoaryloxytrihalogenosilanes such as phenoxytrichlorosilane and phenoxydichlorobromosilane; monoalkoxytrihalogenosilanes such as methoxytrichlorosilane and ethoxytrichlorosilane; dialkyldihalogenosilanes such as dimethyldichlorosilane, methyl(ethyl)dichlorosilane and methyl(cyclohexyl)dichlorosilane; monoalkyl-monoaryldihalogenosilanes such as methyl(phenyl) dichlorosilane; diaryldihalogenosilanes such as diphenyldichlorosilane; diaryloxydihalogenosilanes such as diphenoxydichlorosilane; monoalkylmonoaryloxydihalogenosilanes such as methyl(phenoxy)dichlorosilane; monoarylmonoaryloxydihalogenosilanes such as phenyl (phenoxy)dichlorosilane, dialkoxydihalogenosilanes such as diethoxydichlorosilane; monoalkylmonoalkoxydichlorosilanes such as methyl(ethoxy)dichlorosilane; monoaryl-monoethoxydichlorosilanes such as phenyl(ethoxy) dichlorosilane; trialkylmonohalogenosilanes such as trimethylchlorosilane, dimethyl(ethyl)chlorosilane and dimethyl(cyclohexyl)chlorosilane; dialkylmonoarylmonohalogenosilanes such as dimethyl(phenyl)chlorosilane; monoalkyldiarylmonohalogenosilanes such as methyl (diphenyl)chlorosilane; triaryloxymonohalogenosilanes such as triphenoxychlorosilane; monoalkyldiaryloxymonohalogenosilanes such as methyl(diphenoxy)chlorosilane; monoaryldiaryloxymonohalogenosilanes such as phenyl (diphenoxy)chlorosilane; dialkylmonoaryloxymonohalogenosilanes such as dimethyl(phenoxy)chlorosilane; diarylmonoaryloxymonohalogenosilanes such as diphenyl (phenoxy)chlorosilane; monoalkylmonoarylmonoaryloxymonohalgenosilanes such as methyl(phenyl)(phenoxy)chlorosilane; triethoxymonohalogenosilanes such as triethoxychlorosilane; and oligomers thereof such as dimer, trimer, tetramer and pentamer of tetrachlorosilane.

Examples of the above other silyl compound include hexamethyldisilazane, t-butyldimethylchlorosilane, bis(trimethylsilyl)trifluoroacetamide, diethylaminotrimethylsilane, trimethylsilanol, hexamethyldisiloxane, chloromethyldimethylethoxysilane, acetyltriphenylsilane, ethoxytriphenylsilane, triphenylsilanol, triethylsilanol, tripropylsilanol, tributylsilanol, hexaethyldisiloxane, trimethylmethoxysilane, trimethylethoxysilane, triethylmethoxysilane, triethylethoxysilane, acetoxyethyldimethylchlorosilane, 1,3-bis(hydroxybutyl)tetramethyldisiloxane, 1,3-bis(hydroxypropyl)tetramethyldisiloxane, γ-aminopropylmethoxysilane, γ-aminopropylethoxysilane, N-β(aminoethyl)-γ-aminopropyltrimethoxysilane, N-β(aminoethyl)-γ-aminopropylmethyldimethoxysilane, N-phenyl-γ-aminopropyltrimethoxysilane, γ-anilinopropyltrimethoxysilane, γ-dibutylaminopropyltrimethoxysilane, γ-ureidopropyltriethoxysilane, N-β(N-vinylbenzylaminoethyl)-γ-aminopropyltrimethoxysilane.hydrochlorate, γ-methacryloxypropyltrimethoxysilane, γ-methacryloxypropyltriethoxysilane, vinyltrimethoxysilane, vinyltriethoxysilane, vinyltrichlorosilane, vinyltris(β-methoxyethoxy)silane, γ-glycidoxypropylmethyldiethoxysilane, γ-glycidoxypropyltriethoxysilane, γ-(3,4-epoxycyclohexyl)ethyltrimethoxysilane, γ-glycidoxypropyltrimethoxysilane, γ-mercaptopropyltrimethoxysilane, γ-chloropropyltrimethoxysilane, trimethylchlorosilane, hexamethyldisilazane, N-trimethylsilylimidazole, bis(trimethylsilyl)urea, trimethylsilylacetamide, bistrimethylsilylacetamide, trimethylsilylisocyanate, trimethylmethoxysilane, trimethylethoxysilane, methyltrimethoxysilane, methyltriethoxysilane, dimethyldimethoxysilane, dimethyldiethoxysilane, t-butyldimethylchlorosilane, t-butyldiphenylchlorosilane, triisopropylchlorosilane, n-propyltrimethoxysilane, isobutyltrimethoxysilane, n-hexyltrimethoxysilane, n-decyltrimethoxysilane, n-hexadecyltrimethoxysilane, 1,6-bis(trimethoxysilyl)hexane, dimethylsilyldiisocyanate, methylsilyltriisocyanate, phenyltrimethoxysilane, diphenyldimethoxysilane and phenylsilyltriisocyanate.

Out of these, the stabilizer (D) used in the present invention is preferably an amino compound, epoxy compound, thiirane compound, oxetane compound, oxazoline compound, oxazine compound, silyl compound, isocyanate compound or cyanate compound, more preferably an amino compound, epoxy compound, thiirane compound, oxetane compound, oxazoline compound or oxazine compound. It is particularly preferably ethylenediamine, phenylglycidyl ether, 3-phenoxypropylene sulfide, 3,3,3-trifluoropropylene oxide, hexamethyldisilazane, γ-aminopropylmethoxysilane, γ-glycidoxypropyltrimethoxysilane or methylsilyltriisocyanate.

These stabilizers (D) maybe used alone or in combination of two or more. The amount of the component (D) may be excessive so that the residual decomposable polymer (A) can react to the full but it is generally 10 parts or more by weight, preferably 30 parts or more by weight based on 100 parts by weight of the component (A). When the amount of the component (D) is smaller than 10 parts by weight, the stability of the refractive index changing material may become unsatisfactory due to an imcomplete reaction.

A catalyst may be used in combination with the stabilizer (D). Use of the catalyst promotes a reaction between the components (D) and the residual decomposable polymer (A).

The catalyst is an acidic catalyst, basic catalyst or quaternary onium.

Example of the acidic catalyst include organic acids such as acetic acid, methanesulfonic acid, p-toluenesulfonic acid; and inorganic acids and trifluoromethasulfonic acid, sulfonic acid and nitric acid. Example of the catalyst include alkaly metal carbonates such as sodium carbonate, potassium carbonate and lithium carbonate; alkali metal bicarbonates such as sodium bicarbonate, potassium bicarbonate and lithium bicarbonate; alkali metal acetates such as sodium acetate; alkali metal hydrides such as lithium hydride, sodium hydride and potassium hydride; alkali metal hydroxyde such as sodium hydroxide, potasium hydroxyde and lithium hydroxide; alkali metal alkoxides such as sodium methoxide, sodium athoxide, potasium t-butoxide and lithium mothoxide; mercaptan alkali metals such as methyl mercaptan sodium and ethyl mercaptan sodium; organic amides such as triethylamine, tributylamine, diisopropylethylamine, N-methylmorpholine, pyridine, 4-(N,N-dimethylamino)pyridine, N,N-dimethylamine, N,N-diethylamiline, 1,5-diazabicyclo[4.3.0]non-5ene, 1,4-diazabicyclo[2.2.2.]octane (DABCO) and 1,8-diazabicyclo[5.4.0]undec-7-ene (DBU); alkyl lithiums such as methyl lithium, ethyl lithium and butyl lithium; and lithium alkyl amides such as lithium diisopropylamide and lithium dicyclohexylamide. Example of the above quaternary onium salt include tetrabutylammonium chloride, tetrabutylammonium bromide, tetrabutylammonium iodide, tetrabutylammonium acetate, tetrabutylphosphonium chloride, tetrabutylphosphonium bromide, cetyltrimethylammonium bromide, tetrapropylammonium bromide and benzyltriethylammonium chloride. A combination of 18-crown-6-ether and a salt such as potassium chloride, potassium bromide, potassium iodide, cesium chloride, potassium phenoxide, sodium phenoxide or potassium benzoate may also be used as a catalyst.

Out of these, p-toluenesulfonic acid, hydrochloric acid, sulfuric acid, sodium hydroxide, potassium t-butoxide, triethylamine, DBU, tetrabutylammonium bromide, tetrabutylphosphonium bromide and 18-crown-6-ether/potassium phenoxide are preferred as a catalyst.

The amount of the catalyst is preferably 2 mols or less based on 1 equivalent of the component (D) when an amino compound, alkoxymethyl melamine compound, alkoxymethyl glycoluril compound, alkoxymethyl benzoguanamine compound, alkoxymethyl urea compound or silyl halide compound is used as the component (D).

When an epoxy compound, thiirane compound, oxetane compound, isocyanate compound, cyanate compound, oxazoline compound, oxazine compound or other silyl compound is used as the component (D), it is preferably 0.2 mol or less based on 1 equivalent of the component (D).

The number of equivalents of the component (D) is obtained by multiplying the number of reactive groups contained in the component (D) by the amount (mol) of the component (D) and the number of reactive groups is defined as follows according to the type of the component (D). amino compound: number of nitrogen atoms epoxy compound: number of epoxy groups thuirane compound: number of ethylene sulfide groups oxetane compound: number of oxetanyl groups alkoxymethyl melamine compound, alkoxymethyl glycoluril compound, alkoxymethyl benzoguanamine compound and alkoxymethyl urea compound: number of alkoxymethyl groups isocyanate compound: number of isocyanate group cyanate compound: number of cyanate groups oxazoline compound: number of oxazolyl groups oxazine compound: number of oxazyl groups silyl halide compound: number of halogen atoms bonded to silicon atoms other silyl compound: number of silicon atoms
<Other Components>

The refractive index changing composition used in the present invention may contain other additives in limit not prejudicial to the object of the present invention. The additives include an ultraviolet light absorber, sensitizer, surfactant, heat resistance improving agent and adhesive aid.

The above ultraviolet light absorber is a benzotriazole, salicylate, benzophenone, substituted acrylonitrile, xanthene, coumarin, flavone or chalcone. Specific examples of the ultraviolet light absorber include Tinubin 234 (2-(2-hydroxy-3,5-bis (α, α-dimethylbenzyl)phenyl)-2H-benzotriazole), Tinubin 571 (hydroxyphenylbenzotriazole derivative) and Tinubin 1130 (condensate of methyl-3-(3-t-butyl-5-(2H-benzotriazol-2-yl)-4-hydroxyphenyl) propionate and polyethylene glycol (molecular weight of 300)) (of Ciba Specialty Chemicals), and 1,7-bis(4-hydroxy-3-methoxyphenyl)-1,6-heptadiene-3,5-dione, and dibenzylidene acetone.

By adding an ultraviolet light absorber, the amount of an acid or base formed from the component (C) can be made gradually smaller as the depth from the surface of an exposed portion of the refractive index changing composition of the present invention increases, which is useful as means of forming GRIN. The amount of the ultraviolet light absorber is preferably 30 parts or less by weight, more preferably 20 parts or less by weight based on 100 parts by weight of the total of the components (A) and (B).

The above sensitizeris, for example, a coumarin having a substituent at the 3-position and/or 7-position, flavone, dibenzalacetone, dibenzalcyclohexane, chalcone, xanthene, thioxanthene, porphyrin, phthalocyanine, acridine or anthracene.

The amount of the sensitizer is preferably 30 parts or less by weight, more preferably 20 parts or less by weight based on 100 parts by weight of the total of the components god (A) and (B).

The above surfactant may be added to improve coatability, for example, prevent striation or improve developability.

Examples of the surfactant include nonionic surfactants such as polyoxyethylene alkyl ethers including polyoxyethylene lauryl ether, polyoxyethylene stearyl ether and polyoxyethylene oleyl ether; polyoxyethylene aryl ethers including polyoxyethylene octylphenyl ether and polyoxyethylene nonylphenyl ether; and polyethylene glycol dialkyl esters including polyethylene glycol dilaurate and polyethylene glycol distearate; fluorinated surfactants such as F Top EF301, EF303 and EF352 (of Shin Akita Kasei Co., Ltd.), which are available under the Trade Names thereof, Megafac F171, F172 and F173 (of Dainippon Ink and Chemicals, Inc.), Florade FC430 and FC431 (of Sumitomo 3M Limited), and Asahi Guard AG710, Surflon S-382, SC-101, SC-102, SC-103, SC-104, SC-105 and SC-106 (of Asahi Glass Co., Ltd.); other surfactants such as organosiloxane polymer KP341 (of Shin-Etsu Chemical Co., Ltd.) and acrylic or methacrylic acid-based (co)polymer Polyflow No. 57 and No. 95 (of Kyoeisha Kagaku Co., Ltd.), which are available under the Trade Names thereof.

The amount of the surfactant is preferably 2 parts or less by weight, more preferably 1 part or less by weight based on 100 parts by weight of the total of the components (A) and (B).

The above adhesive aid may be added to improve adhesion to a substrate and is preferably a silane coupling agent.

The above heat resistance improving agent is an unsaturated compound such as a polyvalent acrylate.

An antistatic agent, keeping stabilizer, halation inhibitor, anti-foaming agent, pigment and thermal generator may be further added to the refractive index changing material used in the present invention as required.

<Formation of Refractive Index Pattern>

In the present invention, a refractive index pattern can be formed from the above refractive index changing composition as follows, for example.

First, the refractive index changing composition is dissolved or dispersed in a solvent to prepare a composition having a solid content of 5 to 70wt %. The composition may be filtered with a filter having a pore diameter of about 0.1 to 10 μm as required before use.

Thereafter, this composition is applied to the surface of a substrate such as a silicon wafer and prebaked to remove the solvent so as to form a coating film of the refractive index changing composition. The parts of formed coating film is then exposed to radiation through a pattern mask and heated to make a refractive index difference between exposed and unexposed portions of the refractive index changing composition.

An acid or base is formed from the radiation sensitive decomposer (C) by the above exposure to act on the component (A) to decompose it. This decomposed product dissipates at the time of heating after exposure. As a result, there exists a difference in refractive index between exposed and unexposed portions.

At the time of heating, the residual components (A) and (D) which did not react with an acid or base react with each other to stabilize the formed refractive index pattern.

The solvent used to prepare a solution containing the refractive index changing composition used in the present invention uniformly dissolves the above components (A), (B), (C), (D) and other optionally added additives and does not react with these components.

Examples of the solvent include alcohols such as methanol, ethanol, propanol, iso-propanol, butanol, ethylene glycol and propylene glycol; ethers such as tetrahydrofuran; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether and diethylene glycol ethyl methyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate; and fluorine atom-containing solvents such as trifluoromethyl benzene, 1,3-bis(trifluoromethyl) benzene, hexafluorobenzene, hexafluorocyclohexane, perfluorodimethyl cyclohexane, perfluoromethyl cyclohexane, octafluorodecalin and 1,1,2-trichloro-1,2,2-trifluoroethane.

Out of these solvents, alcohols, glycol ethers, ethylene glycol alkyl ether acetates, propylene glycol alkyl ether acetates, ketones, esters and diethylene glycols are preferred from the viewpoints of solubility, reactivity with each component and ease of forming a coating film.

Further, a high-boiling solvent may be used in combination with the above solvent. Examples of the high-boiling solvent include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

The refractive index changing composition used in the present invention is formed into various shapes in consideration of application purpose before exposure to radiation. For example, it is formed like a rod, fiber, long plate, sphere, film or lens and the present invention is not limited to these. A commonly used method may be used to form the refractive index changing composition of the present invention. For example, injection molding, compression molding, blow molding, extrusion, in-case frame polymerization, shaving, drawing, heating/cooling, CVD deposition, sintering or scanning is employed. Spin coating, slitting, bar coating, solvent casting, LB, spraying, roll coating, relief-printing or screen printing may also be used according to the application purpose of an optically molded product.

In this molding process, heating (to be referred to as "prebaking" hereinafter) is preferably carried out. The heating condition which changes according to the composition of the material of the present invention and the type of each additive is preferably 30 to 200° C., more preferably 40 to 150° C. A hot plate or oven, or infrared radiation may be used for heating.

The radiation used for exposure is an i-ray having a wavelength of 365 nm, h-ray having a wavelength of 404 nm, g-ray having a wavelength of 436 nm, ultraviolet ray from a wide-range wavelength light source such as a xenon lamp, far ultraviolet ray such as KrF excimer laser beam having a wavelength of 248 nm or ArF excimer laser beam having a wavelength of 193 nm, X-ray such as synchrotron radiation, charged corpuscular beam such as electron beam, visible ray or a mixture thereof. Out of these, ultraviolet radiation and visible radiation are preferred. The illuminance which depends on the wavelength of the radiation is preferably 0.1 to 100 mW/cm$^2$ because the highest reaction efficiency is obtained. The irradiation of the radiation through a pattern mask makes possible the patterning of the radiation sensitive refractive index changing material. As for patterning accuracy which is affected by a light source used, an optical part having a refractive index variation distribution with a resolution of about 0.2 μm can be produced.

In the present invention, heating (to be referred to as "post-exposure baking (PEB)") is preferably carried out after exposure. A similar device to the above prebaking device may be used for PEB and PEB conditions may be arbitrary. The heating temperature is preferably 30 to 150° C., more preferably 30 to 130° C. Heating for stabilization is preferably carried out continuously after PEB or separately from PEB to react the residual components (A) and (D). The heating temperature for stabilization is preferably 35 to 200° C., more preferably a temperature 10° C. or more higher than the PEB temperature, much more preferably a temperature 20° C. or more higher than the PEB temperature.

Further, re-exposure may be carried out to decompose the residual component (C) existent in the unexposed portion and further improve the stability of the material.

The re-exposure may be carried out by irradiating radiation having the same wavelength as the radiation used to change the refractive index onto the entire surface of the pattern in the same amount.

Optionally, the stability of the material can be further improved by heating. A similar device to the prebaking device used at the time of molding the material may be used for heating and the heating conditions may be arbitrary.

According to the present invention, the refractive index pattern forming method of the present invention may also be carried out by irradiating a refractive index changing composition comprising the above components (A), (B) and (C) with radiation through a pattern mask and treating it with a stabilizer (D).

The treatment with the stabilizer (D) is preferably carried out after post-exposure baking.

The stabilizer (D) has the function of stabilizing the residual decomposable compound (A) contained in the refractive index changing material after exposure to provide stability to an acid or base. This stabilization prevents a change in refractive index and hence the deterioration of a refractive index pattern formed by the method of the present invention even when it is used under the condition that light having a wavelength close to the wavelength used to change the refractive index passes therethrough.

A low-boiling compound such as ammonia or triethylamine may be used as the stabilizer (D) besides the above examples.

For contact between the refractive index changing composition after exposure to radiation and the stabilizer (D) for stabilization, a suitable method may be employed. For instance, the component (D) and optionally a catalyst are dissolved in a suitable solvent to be contacted to the refractive index changing composition as a solution. Alternatively, when the component (D) is liquid or gas under contact conditions, it may be 100% directly contacted to the refractive index changing composition.

When a solvent is used in the reaction between the above stabilizer (D) and the component (A), the solvent preferably dissolves the component (D) and an optionally added catalyst and does not dissolve the component (A). If the above solvent is selected, the surface of the obtained refractive index pattern will not be roughened.

Examples of the solvent include water; alcohols such as methanol, ethanol, iso-propanol, n-propanol, n-butanol, iso-butanol, tert-butanol, cyclohexanol, ethylene glycol, propylene glycol and diethylene glycol; ethers such as diethyl ether and tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol monoalkyl ethers such as propylene glycol methyl ether and propylene glycol ethyl ether; propylene glycol alkyl ether acetates such as propylene glycol methyl ether acetate and propylene glycol ethyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; aliphatic hydrocarbons such as n-hexane, n-heptane and n-octane; ketones such as methyl ethyl ketone, cyclohexanone, methyl isobutyl ketone, methylamyl ketone and 4-hydroxy-4-methyl-2-pentanone; esters such as ethyl acetate, propyl acetate, butyl acetate, ethyl 2-hydroxypropionate, methyl 2-hydroxy-2-methylpropionate, ethyl hydroxyacetate, butyl hydroxyacetate, ethyl lactate, propyl lactate, butyl lactate, methyl 3-hydroxypropionate, methyl 2-hydroxy-3-methylbutanoate, ethyl methoxyacetate, butyl methoxyacetate, ethyl 2-methoxypropionate, butyl 2-methoxypropionate, butyl 2-ethoxypropionate, butyl 2-butoxypropionate, butyl 3-methoxypropionate, butyl 3-ethoxypropionate, butyl 3-propoxypropionate and butyl 3-butoxypropionate; and fluorine atom-containing solvents such as trifluoromethylbenzene, 1,3-bis(trifluoromethyl) benzene, hexafluorobenzene, hexafluorocyclohexane, perfluorodimethylcyclohexane, perfluoromethylcyclohexane, octafluorodecalin and 1,1,2-trichloro-1,2,2-trifluoroethane.

Out of these solvents, water, alcohols, glycol ethers, ethylene glycol alkyl ether acetates and fluorine atom-containing solvents are preferred.

The reaction temperature for carrying out a reaction between the stabilizer (D) and the residual decomposable compound (A) is generally 0 to 130° C., and the reaction time is generally 10 seconds to 1 hour.

Further, re-exposure may be carried out to decompose the residual component (C) existent in the unexposed portion and further improve the stability of the material.

As for what is not described of the refractive index pattern forming method including the above stabilization, it should be understood that the above description of the refractive index pattern forming method is applied directly or with modifications obvious to people having ordinary skill in the art.

Further, according to the present invention, the refractive index pattern forming method of the present invention may also be carried out by irradiating the refractive index changing composition comprising the above components (A), (B) and (C) with radiation through a pattern and heating to decompose the decomposable compound (A) of an unexposed portion.

The above heating is preferably carried out at a temperature 10° C. or more higher than the PEB temperature, for example, preferably 170° C. or more, more preferably 200° C. or more.

By the above heating, the residual decomposable compound (A) existent in the unexposed portion is removed by decomposition or sublimation and preferably does not form pores substantially.

As for what is not described of the above refractive index pattern forming method when the component (D) is not contained, it should be understood that related items out of the above description of the pattern forming method are applied directly or with modifications obvious to people having ordinary skill in the art.

In the refractive index pattern of the present invention formed by any one of the above various methods, the refractive index of an exposed portion (first region) is preferably smaller than that of an unexposed portion (second region). This difference can be adjusted to a desired value by controlling the types and contents of the components (A) and (B) contained in the refractive index changing composition used in the present invention. For example, the largest value of refractive index difference can be set to a value larger than 0.02.

The refractive index pattern of the present invention has pores or do not have any pores in the exposed portion.

When the exposed portion has pores, the porosity is preferably 10 to 99.9%, more preferably 15 to 99.9%, particularly preferably 20 to 99.9%.

The elastic moduli of the exposed portion and unexposed portion are preferably 0.3 GPa or more and 1 GPa or more, more preferably 0.5 GPa or more and 3 GPa or more, respectively.

The elastic modulus of the exposed portion is preferably smaller than that of the unexposed portion.

Since the refractive index pattern of the present invention does not deteriorate without a change in refractive index even when it is used under the condition that light having a wavelength close to the wavelength used to change the refractive index passes therethrough as described above, it is extremely useful as an optical material for use in the optoelectronic and display fields.

As the refractive index pattern of the present invention has a sufficiently large refractive index difference and the formed refractive index difference is stable to light and heat, it is extremely useful as an optical material for use in the optoelectronic and display fields. The refractive index pattern of the present invention may be used in optical parts such as other photoarrays, lenses, photocouplers, photointerruptors, polarization beam splitters, holograms, single-mode and multi-mode optical fibers, bundle fibers, light guides, single-core, multi-core and photoelectric coupling optical connectors, optical isolators, polarizers, optical sensors such as photodiodes, phototransistors, photo-ICs, CCD image sensors, CMOS image sensors, optical fiber sensors and optical fiber gyros, optical disks such as CD, LD, PD and DVD, optical switches, waveguides, optical touch panels, diffraction gratings, optical guide plates, optical diffusers, anti-reflectors and optical sealers.

<Method of Producing Optical Parts>

The photosensitive refractive index changing composition is formed into various shapes in consideration of application purpose before exposure to radiation.

For example, it is formed like a rod, fiber, long plate, sphere, film or lens and the present invention is not limited to these. A commonly used method may be used to form the refractive index changing composition, as exemplified by injection molding, compression molding, blow molding, extrusion, in-case frame polymerization, shaving, drawing, heating/cooling, CVD deposition, sintering or scanning. Spin coating, slitting, bar coating, solvent casting, LB, spraying, roll coating, relief-printing or screen printing may also be used according to the application purpose of an optically molded product.

The Light used for exposure is an i-ray having a wavelength of 365 nm, h-ray having a wavelength of 404 nm, g-ray having a wavelength of 436 nm, ultraviolet ray from a wide-range wavelength light source such as a xenon lamp, far ultraviolet ray such as KrF excimer laser beam having a wavelength of 248 nm or ArF excimer laser beam having a wavelength of 193 nm, X-ray such as synchrotron radiation, charged corpuscular beam such as electron beam, visible a radiation or a mixture thereof. Out of these, ultraviolet radiation and visible radiation are preferred. The illuminance which depends on the wavelength of the radiation is preferably 0.1 to 100 mW/cm$^2$ because the highest reaction efficiency is obtained. The irradiation of the radiation through a pattern mask makes possible the patterning of the radiation sensitive refractive index changing material. As for patterning accuracy which is affected by a light source used, an optical part having a refractive index variation distribution with a resolution of about 0.2 $\mu$m can be produced.

In the present invention, heating (to be referred to as "post-exposure baking (PEB)" hereinafter) is preferably carried out after exposure. The heating condition which changes according to the composition of the material of the present invention and the type of each additive is preferably 30 to 200° C., more preferably 40 to 150° C. A hot plate or oven, or infrared radiation may be used for heating.

The difference between the maximum refractive index and the minimum refractive index in the refractive index distribution of an optical part of the present invention can be set to a desired value according to application purpose as described above. It can be set to 0.02 or more, optionally 0.03 or more, 0.05 or more, or 0.08 or more.

As specific examples, the methods of forming an optical fiber, lens, optical waveguide, diffraction grating, hologram element and recording medium will be described in detail.

<Method of Forming an Optical Fiber>

An optical fiber may be formed by a suitable method, for example, the following method.

A photosensitive refractive index changing composition for forming an optical fiber may be dissolved in a suitable solvent before use. The solvent used may be a solvent having a boiling point of 50 to 200° C. and the solid content of the obtained solution may be 50 to 80%. This solution is used as a fiber stock solution, defoamed, stretched by heating, exposed to a laser beam and extruded to form a fiber. The pore diameter may be 0.1 to 1.0 mm and the stretching speed may be 0.1 to 1,000 m/min.

The fiber formed as described above is then exposed to light uniformly from therearound toward the center using a ring light source together with an optical fiber or reflector and post exposured baked to form the optical fiber of the present invention. The PEB temperature may be 50 to 200° C. and the baking time may be 1 second to 30 minutes. A suitable heating source such as an infrared lamp may be used as the heating source.

An GI type optical fiber having such a distribution that refractive index decreases in a parabolic manner from the center axis to the periphery can be formed by adjusting the amount of exposure, selecting a wavelength and using an ultraviolet light absorber.

The above fiber stretching device, exposure device and heating device may be arranged side by side. Thereby, an GI type optical fiber can be produced continuously.

<Method of Forming a Lens>

The lens of the present invention may be formed by a suitable method, for example, the following method.

(1) Method of Forming a GRIN Lens having Concave Lens Power

A photosensitive refractive index changing composition used for the formation of a lens can be dissolved in a suitable solvent before use. The solvent used may be a solvent having a boiling point of 50 to 200° C. and the solid content of the obtained solution may be 50 to 80%. This solution is formed into a disk having a desired shape by hot pressing or the like.

Thereafter, the disk is exposed to light in such a manner that the amount of exposure is large at the center portion of the disk and decreases toward the periphery of the disk and then post exposured baked to form a GRIN lens having concave lens power. The exposure device is such as shown in FIG. 1. The diaphragm 2 which can be opened or closed is installed in front of a disk sample 1 of the exposure device of FIG. 1, only parallel rays from the above light source are irradiated onto the sample by gradually opening the closed diaphragm 2, and the shutter speed is adjusted such that the diaphragm 2 is fully opened in 1 second to 5 minutes to achieve the above exposure state.

The post exposured baking conditions include a temperature of 50 to 200° C. and a time of 1 second to 30 minutes.

(2) Method of Forming a GRIN Lens Having Convex Lens Power

A similar disk sample to that described above (1) is exposed to light in such a manner that the amount of exposure is large at the periphery of the disk and decreases toward the center of the disk and then post exposured baked to form a GRIN lens having convex lens power.

This exposure state can be obtained by inputting light uniformly from the side only while the top and bottom portions of the cylinder are shielded from light. An optical fiber or reflector may be used for uniform exposure from the side.

The same PEB conditions as (1) above may be employed.

<Method of Forming an Optical Waveguide>

The optical waveguide of the present invention may be formed by a suitable method, for example, the following method.

A photosensitive refractive index changing composition for forming an optical waveguide may be dissolved in a suitable solvent before use (solution A). The solvent used may be a solvent having a boiling point of 50 to 200° C. and the solid content of the obtained solution may be 20 to 60%.

Separately from this solution, a composition solution comprising the component (B) and a thermal acid generator and/or a photo acid generator is prepared (solution B). The solid content of this solution may be 20 to 60% and a solvent having a boiling point of 50 to 200° C. may be used.

The solution B is first applied to a suitable substrate such as a silicon substrate or glass substrate and then the solvent is removed to form a coating film as thick as 1 to 50 $\mu$m. This coating film serves as a lower clad layer. Spin coating or slit coating may be employed to apply the solution B and heating may be carried out at 50 to 150° C. for 1 to 30 minutes to remove the solvent.

Thereafter, the solution A is applied to the lower clad layer formed as described above and then the solvent is removed to form an intermediate layer as thick as 1 to 50 μm. The coating method and the removal of the solvent may be the same as described above.

Subsequently, the intermediate layer is exposed to light through a photomask for shielding the core portion of a waveguide pattern from light and post exposured baked. The unexposed portion serves as a core portion and the exposed portion serves as a side clad layer. The post exposured baking conditions include a temperature of 50 to 200° C. and a time of 1 second to 30 minutes.

The solution B is applied to the above intermediate layer again and then the solvent is removed to form an upper clad layer as thick as 1 to 50 μm, thereby making it possible to form an optical waveguide. Since the obtained optical waveguide contains the thermal acid generator in the upper and lower clad layers, an acid slightly formed is diffused at the interfaces between the core layer and the lower clad layer and between the core layer and the upper clad layer. Thereby, the interfaces between the core layer and the clad layers can take such a structure that the refractive index changes gradually in the upper, side and lower portions with the result that a GI type optical waveguide is obtained.

<Method of Forming a Recording Medium>

The recording medium of the present invention may be formed by a suitable method, for example, the following method.

A photosensitive refractive index changing composition for forming a recording medium may be dissolved in a suitable solvent before use. The solvent used may be a solvent having a boiling point of 50 to 200° C., and the solid content of the obtained solution may be 5 to 50%.

This solution is applied to a flat plastic substrate having a metal film such as an aluminum film having a thickness of about 60 nm and then the solvent is removed to form a coating film as thick as 0.1 to 10 μm. Spin coating or slit coating may be used to apply the solution, and the solvent can be removed by heating at 50 to 150° C. for 1 to 30 minutes.

Thereafter, this coating film is exposed to light through a photomask having a track pick of 1.6 μm at a pitch width of 0.2 to 0.5 μm and post exposured baked to form an optical recording medium. The post exposured baking conditions include a temperature of 50 to 200° C. and a time of 1 second to 30 minutes.

<Method of Forming a Diffraction Grating>

The diffraction grating of the present invention may be formed by a suitable method, for example, the following method.

A photosensitive refractive index changing composition for forming a diffraction grating may be dissolved in a suitable solvent before use. The solvent used may be a solvent having a boiling point of 50 to 200° C., and the solid content of the obtained solution may be 20 to 60%.

This solution is applied to the surface of a suitable substrate such as a glass substrate and then the solvent is removed to form a thin coating film as thick as 1 to 50 μm. Spin coating or slit coating may be used to apply the solution, and the solvent can be removed by heating at 50 to 150° C. for 1 to 30 minutes.

This coating film is exposed to light in a slit form and post exposured baked to form a diffraction grating. To irradiate slit-form light, for example, the method shown in FIG. 2 may be employed. FIG. 2 shows that parallel rays reflected by a reflector placed obliquely are irradiated onto a coating film. The coating film is exposed to an interference pattern formed by direct rays and reflected rays. The sample is moved in a direction shown by an arrow in the figure at a speed of 0.1 to 100 μm/min while it is illuminated to form a diffraction grating having a desired cycle of 0.3 μm or more. A fine refractive index distribution can be provided by this method.

Another method of irradiating slit-form light is to irradiate the coating film formed as described above with a plurality of radial rays from different directions for interference or to irradiate light through slits. In either method, a diffraction grating having a desired cycle can be formed by changing the input angle of light or the angle of a mirror.

The above post exposured baking conditions include a temperature of 50 to 200° C. and a time of 1 second to 30 minutes.

<Method of Forming a Hologram Element>

The hologram element of the present invention may be formed by a suitable method, for example, the following method.

A photosensitive refractive index changing composition for forming a hologram element may be dissolved in a suitable solvent before use. The solvent used may be a solvent having a boiling point of 50 to 200° C. and the solid content of the obtained solution may be 20 to 60%.

This solution is applied to a suitable substrate such as a glass substrate and then the solvent is removed to form a thin film as thick as 1 to 50 μm. Spin coating or slit coating may be employed to apply the solution. The solvent can be removed by heating at 50 to 150° C. for 1 to 30 minutes.

This coating is irradiated with an interference pattern and post exposured baked to form a recording medium (hologram) for holography. That is, signal light passing through a substance to be recorded and reference light directly obtained from the same light source are interfered with each other and irradiated onto the coating film to change the refractive index, thereby making it possible to record an image of the substance on the coating film.

The above post exposured baking conditions include a temperature of 50 to 200° C. and a time of 1 second to 30 minutes.

EXAMPLES

The following examples are provided for the purpose of further illustrating the present invention but are in no way to be taken as limiting.

The weight average molecular weight in terms of polystyrene of a polymer was measured using the GPC CHROMATOGRAPH SYSTEM-21 of Showa Denko K.K.

Synthesis Examples of Component (A)

Synthesis Example 1

50 parts by weight of o-phthalaldehyde as a monomer and 500 parts by weight of tetrahydrofuran were fed to a 1-liter flask whose inside had been substituted with nitrogen and cooled to −78° C. 1.0 part by weight of an n-hexane solution of n-butyl lithium (1.5 mols/l) was added to this flask and stirred under cooling at −78° C. for 48 hours in a nitrogen atmosphere.

0.8 part by weight of acetic anhydride and 0.6 part by weight of pyridine were added to the obtained reaction solution under cooling and stirred at −78° C. for 2 hours. The reaction solution was concentrated to 100 ml by heating at 60° C. under reduced pressure and injected into 5 liters of ion exchange water in 10 minutes. The precipitate was re-dissolved in 50 parts by weight of tetrahydrofuran, purified by re-precipitation with 5 liters of ion exchange water and vacuum dried at 50° C. to obtain 45 parts by weight of a compound (A-1). The weight average molecular weight of the obtained compound was 26,000.

Synthesis Example 2

45 parts by weight of o-phthalaldehyde, 5 parts by weight of benzaldehyde as a monomer and 500 parts by weight of tetrahydrofuran were fed to a 1-liter flask whose inside had been substituted with nitrogen and cooled to −78° C. 1.0 part by weight of an n-hexane solution of n-butyl lithium (1.5 mols/l) was added to this flask and stirred under cooling at −78° C. for 48 hours in a nitrogen atmosphere.

0.8 part by weight of acetic anhydride and 0.6 part by weight of pyridine were added to the obtained reaction solution under cooling and stirred at −78° C. for 2 hours. The whole reaction solution was concentrated to 100 ml by heating at 60° C. under reduced pressure and continuously injected into 5 liters of ion exchange water in 10 minutes. The precipitate was re-dissolved in 50 parts by weight of tetrahydrofuran, purified by re-precipitation with 5 liters of ion exchange water and vacuum dried at 50° C. to obtain 43 parts by weight of a compound (A-2). The weight average molecular weight of the obtained compound was 15,000.

Synthesis Example 3

45 parts by weight of o-phthalaldehyde and 5 parts by weight of glutaraldehyde as monomers, and 500 parts by weight of tetrahydrofuran were fed to a 1-liter flask whose inside had been substituted with nitrogen and cooled to −78° C. 1.0 part by weight of an n-hexane solution of n-butyl lithium (1.5 mols/l) was added to this flask and stirred under cooling at −78° C. for 48 hours in a nitrogen atmosphere.

0.8 part by weight of acetic anhydride and 0.6 part by weight of pyridine were added to the obtained reaction solution under cooling and stirred at −78° C. for 2 hours. The whole reaction solution was concentrated to 100 ml by heating at 60° C. under reduced pressure and continuously injected into 5 liters of ion exchange water in 10 minutes. The precipitate was re-dissolved in 50 parts by weight of tetrahydrofuran, purified by re-precipitation with 5 liters of ion exchange water and vacuum dried at 50° C. to obtain 45 parts by weight of a compound (A-3). The weight average molecular weight of the obtained compound was 20,000.

Synthesis Example 4

25 parts by weight of 4-chloro-o-phthalaldehyde as a monomer and 500 parts by weight of methylene chloride were fed to a 1-liter flask whose inside had been substituted with nitrogen and cooled to −78° C. 0.1 part by weight of a boron trifluoride ether complex was added to this flask and stirred under cooling at −78° C. for 48 hours in a nitrogen atmosphere.

0.8 part by weight of acetic anhydride and 0.6 part by weight of pyridine were added to the obtained reaction solution under cooling and stirred at −78° C. for 2 hours. The whole reaction solution was concentrated to 50 ml by heating at 60° C. under reduced pressure and continuously injected into 3 liters of ion exchange water in 5 minutes. The precipitate was re-dissolved in 30 parts by weight of tetrahydrofuran, purified by re-precipitation with 3 liters of ion exchange water and vacuum dried at 50° C. to obtain 46 parts by weight of a compound (A-4). The weight average molecular weight of the obtained compound was 48,000.

Synthesis Example 5

25 parts by weight of 4-bromo-o-phthalaldehyde as a monomer and 500 parts by weight of methylene chloride were fed to a 1-liter flask whose inside had been substituted with nitrogen and cooled to −78° C. 0.1 part by weight of a boron trifluoride ether complex was added to this flask and stirred under cooling at −78° C. for 48 hours in a nitrogen atmosphere.

0.8 part by weight of acetic anhydride and 0.6 part by weight of pyridine were added to the obtained reaction solution under cooling and stirred at −78° C. for 2 hours. The whole reaction solution was concentrated to 50 ml by heating at 60° C. under reduced pressure and continuously injected into 3 liters of ion exchange water in 5 minutes. The precipitate was re-dissolved in 30 parts by weight of tetrahydrofuran, purified by re-precipitation with 3 liters of ion exchange water and vacuum dried at 50° C. to obtain 47 parts by weight of a compound (A-5). The weight average molecular weight of the obtained compound was 53,000.

Synthesis Example 6

50 parts by weight of o-phthalaldehyde as a monomer and 500 parts by weight of tetrahydrofuran were fed to a 1-liter flask whose inside had been substituted with nitrogen and cooled to −78° C. 0.2 part by weight of an n-hexane solution of n-butyl lithium (1.5 mols/l) was added to this flask and stirred under cooling at −78° C. for 48 hours in a nitrogen atmosphere.

0.8 part by weight of acetic anhydride and 0.6 part by weight of pyridine were added to the obtained reaction solution under cooling and stirred at −78° C. for 2 hours. The whole reaction solution was concentrated to 100 ml by heating at 60° C. under reduced pressure and continuously injected into 5 liters of ion exchange water in 10 minutes. The precipitate was re-dissolved in 50 parts by weight of tetrahydrofuran, purified by re-precipitation with 5 liters of ion exchange water and vacuum dried at 50° C. to obtain 45 g of a compound (A-6). The weight average molecular weight of the obtained compound was 110,000.

Synthesis Example 7

33.05 g of 1,4-benzenethiol and 66.06 g of 1,4-di(2-nitrovinyl)benzene were dissolved in 100 g of N-methylpyrrolidone in a 500-ml three-necked flask in an argon atmosphere. A solution obtained by dissolving 1.55 g of N-methylmorpholine in 10 g of N-methylpyrrolidone was injected into the above solution under cooling with ice and agitation in 1 hour. After the end of injection, the reaction solution was left at room temperature to carry out polymerization for 24 hours. After the end of polymerization, the resultant polymer was purified by carrying on re-precipitation twice with tetrahydrofuran-methanol.

The precipitated polymer was separated by filtration and vacuum dried at 50° C. to obtain 72.80 g of a compound (A-7). The weight average molecular weight of the obtained compound was 5,800.

Synthesis Example 8

49.84 g of terephthalic acid chloride was dissolved in 150 ml of chloroform in a 500-ml three-necked flask in an argon atmosphere. A solution obtained by dissolving 33.05 g of 1,4-benzenethiol and 16.83 g of potassium hydroxide in 150 ml of ion exchange water was added to the above solution and stirred to carry out interfacial polycondensation. After 6 hours of the reaction, the resutant polymer was purified by carrying on re-precipitation twice with tetrahydrofuran-methanol.

The precipitated polymer was separated by filtration and vacuum dried at 50° C. to obtain 61.28 g of a compound (A-8). The weight average molecular weight of the obtained compound was 27,600.

Synthesis Example 9

33.05 g of 1,4-benzenethiol, 48.04 g of p-phenylene diisocyanate and 0.12 g of dibutyltin dichloride as a catalyst were dissolved in 200 g of dimethyl sulfoxide in a 500-ml three-necked flask in an argon atmosphere. After the end of injection, the reaction solution was heated at 60° C. to carry out polymerization for 24 hours. After the end of polymerization, the resultant polymer was purified by carrying on re-precipitation twice with tetrahydrofuran-methanol. The precipitated polymer was separated by filtration and vacuum dried at 50° C. to obtain 66.50 g of a compound (A-9). The weight average molecular weight of the obtained compound was 15,000.

Synthesis Example 10

92.42 g of 4-nitro-1,3-phenylene dichloroformate was dissolved in 400 ml of chloroform in a 1-liter three-necked flask in an argon atmosphere. A solution obtained by dissolving 33.05 g of 1,4-benzenethiol and 16.83 g of potassium hydroxide in 200 ml of ion exchange water was added to the above solution and stirred to carry out interfacial polycondensation. After 6 hours of the reaction, the resultant polymer was purified by carrying on re-precipitation twice with tetrahydrofuran-methanol.

The precipitated polymer was separated by filtration and vacuum dried at 50° C. to obtain 83.61 g of a compound (A-10). The weight average molecular weight of the obtained compound was 32,000.

Synthesis Example 11

49.84 g of terephthalic acid and 57.34 g of phenylmethyl dichlorosilane were dissolved in 200 g of N-methylpyrrolidone in a 500-ml three-necked flask in an argon atmosphere. A solution obtained by dissolving 23.73 g of pyridine in 50 g of N-methylpyrrolidone was injected into the above solution under agitation and cooling with ice in 1 hour. After the end of injection, the reaction solution was heated at 60° C. to carry out polymerization for 24 hours. After the end of polymerization, the reaction solution was poured into 2 liters of methanol for precipitation and the precipitate was re-dissolved in 200 ml of N-methylpyrrolidone and injected into 2 liters of methanol to carry out purification by re-precipitation.

The precipitated polymer was separated by filtration and vacuum dried at 50° C. to obtain 70.80 g of a compound (A-11). The weight average molecular weight of the obtained compound was 26,000.

Synthesis Example 12

45.66 g of benzaldehyde dimethyl acetal and 42.04 g of methoxyhydroquinone were dissolved in 100 g of diethylene glycol ethyl methyl ether in a 500-ml three-necked flask in an argon atmosphere. A solution obtained by dissolving 0.06 g of p-toluenesulfonic acid in 10 g of diethylene glycol ethyl methyl ether was added to the above solution and stirred to carry out polymerization at 100° C. for 8 hours and then at 130° C. for 1 hour. The polymerization was carried out while methanol formed by the reaction was distilled off under reduced pressure.

After the end of polymerization, the reaction solution was poured into 2 liters of methanol for precipitation and the precipitate was re-dissolved in 100 ml of diethylene glycol ethyl methyl ether and injected into 2 liters of methanol to carry out purification by re-precipitation. The precipitated polymer was separated by filtration and vacuum dried at 50° C. to obtain 47.93 g of a compound (A-12). The weight average molecular weight of the obtained compound was 5,800.

Synthesis Example 13

49.84 g of terephthalic acid and 57.34 g of phenylmethyl dichlorosilane were dissolved in 200 g of N-methylpyrrolidone in a 500-ml three-necked flask in an argon atmosphere. A solution obtained by dissolving 47.46 g of pyridine in 50 g of N-methylpyrrolidone was injected into the above solution under agitation and cooling with ice in 1 hour. After the end of injection, the reaction solution was heated at 60° C. to carry out polymerization for 24 hours. After the end of polymerization, the reaction solution was poured into 2 liters of methanol for precipitation and the precipitate was re-dissolved in 200 ml of N-methylpyrrolidone and injected into 2 liters of methanol to carry out purification by re-precipitation.

The precipitated polymer was separated by filtration and vacuum dried at 50° C. to obtain 80.01 g of a compound (A-13). The weight average molecular weight of the obtained compound was 31,200.

Synthesis Example 14

61.51 g of terephthalic acid chloride was dissolved in 150 ml of chloroform in a 500-ml three-necked flask in an argon atmosphere. A solution obtained by dissolving 33.05 g of 1,4-benzenethiol and 33.66 g of potassium hydroxide in 150 ml of ion exchange water was added to the above solution and stirred to carry out interfacial polycondensation. After 6 hours of the reaction, the resultant polymer was purified by carrying on re-precipitation twice with tetrahydrofuran-methanol.

The precipitated polymer was separated by filtration and vacuum dried at 50° C. to obtain 75.98 g of a compound (A-14). The weight average molecular weight of the obtained compound was 33,600.

Synthesis Example 15

50 g of o-phthalaldehyde as a monomer and 500 g of tetrahydrofuran were fed to a 1-liter flask whose inside had been substituted with nitrogen and cooled to −78° C. 41.83 g of tert-butoxy potassium was added to the above solution and stirred under cooling at −78° C. for 48 hours in a nitrogen atmosphere.

45.67 g of acetic anhydride and 35.38 g of pyridine were added to the obtained reaction solution under cooling and stirred at −78° C. for 2 hours. The reaction solution was concentrated to 100 ml by heating at 60° C., dissolved in 1 liter of ethyl acetate, washed with ion exchange water three times, and vacuum dried at 50° C. after the concentration of ethyl acetate to obtain 45 g of a compound (A-15). The initiator/monomer ratio of the obtained compound (A-15) was 1:1 based on the integral ratio of protons derived from 1.2 to 1.3 ppm of a tert-butyl group and protons derived from 7.2 to 7.7 ppm of an aromatic group measured by $^1$H-NMR.

Synthesis Example 16

49.84 g of terephthalic acid chloride was dissolved in 150 ml of chloroform in a 500-ml three-necked flask in an argon atmosphere. A solution obtained by dissolving 33.05 g of 1,4-benzenethiol and 16.83 g of potassium hydroxide in 150 ml of ion exchange water was added to the above solution and stirred to carry out interfacial polycondensation. After 4 hours of the reaction, the resultant polymer was purified by carrying on re-precipitation twice with tetrahydrofuran-methanol.

The precipitated compound was separated by filtration and vacuum dried at 50° C. to obtain 56.55 g of a compound (A-16). The weight average molecular weight of the obtained compound was 7,600.

Synthesis Examples of Component (B)

Synthesis Example 1

15.22 g of tetramethoxysilane and 27.24 g of methyltrimethoxysilane were dissolved in 100 g of ethylene glycol ethyl methyl ether in a 1-liter three-necked flask and the obtained mixed solution was heated at 60° C. under stirring by a magnetic stirrer. 5.20 g of ion exchange water was continuously added to the mixed solution in 1 hour. After 4 hours of a reaction at 60° C., the obtained reaction solution was cooled to room temperature. Thereafter, 9.20 g of methanol which was a reaction by-product was distilled off under reduced pressure from the reaction solution. The solid content of the solution of the obtained polymer (B-1) was 33.2% and the weight average molecular weight of the polymer was 2,200.

Synthesis Example 2

After the inside of a 1.5-liter stainless steel autoclave equipped with an electro magnetic stirrer was fully substituted by nitrogen gas, 500 g of ethyl acetate, 57.2 g of ethylvinyl ether (EVE), 10.2 g of hydroxybutyl vinyl ether (HBVE) and 3 g of lauroyl peroxide were fed to the autoclave and cooled to −50° C. with dry ice and methanol, and the oxygen of the system was removed with nitrogen gas again. 146 g of hexafluoropropylene (HFP) was then fed and the temperature began to be elevated. The pressure when the inside temperature of the autoclave reached 60° C. was 5.3 kgf/cm². Thereafter, the reaction was continued at 60° C. for 20 hours under agitation and the autoclave was cooled with water when the pressure dropped to 1.5 kgf/cm² to stop the reaction. After the temperature reached room temperature, unreacted monomers were discharged and the autoclave was opened to obtain a polymer solution having a solid content of 28.1%. The obtained polymer solution was injected into methanol to precipitate a polymer which was then washed with methanol and vacuum dried at 50° C. to obtain 193 g of a fluorine-containing copolymer. The weight average molecular weight of the obtained polymer (B-2) was 17,000.

Synthesis Example 3

8 g of 2,2'-azobis(2,4-dimethylvaleronitrile) and 200 g of diethylene glycol dimethyl ether were fed to a 500-ml three-necked flask. Subsequently, 20 g of methacrylic acid, 30 g of glycidyl methacrylate and 50 g of pentafluoroethyl methacrylate were fed to the flask, the inside of the flask was substituted with nitrogen, and stirring was started gently. The temperature of the solution was elevated to 70° C. and maintained at that temperature for 3 hours to obtain a solution of a polymer (B-3). The solid content of the obtained polymer solution was 31.0% and the weight average molecular weight of the polymer was 12,000.

Synthesis Example 4

50 g of methyltrimethoxysilane was fed to a 1-liter three-necked flask and 100 g of 1-ethoxy-2-propanol was added and dissolved in the methyltrimethoxysilane, and the obtained mixed solution was heated at 60° C. under stirring with a magnetic stirrer. 19.85 g of ion exchange water was continuously added to this in 1 hour. A reaction was carried out at 60° C. for 4 hours, and the obtained reaction solution was cooled to room temperature.

Thereafter, methanol which was a reaction by-product was distilled off from the reaction solution under reduced pressure and the reaction solution was concentrated to a solid content of 20 wt % to obtain a solution containing a compound (B-4). The weight average molecular weight of the compound (B-4) was 8,000.

Example 1

40 parts by weight of the compound (A-1) as the component (A), 60 parts by weight of a co-condensate (molecular weight of 2,000) of a mixture of methyltrimethoxysilane and tetramethoxysilane (weight ratio of 55:5) as the component (B) and 1 part by weight of 2-(4-methoxyphenyl)-4,6-bis (trichloromethyl)-s-triazine as the component (C) were dissolved in diethylene glycol ethyl methyl ether to a total solids content of 20 wt %, and the resulting solution was filtered with a membrane filter having a pore diameter of 0.2 μm to prepare a solution containing a photosensitive refractive index changing composition.

<Formation of a Coating Film>

The above solution was applied to a silicon substrate with a spinner and prebaked on a hot plate at 90° C. for 2 minutes to form a 1.0 μm thick coating film.

<Exposure>

The obtained coating film was exposed to 20 mJ/cm² of radiation at the optimum focusing depth with the NSR1505i6A reduction projection exposure device (of Nikon Corporation, NA=0.45, λ=365 nm) to make a refractive index difference between exposed and unexposed portions of the refractive index changing composition. Then, the coating film was applied to post exposured baked on a hot plate at 120° C. for 2 minutes.

<Measurement of Refractive Index>

The refractive indices of exposed and unexposed portions on the silicon substrate at room temperature were measured at 633 nm with the Auto EL IV NIR III ellipsometer (of Rudolf Research Co., Ltd.). The results are shown in Table 1.

<Evaluation of Transparency>

A glass substrate coated with a photosensitive refractive index changing composition was obtained in the same manner as described above except that the Corning 1737 (of Corning Co., Ltd.) glass substrate was used in place of the silicon substrate.

Thereafter, the transmission of the obtained glass substrate was measured at a wavelength of 400 to 800 nm with the 150-20 double beam spectrophotometer (of Hitachi, Ltd.). It can be said that when the minimum transmission exceeds 95%, the transmission is satisfactory and when the minimum transmission is 95% or less, the transmission is unsatisfactory. The results are shown in Table 1.

Example 2

The procedure of Example 1 was repeated except that the amount of exposure was changed to 300 mJ/cm² to evaluate refractive index and transparency. The results are shown in Table 1.

Example 3

Evaluations were carried out in the same manner as in Example 1 except that 70 parts by weight of the compound (A-1) was used as the component (A) and 30 parts by weight of a condensate of methyltrimethoxysilane (molecular weight of 2,000) was used as the component (B). The results are shown in Table 1.

Example 4

Evaluations were carried out in the same manner as in Example 1 except that 15 parts by weight of the compound (A-1) was used as the component (A) and 85 parts by weight of a condensate of methyltrimethoxysilane (molecular weight of 2,000) was used as the component (B). The results are shown in Table 1.

Example 5

Evaluations were carried out in the same manner as in Example 1 except that 40 parts by weight of the compound (A-2) was used as the component (A). The results are shown in Table 1.

Example 6

Evaluations were carried out in the same manner as in Example 1 except that 40 parts by weight of the compound (A-3) was used as the component (A). The results are shown in Table 1.

Example 7

Evaluations were carried out in the same manner as in Example 1 except that 40 parts by weight of the compound (A-4) was used as the component (A). The results are shown in Table 1.

Example 8

Evaluations were carried out in the same manner as in Example 1 except that 40 parts by weight of the compound (A-5) was used as the component (A). The results are shown in Table 1.

Example 9

Evaluations were carried out in the same manner as in Example 1 except that 1 part by weight of 4-phenylthiophenyldiphenylsulfonium trifluoromethanesulfonate was used as the component (C). The results are shown in Table 1.

Example 10

Evaluations were carried out in the same manner as in Example 1 except that 1 part by weight of diphenyliodonium trifluoroacetate was used as the component (C). The results are shown in Table 1.

TABLE 1

| | amount of exposure mJ/cm$^2$ | refractive index | | transparency | |
|---|---|---|---|---|---|
| | | exposed portion | unexposed portion | exposed portion (%) | unexposed portion (%) |
| Ex. 1 | 20 | 1.42 | 1.52 | 99.3 | 99.0 |
| Ex. 2 | 300 | 1.42 | 1.52 | 99.3 | 99.0 |
| Ex. 3 | 20 | 1.42 | 1.55 | 99.5 | 98.6 |
| Ex. 4 | 20 | 1.42 | 1.47 | 99.2 | 99.1 |
| Ex. 5 | 20 | 1.42 | 1.52 | 99.3 | 99.1 |
| Ex. 6 | 20 | 1.42 | 1.51 | 99.3 | 99.2 |
| Ex. 7 | 20 | 1.42 | 1.53 | 99.3 | 99.0 |
| Ex. 8 | 20 | 1.42 | 1.56 | 99.3 | 98.6 |
| Ex. 9 | 20 | 1.42 | 1.52 | 99.3 | 99.0 |
| Ex. 10 | 20 | 1.42 | 1.52 | 99.3 | 99.0 |

Ex.: Example

Example 11

50 parts by weight of the compound (A-7) as the component (A), 50 parts by weight of the polymer (B-1) as the component (B) and 5 parts by weight of 2-benzyl-2-dimethylamino-1-(4-morpholinophenyl)-butan-1-one as the component (C) were dissolved in diethylene glycol ethyl methyl ether to a total solids content of 20% and the resulting solution was filtered with a membrane filter having a pore diameter of 0.2 µm to prepare a composition solution.

The formation of a coating film, the measurement of refractive index and the evaluation of transparency were carried out in the same manner as in Example 1.

<Exposure and PEB>

The obtained coating film was exposed to radiation at the optimum focusing depth with the NSR1505i6A reduction projection exposure device (of Nikon Corporation, NA=0.45, λ=365 nm). PEB was then carried out for 2 minutes to make a refractive index difference between exposed and unexposed portions of the refractive index changing composition. The amount of exposure and PEB temperature are shown in Table 2.

Example 12

Evaluations were carried out in the same manner as in Example 11 except that 50 parts by weight of the compound (A-8) was used as the component (A). The results are shown in Table 2.

Example 13

Evaluations were carried out in the same manner as in Example 11 except that 50 parts by weight of the compound (A-9) was used as the component (A). The results are shown in Table 2.

Example 14

Evaluations were carried out in the same manner as in Example 11 except that 50 parts by weight of the compound (A-10) was used as the component (A). The results are shown in Table 2.

Example 15

Evaluations were carried out in the same manner as in Example 11 except that 50 parts by weight of the compound (B-2) was used as the component (B). The results are shown in Table 2.

Example 16

Evaluations were carried out in the same manner as in Example 11 except that 50 parts by weight of the compound (B-3) was used as the component (B). The results are shown in Table 2.

TABLE 2

|  | amount of exposure (mJ/cm²) | PEB temperature (° C.) | refractive index | | transparency | |
|---|---|---|---|---|---|---|
|  |  |  | exposed portion | unexposed portion | exposed portion (%) | unexposed portion (%) |
| Ex. 1 | 80 | 130 | 1.42 | 1.55 | 99.3 | 99.0 |
| Ex. 2 | 80 | 130 | 1.42 | 1.58 | 98.9 | 98.6 |
| Ex. 3 | 80 | 130 | 1.42 | 1.57 | 99.1 | 98.9 |
| Ex. 4 | 80 | 130 | 1.42 | 1.56 | 99.2 | 99.0 |
| Ex. 5 | 80 | 130 | 1.38 | 1.52 | 99.3 | 99.1 |
| Ex. 6 | 80 | 130 | 1.42 | 1.55 | 99.3 | 99.1 |
| Ex. 7 | 130 | 130 | 1.42 | 1.55 | 99.3 | 99.0 |
| Ex. 8 | 150 | 100 | 1.42 | 1.55 | 99.3 | 99.0 |

Ex.: Example

Example 17

50 parts by weight of the compound (A-11) as the component (A), 50 parts by weight of a solution containing the polymer (B-1) as the component (B) (equivalent to 50 parts by weight (solid content) of the polymer (B-1)) and 1 part by weight of 2-(4-methoxyphenyl)-4,6-bis(trichloromethyl)-s-triazine as the component (C) were dissolved in diethylene glycol ethyl methyl ether to a total solids content of 20% and the resulting solution was filtered with a membrane filter having a pore diameter of 0.2 μm to prepare a solution of a refractive index changing composition.

<(1) Formation of a Coating Film>

The above solution was applied to a silicon substrate with a spinner and prebaked on a hot plate at 90° C. for 2 minutes to form a 1.0 μm thick coating film.

<(2) Formation of a Refractive Index Pattern>

The coating film obtained as described above was exposed to 50 mJ/cm² of radiation at the optimum focusing depth with the NSR1505i6A reduction projection exposure device (of Nikon Corporation, NA =0.45, λ=365 nm). The coating film was then post exposured baked at 130° C. for 2 minutes to form a refractive index pattern having a refractive index difference between exposed and unexposed portions. As for the refractive index pattern formed herein, the exposed portion will be referred to as "low-refractive index portion" and the unexposed portion will be referred to as "high-refractive index portion" hereinafter.

<(3) Measurement of Refractive Index>

The refractive indices of the low-refractive index portion and the high-refractive index portion of the refractive index pattern formed as described above were measured with the Auto EL IV NIR III ellipsometer (of Rudolf Research Co., Ltd.) at 633 nm. The results are shown in Table 3.

<(4) Evaluation of Transparency>

A refractive index pattern was formed on a glass substrate in the same manner as (1) and (2) above except that a glass substrate made from the Corning 1737 (of Corning Co., Ltd.) was used in place of the silicon substrate. The exposed portion of the refractive index pattern formed on the glass substrate will be referred to as "low-refractive index portion" and the unexposed portion will be referred to as "high-refractive index portion" as well hereinafter.

Then, the transmissions of the low-refractive index portion and the high-refractive index portion of the glass substrate having this refractive index pattern were measured with the 150-20 Double Beam spectrophotometer (of Hitachi, Ltd.) at a wavelength of 400 to 800 nm. It can be said that when the minimum transmission exceeds 95%, the transmission is satisfactory and when the minimum transmission is 95% or less, the transmission is unsatisfactory. The results are shown in Table 3.

<(5) Stabilization>

150 ml of phenyl glycidyl ether (containing 0.1 mmol of tetrabutylammonium bromide as a reaction catalyst) as the component (D) was heated at 100° C. and the refractive index patterns formed on the silicon substrate and the glass substrate as described above were immersed in the phenyl glycidyl ether at 100° C. for 2 minutes and washed with super pure water for 1 minute.

Then, the entire surfaces of the patterns were re-exposed to 4.5 mW/cm² of radiation using the Canon PLA-501F without a filter for 1 minute and heated in an oven at 200° C. for 10 minutes to stabilize the refractive index patterns.

<(6) Evaluation of Refractive Index and Transparency>

The refractive indices of the low-refractive index portion and the high-refractive index portion of the, above stabilized refractive index pattern formed on the silicon substrate were measured in the same manner as in (3) above. The results are shown in Table 4.

The transparencies of the low-refractive index portion and the high-refractive index portion of the above stabilized refractive index pattern formed on the glass substrate were measured in the same manner as in (4) above. The results are shown in Table 4.

<(7) Evaluation of Stability of Refractive Index Pattern>

The entire surface of the above stabilized refractive index pattern formed on the silicon substrate and the entire surface of the above stabilized refractive index pattern formed on the glass substrate were exposed to 4.5 mW/cm² of radiation for 30 minutes using the Canon PLA-501F without a filter to carry out the acceleration of exposure to radiation.

The refractive indices of the low-refractive index portion and the high-refractive index portion of the thus treated refractive index pattern formed on the silicon substrate were measured in the same manner as in (3) above. The results are shown in Table 4.

The transparencies of the low-refractive index portion and the high-refractive index portion of the stabilized refractive index pattern formed on the glass substrate were measured in the same manner as in (4) above. The results are shown in Table 4.

Example 18

Evaluations were carried out in the same manner as in Example 17 except that 50 parts by weight of the compound (A-12) was used as the component (A), the PEB temperature in the step (2) (formation of a refractive index pattern) was changed as shown in Table 3, and the type of the component (D) and the stabilization temperature in the step (5) (stabilization) were changed as shown in Table 4. The results are shown in Table 3 and Table 4.

Example 19

Evaluations were carried out in the same manner as in Example 17 except that 50 parts by weight of the compound (A-1) was used as the component (A), the amount of exposure in the step (2) (formation of a refractive index pattern) was changed as shown in Table 3, and the type of the component (D) and the stabilization temperature in the step (5) (stabilization) were changed as shown in Table 4. The results are shown in Table 3 and Table 4.

Example 20

Evaluations were carried out in the same manner as in Example 17 except that 50 parts by weight of the compound (A-8) was used as the component (A), 5 parts by weight of N-(2-nitrobenzyloxycarbonyl)pyrrolidine was used as the component (C), the amount of exposure in the step (2) (formation of a refractive index pattern) was changed as shown in Table 3, and the type of the component (D) in the step (5) (stabilization) was changed as shown in Table 4. The results are shown in Table 3 and Table 4.

Example 21

Evaluations were carried out in the same manner as in Example 17 except that a solution containing the polymer (B-2) (equivalent to 50 parts by weight (solid content) of the polymer (B-2)) was used as the component (B). The results are shown in Table 3 and Table 4.

Example 22

Evaluations were carried out in the same manner as in Example 17 except that 1 part by weight of 4-phenylthiophenyldiphenylsulfonium trifluoromethanesulfonate was used as the component (C) and the amount of exposure in the step (2) (formation of a refractive index pattern) was changed as shown in Table 3. The results are shown in Table 3 and Table 4.

Example 23

Evaluations were carried out in the same manner as in Example 20 except that the amount of exposure in the step (2) (formation of a refractive index pattern) was changed as shown in Table 3. The results are shown in Table 3 and Table 4.

TABLE 3

| | refractive index pattern formation conditions | | optical properties before stabilization | | | |
|---|---|---|---|---|---|---|
| | | | refractive index | | transparency | |
| | amount of exposure (mJ/cm$^2$) | PEB temperature (° C.) | low-refractive index portion | high-refractive index portion | low-refractive index portion (%) | high-refractive index portion (%) |
| Ex. 1 | 50 | 130 | 1.42 | 1.53 | 99.3 | 99.0 |
| Ex. 2 | 50 | 120 | 1.42 | 1.55 | 99.3 | 98.6 |
| Ex. 3 | 20 | 130 | 1.42 | 1.52 | 99.3 | 99.0 |
| Ex. 4 | 80 | 130 | 1.42 | 1.58 | 98.9 | 98.6 |
| Ex. 5 | 50 | 130 | 1.42 | 1.52 | 99.3 | 99.1 |
| Ex. 6 | 40 | 130 | 1.42 | 1.53 | 99.3 | 99.0 |
| Ex. 7 | 90 | 130 | 1.42 | 1.58 | 98.9 | 98.6 |

Ex.: Example

TABLE 4

| | stabilization conditions | | optical properties after stabilization | | | | optical properties after acceleration of exposure to radiation | | | |
|---|---|---|---|---|---|---|---|---|---|---|
| | | | refractive index | | transparency | | refractive index | | transparency | |
| | type of component (D) | temperature (° C.) | low-refractive index portion | high-refractive index portion | low-refractive index portion (%) | high-refractive index portion (%) | low-refractive index portion | high-refractive index portion | low-refractive index portion (%) | high-refractive index portion (%) |
| Ex. 1 | D-1 | 100 | 1.42 | 1.54 | 99.3 | 99.0 | 1.42 | 1.54 | 99.3 | 99.0 |
| Ex. 2 | D-2 | 20 | 1.42 | 1.55 | 99.3 | 98.7 | 1.42 | 1.55 | 99.3 | 98.7 |
| Ex. 3 | D-2 | 20 | 1.42 | 1.54 | 99.3 | 99.0 | 1.42 | 1.54 | 99.3 | 99.0 |
| Ex. 4 | D-3 | 100 | 1.42 | 1.58 | 98.9 | 98.6 | 1.42 | 1.58 | 98.9 | 98.6 |
| Ex. 5 | D-1 | 100 | 1.42 | 1.54 | 99.3 | 99.1 | 1.42 | 1.54 | 99.3 | 99.1 |
| Ex. 6 | D-1 | 100 | 1.42 | 1.54 | 99.3 | 99.0 | 1.42 | 1.54 | 99.3 | 99.0 |
| Ex. 7 | D-3 | 100 | 1.42 | 1.58 | 98.9 | 98.6 | 1.42 | 1.58 | 98.9 | 98.6 |

Ex.: Example

In Table 4, symbols for the component (D) denote the following.

D-1: phenyl glycidyl ether (containing 10 mol % of tetrabutylammonium bromide)
D-2: 1% aqueous solution of p-xylylenediamine
D-3: 3-phenoxypropylene sulfide (containing 10 mol % of tetrabutylammonium bromide)

Example 24

50 parts by weight of the compound (A-11) as the component (A), a solution containing the polymer (B-1) (equivalent to 50 parts by weight (solid content) of the polymer (B-1)) as the component (B), 1 part by weight of 2-(4-methoxyphenyl)-4,6-bis(trichloromethyl)-s-triazine as the component (C) and 10 parts by weight of bisphenol A diglycidyl ether as the component (D) were dissolved in diethylene glycol ethyl methyl ether to a total solids content of 20% and the resulting solution was filtered with a membrane filter having a pore diameter of 0.2 μm to prepare a solution of a refractive index changing composition.

The formation of a coating film, the formation of a refractive index pattern, the measurement of refractive index, the evaluation of transparency and the evaluations of refractive index and transparency were carried out in the same manner as in Example 17.

<(5) Stabilization>

The refractive index patterns formed on the silicon substrate and the glass substrate formed as described above were heated at 150° C. (a temperature at which the component (A) did not decompose and the component (A) and the component (D) reacted with each other) for 2 minutes.

Then, the entire surfaces of the patterns were re-exposed to 4.5 mW/cm² of radiation using the Canon PLA-501F without a filter for 1 minute and heated in an oven at 200° C. for 10 minutes to stabilize the refractive index patterns.

<(7) Re-exposure and Heating>

The entire surfaces of the refractive index patterns stabilized as described above were exposed to 4.5 mW/cm² of radiation for 1 minute using the Canon PLA-501F without a filter without and heated in an oven at 200° C. for 10 minutes.

<(8) Evaluation of Stability After Re-exposure and Heating>

The refractive indices of the low-refractive index portion and the high-refractive index portion of the re-exposed and heated refractive index pattern formed on the silicon substrate were measured in the same manner as the above measurement of a refractive index (3) so as to evaluate the stability of refractive index to re-exposure and heating.

The transparencies of the low-refractive index portion and the high-refractive index portion of the re-exposed and heated refractive index pattern formed on the glass substrate were measured in the same manner as the above evaluation of transparency (4) so as to evaluate the stability of transparency to re-exposure and heating. The results are shown in Table 5 and Table 6.

Example 25

Evaluations were carried out in the same manner as in Example 24 except that 50 parts by weight of the compound (A-12) was used as the component (A), the PEB temperature 3in the step (2) (formation of a refractive index) was changed as shown in table 5, and the heating temperature in the step (5) (stabilization) was changed as shown in Table 6. The results are shown in Table 5 and Table 6.

Example 26

Evaluations were carried out in the same manner as in Example 24 except that 50 parts by weight of the compound (A-15) was used as the component (A) and the amount of exposure in the step (2) (formation of a refractive index pattern) was changed as shown in Table 5. The results are shown in Table 5 and Table 6.

Example 27

Evaluations were carried out in the same manner as in Example 24 except that 50 parts by weight of the compound (A-16) was used as the component (A), 5 parts by weight of N-(2-nitrobenzyloxycarbonyl)pyrrolidine was used as the component (C), and the amount of exposure in the step (2) (formation of a refractive index pattern) was changed as shown in Table 5. The results are shown in Table 5 and Table 6.

Example 28

Evaluations were carried out in the same manner as in Example 24 except that a solution containing the polymer (B-2) (equivalent to 50 parts by weight (solid content) of the polymer (B-2)) was used as the component (B). The results are shown in Table 5 and Table 6.

Example 29

Evaluations were carried out in the same manner as in Example 24 except that 10 parts by weight of 1,4-bis(4,5-dihydro-2-oxazolyl)benzene was used as the component (D) and the amount of exposure in the step (2) (formation of a refractive index pattern) was changed as shown in Table 5. The results are shown in Table 5 and Table 6.

Example 30

Evaluations were carried out in the same manner as in Example 27 except that 10 parts by weight of 1,4-bis(4,5-dihydro-2-oxazolyl)benzene was used as the component (D) and the amount of exposure in the step (2) (formation of a refractive index pattern) was changed as shown in Table 5. The results are shown in Table 5 and Table 6.

TABLE 5

| | refractive index pattern formation conditions | | optical properties before stabilization | | | |
|---|---|---|---|---|---|---|
| | | | refractive index | | transparency | |
| | amount of exposure (mJ/cm²) | PEB temperature (° C.) | low-refractive index portion | high-refractive index portion | low-refractive index portion (%) | high-refractive index portion (%) |
| Ex. 24 | 50 | 130 | 1.44 | 1.53 | 99.3 | 99.0 |
| Ex. 25 | 50 | 120 | 1.44 | 1.55 | 99.3 | 98.6 |
| Ex. 26 | 20 | 130 | 1.44 | 1.52 | 99.3 | 99.0 |
| Ex. 27 | 80 | 130 | 1.44 | 1.58 | 98.9 | 98.6 |
| Ex. 28 | 50 | 130 | 1.44 | 1.52 | 99.3 | 99.1 |
| Ex. 29 | 40 | 130 | 1.44 | 1.53 | 99.3 | 99.0 |
| Ex. 30 | 90 | 130 | 1.44 | 1.58 | 98.9 | 98.6 |

Ex.: Example

TABLE 6

| | stabilization conditions temperature (° C.) | refractive index | | transparency | | refractive index | | transparency | |
| | | low-refractive index portion | high-refractive index portion | low-refractive index portion (%) | high-refractive index portion (%) | low-refractive index portion | high-refractive index portion | low-refractive index portion (%) | high-refractive index portion (%) |
| --- | --- | --- | --- | --- | --- | --- | --- | --- | --- |
| | | optical properties after stabilization | | | | optical properties after acceleration of exposure to radiation | | | |
| Ex. 24 | 200 | 1.44 | 1.53 | 99.1 | 98.8 | 1.44 | 1.53 | 99.1 | 98.8 |
| Ex. 25 | 140 | 1.44 | 1.54 | 99.1 | 98.5 | 1.44 | 1.54 | 99.1 | 98.5 |
| Ex. 26 | 150 | 1.44 | 1.52 | 99.1 | 98.8 | 1.44 | 1.52 | 99.1 | 98.8 |
| Ex. 27 | 150 | 1.44 | 1.57 | 98.7 | 98.4 | 1.44 | 1.57 | 98.7 | 98.4 |
| Ex. 28 | 150 | 1.44 | 1.52 | 99.1 | 98.9 | 1.44 | 1.52 | 99.1 | 98.9 |
| Ex. 29 | 150 | 1.44 | 1.53 | 99.1 | 98.8 | 1.44 | 1.53 | 99.1 | 98.8 |
| Ex. 30 | 150 | 1.44 | 1.57 | 98.7 | 98.4 | 1.44 | 1.57 | 98.7 | 98.4 |

Ex.: Example

Example 31

50 parts by weight of the compound (A-11) as the component (A), a solution containing the compound (B-4) (equivalent to 50 parts by weight (solid content) of the compound (B-4)) as the component (B) and 1 part by weight of 4-phenylthiophenyldiphenylsulfonium trifluoromethanesulfonate as the component (C) were dissolved in diethylene glycol ethyl methyl ether to a total solids content of 20% and the resulting solution was filtered with a membrane filter having a pore diameter of 0.2 μm to prepare a refractive index changing composition.

<Formation of a Coating Film>

The above solution was applied to a silicon substrate with a spinner and prebaked on a hot plate at 100° C. for 2 minutes to form a 1.0 μm thick coating film.

The <Formation of a Refractive Index Pattern>, <stabilization>, <measurement of refractive index> and <evaluation of transparency> were carried out in the same manner as in Example 17.

<Measurement of Porosity with a Mercury Porosimeter>

The porosities of the low-refractive index portion and the high-refractive index portion of the refractive index pattern formed above were measured with a mercury porosimeter (Autopore 9200 of Shimadzu Corporation, the minimum measurable pore diameter of 34 Å).

<Measurement of Pore Distribution by BJH Method>

The pore distribution of the low-refractive index portion of the refractive index pattern formed above was measured by the BJH method using the OMNISORP 100/360 SERIES of COULTER Co., Ltd. The number of pores having a diameter of 100 nm or more is shown in Table 8.

<Measurement of Pore Diameter by Electron Microscopic Observation>

The diameter of each pore in the low-refractive index portion and the high-refractive index portion of the refractive index pattern formed above was measured by observation through a transmission electron microscope to count pores having a diameter of 100 nm or more per 10 μm² of an arbitrary observation range.

Example 32

Evaluations were carried out in the same manner as in Example 31 except that 50 parts by weight of the compound (A-12) was used as the component (A), the PEB temperature in the step (2) (formation of a refractive index pattern) was changed as shown in Table 7, and the type of the component (D) and the stabilization temperature in the step (3) (stabilization) were changed as shown in Table 8. The results are shown in Table 7 and Table 8.

Example 33

Evaluations were carried out in the same manner as in tat Example 31 except that 50 parts by weight of the compound (A-15) was used as the component (A), the amount of exposure in the step (2) (formation of a refractive index pattern) was changed as shown in Table 7, and the type of the component (D) and the stabilization temperature in the step (3) (stabilization) were changed as shown in Table8. The results are shown in Table 7 and Table 8.

Example 34

Evaluations were carried out in the same manner as in Example 31 except that 50 parts by weight of the compound (A-16) was used as the component (A), 5 parts by weight of N-(2-nitrobenzyloxycarbonyl)pyrrolidine was used as the component (C), the amount of exposure in the step (2) (formation of a refractive index pattern) was changed as shown in Table 7, and the type of the component (D) in the step (3) (stabilization) was changed as shown in Table 8. The results are shown in Table 7 and Table 8.

Example 35

Evaluations were carried out in the same manner as in Example 31 except that a solution containing the compound (B-3) (equivalent to 50 parts by weight (solid content) of the compound (B-3)) was used as the component (B). The results are shown in Table 7 and Table 8.

TABLE 7

| | refractive index pattern forming conditions | | stabilization conditions | |
| --- | --- | --- | --- | --- |
| | amount of exposure (mJ/cm²) | PEB temperature (° C.) | type of component (D) | temperature (° C.) |
| Ex. 31 | 80 | 100 | D-1 | 80 |
| Ex. 32 | 80 | 100 | D-2 | 20 |
| Ex. 33 | 60 | 100 | D-2 | 20 |
| Ex. 34 | 100 | 100 | D-1 | 80 |
| Ex. 35 | 80 | 150 | D-1 | 80 |

Ex.: Example

In Table 7, symbols for the component (D) denote the following.

D-1; phenyl glycidyl ether (containing 10 mol % of tetrabutylammonium bromide)

D-2; 1% aqueous solution of p-xylylenediamine

TABLE 8

| | refractive index | | porosity | | pore | | transmission | |
|---|---|---|---|---|---|---|---|---|
| | | | low-refractive | high-refractive | distribution | diameter of pore | low-refractive | high-refractive |
| | low-refractive index portion | high-refractive index portion | index portion (%) | index portion (%) | low-refractive index portion | low-refractive index portion | index portion (%) | index portion (%) |
| Ex. 31 | 1.31 | 1.54 | 28 | 0 | 0 | 0 | 98.5 | 98.1 |
| Ex. 32 | 1.30 | 1.55 | 30 | 0 | 0 | 0 | 98.5 | 98.1 |
| Ex. 33 | 1.27 | 1.54 | 38 | 0 | 0 | 0 | 98.5 | 98.2 |
| Ex. 34 | 1.33 | 1.58 | 22 | 0 | 0 | 0 | 98.2 | 97.7 |
| Ex. 35 | 1.37 | 1.54 | 11 | 0 | 0 | 0 | 98.5 | 98.0 |

Ex.: Example

Example 36

Production of GI Type Optical Fiber (1)

50 parts by weight of the compound (A-6) as the component (A), 50 parts by weight of a condensate of methyltrimethoxysilane (weight average molecular weigh of 18,000) as the component (B), 1 part by weight of 4-phenylthiophenyldiphenylsulfonium trifluoromethanesulfonate as the component (C) and 1.5 parts by weight of 2-(2-hydroxy-3,5-bis($\alpha,\alpha$-dimethylbenzyl)phenyl)-2H-benzo triazole as an ultraviolet light absorber were dissolved in methyl ethyl ketone to a total solids content of 70%. This solution was used as a fiber stock solution, defoamed and extruded from an injection nozzle having an opening diameter of 1.0 mm at a rate of 1 m/min, and the injected fiber was uniformly exposed to light from a 250 mW super high pressure mercury lamp (Spot Cure of Ushio Inc., i-ray illuminance of 6.7 mW/cm$^2$) from therearound using the ring light guide of Nippon PI Co., Ltd. (inner diameter of 55 mm) and then heated at 200° C. for 5 seconds at an irradiation width of an infrared lamp of 10 cm.

An acid generated from the component (C) was mostly distributed near the surface of the fiber by exposure from therearound and further the decomposition of the component (A) by heating dwindled gradually from a portion near the surface to the interior, thereby producing an GI type optical fiber whose refractive index decreased in a parabolic manner from the center axis to the periphery. When the refractive index was measured with an interference refractometer, the maximum refractive index difference $\Delta n$ between the center and the periphery was 0.09.

Example 37

Production of GI Type Optical Fiber (2)

A GI type optical fiber was produced in the same manner as in Example 36 except that 50 parts by weight of the compound (A-5) was used as the component (A). When the refractive index of the optical fiber was measured with an interference refractometer, the maximum refractive index difference $\Delta n$ between the center and the periphery was 0.11.

Example 38

Production of GI Type Optical Fiber (3)

A GI type optical fiber was produced in the same manner as in Example 36 except that 1 part by weight of 2-(4-methoxyphenyl)-bis(4,6-trichloromethyl)-s-triazine was used as the component (C). When the refractive index of the optical fiber was measured with an interference refractometer, the maximum refractive index difference $\Delta n$ between the center and the periphery was 0.09.

Example 39

Production of GRIN Lens (1)

GRIN lenses whose refractive indices were continuously distributed from the center to the periphery were obtained by cutting short the GI type optical fibers produced in Examples 36 to 38.

Example 40

Production of GRIN Lens (2)

50 parts by weight of the compound (A-2) as the component (A), 50 parts by weight of a condensate of methyltrimethoxysilane (weight average molecular weight of 18,000) as the component (B), 1 part by weight of 4-phenylthiophenyldiphenylsulfonium trifluoromethanesulfonate as the component (C) and 1.5 parts by weight of 2-(2-hydroxy-3,5-bis($\alpha,\alpha$-dimethylbenzyl)phenyl)-2H-benzo triazole as an ultraviolet light absorber were dissolved in methyl ethyl ketone to a total solids content of 70%, and the resulting solution was formed into a disk sample having a diameter of 2 cm and a thickness of 5 mm under reduced pressure by a hot press. The diaphragm 2which could be opened or closed of the exposure device was installed in front of the disk sample 1 as shown in FIG. 1, the disk sample was exposed to ultraviolet radiation 4 having a wavelength of 365 nm and an illuminance of 30 mW/cm$^2$ from the exposure device 3 by gradually opening the closed diaphragm 2, the shutter speed was adjusted such that the diaphragm 2 was fully opened in 5 seconds, exposure was completed after 5 seconds, and the disk sample was post exposured baked at 120° C. for 2 minutes. Thereby, an optically molded disk whose refractive index increased continuously from the center to the periphery was obtained. The optically molded product had a refractive index difference of 0.08, functioned as a GRIN lens having concave lens power and showed potential as a myopic spectacle lens.

Example 41

Production of GRIN Lens (3)

A disk sample was obtained in the same manner as in Example 40. The top and bottom portions of the cylinder of the disk sample were shielded from light and light could be input from the side only. In this state, the sample was exposed to radiation from a 250 mW super high pressure mercury lamp (Spot Cure of Ushio Inc., i-ray illuminance: 6.7 mW/cm$^2$) using the ring light guide of Nippon PI Co., Ltd. (inner diameter of 55 mm) for 20 seconds and post exposed baked at 120° C. for 2 minutes. Thereby, an optically molded disk whose refractive index continuously decreased from the center to the periphery was obtained. The optically molded product had a refractive index difference of 0.08 and functioned as a GRIN lens having convex lens power.

Example 42

Production of GI Type Optical Waveguide 50 parts by weight of the compound (A-2) as the component (A), 50 parts by weight of a condensate of methyltrimethoxysilane (weight average molecular weight of 2,000) as the component (B) and 1 part by weight of 4-phenylthiophenyldiphenylsulfonium trifluoromethanesulfonate as the component (C) were dissolved in diethylene glycol ethyl methyl ether to a total solids content of 40%, and the resulting solution was filtered with a membrane filter having a pore diameter of 1.0 μm to prepare a solution containing a photosensitive refractive index changing composition (S-1). 100 parts by weight of a condensate of methyltrimethoxysilane (weight average molecular weight of 2,000) used as the component (B) and 1 part by weight of the SI-L150 (of Sanshin Kagaku Co., Ltd.) as a thermally acid generator were dissolved in diethylene glycol ethyl methyl ether to a total solids content of 40% to prepare a solution (S-2).

The solution (S-2) was first applied to the surface of a silicon substrate with a spin coater and dried at 70° C. for 10 minutes, and the entire surface of the formed coating film was exposed to ultraviolet radiation having an illuminance of 4.0 mW/cm$^2$ and a wavelength of 365 nm for 5 seconds to form a 10 μm-thick lower clad layer. Thereafter, the solution (S-1) was applied to the lower clad layer with a spin coater and dried at 70° C. for 10 minutes to form a 10 μm-thick intermediate layer which was then exposed to ultraviolet radiation having an illuminance of 4.0 mW/cm$^2$ and a wavelength of 365 nm for 10 seconds through a photomask having an optical waveguide pattern and a width of 4 to 20 μm for 10 seconds. Thereafter, the intermediate layer was post exposured baked at 120° C. for 2 minutes. The unexposed portion served as a core portion and the exposed portion served as a side clad layer. The solution (S-2) was applied to this intermediate layer with a spin coater and dried at 70° C. for 10 minutes to form a 10 μm-thick upper clad layer whose entire surface was then exposed to ultraviolet radiation having an illuminance of 4.0 mW/cm$^2$ and a wavelength of 365 nm for 5 seconds and post exposured baked at 120° C. for 2 minutes to produce an optical waveguide. The refractive indices for light having a wavelength of 1,550 nm of the formed upper, side and lower clad layers were 1.42. In contrast to this, the refractive index for light having a wavelength of 1,550 nm of the core layer was 1.50 and the maximum refractive index difference Δn was 0.08. As the obtained optical waveguide contained an optically acid generator in the upper and lower clad layers, the diffusion of a slightly generated acid occurred at the interfaces between the core layer and the upper clad layer and between the core layer and the lower clad layer. Thereby, a refractive index distribution was formed at the interfaces of the upper, side and lower clad portions with the core layer, whereby the obtained optical waveguide was of a GI type. As for the obtained optical waveguide, when the loss of the waveguide was obtained by measuring the amount of light output from the other end when light having a wavelength of 1,300 nm was input from one end of the waveguide, it was 0.1 dB/cm or less.

Example 43

Production of Optical Recording Medium 50 parts by weight of the compound (A-2) as the component (A), 50 parts by weight of a condensate of methyltrimethoxysilane (molecular weight of 2,000) as the component (B) and 1 part by weight of 4-phenylthiophenyldiphenylsulfonium trifluoromethanesulfonate as the component (C) were dissolved in diethylene glycol ethyl methyl ether to a total solids content of 20% and the resulting solution was filtered with a membrane filter having a pore diameter of 0.2 μm to prepare a solution containing a photosensitive refractive index changing composition. This solution was applied to a flat polycarbonate substrate having a 60 nm-thick aluminum reflective film deposited by sputtering with a spin coater and dried at 80° C. for 2 minutes to form a 1.0 μm-thick refractive index changing layer. Thereafter, the refractive index changing layer was exposed to ultraviolet radiation having a wavelength of 365 nm and an illuminance of 40 mW/cm$^2$ through a mask having a pitch width of 0.5 μm at a track pitch of 1.6 μm for 5 seconds and post exposured baked at 120° C. for 2 minutes. Thereby, the refractive index difference between the exposed portion and the unexposed portion was 0.08 at 633 nm and could be read perfectly as an optical recording medium.

Example 44

Production of Optical IC 50 parts by weight of the compound (A-2) as the component (A), 50 parts by weight of a condensate of methyltrimethoxysilane (weight average molecular weight of 2,000) as the component (B) and 1 part by weight of 4-phenylthiophenyldiphenylsulfonium trifluoromethanesulfonate as the component (C) were dissolved in diethylene glycol ethyl methyl ether to a total solids content of 33% and the resulting solution was filtered with a membrane filter having a pore diameter of 1.0 μm to prepare a solution containing a photosensitive refractive index changing composition. This solution was applied to the surface of a glass substrate with a spin coater and dried at 70° C. for 10 minutes, and the applied layer was exposed to ultraviolet radiation having a wavelength of 365 nm and an illuminance of 4.0 mW/cm$^2$ through a mask having a width of 100 μm for 5 seconds and post exposured baked at 120° C. for 2 minutes. As a result, an optical IC having a 100 μm refractive index pattern could be obtained.

Example 45

Production of Optical Diffraction Grating

The solution prepared in Example 42 was used to produce a film sample measuring 2 cm×1 cm×10 μm. This sample was exposed to ultraviolet radiation having a wavelength of 365 nm and an illuminance of 4.0 mW/cm$^2$. Parallel rays 9 from the exposure device 8 were reflected by a reflector 7 placed at an angle of 45° and irradiated onto the film sample 5 on a stage 6 as shown in FIG. 2. The sample was illuminated with an interference pattern formed by reflected light and directly irradiated light. The sample was moved at a speed of 1 μm/min in a direction shown by an arrow in the figure upon exposure with the result that an optical diffraction grating having a cycle of 0.5 μm was obtained.

Example 46

Production of Hologram

Parallel rays having a wavelength of 365 nm and an illuminance of 4.0 mW/cm$^2$ were divided into two optical paths by a half mirror, one was let pass through a transparent substance as signal light and was interfered with the other as reference light, and the obtained interference pattern was irradiated onto the same optically molded product as in Example 45. An image of the substance recorded at a high resolution could be confirmed by illuminating the obtained optically molded product with light for reproduction.

What is claimed is:

1. A radiation sensitive refractive index changing composition comprising (A) a decomposable compound, (B) a non-decomposable compound having a lower refractive index than the decomposable compound (A), (C) a radiation sensitive decomposer and (D) a stabilizer.

2. The composition of claim 1, wherein the difference between the refractive index of a portion exposed to radiation and the refractive index of a portion unexposed to radiation is 0.02 or more.

3. The composition of claim 1, wherein the relationship between the refractive index $n_B$ of the non-decomposable compound (B) and the refractive index $n_A$ of the decomposable compound (A) satisfies the following expression (1):

$$n_A - n_B \geq 0.05 \qquad (1).$$

4. The composition of any one of claim 1, wherein the decomposable compound (A) is an acid decomposable compound, the non-decomposable compound (B) is an acid non-decomposable polymer, and the radiation sensitive decomposer (C) is a radiation sensitive acid generating agent.

5. The composition of claim 4, wherein the acid decomposable compound (A) contains at least one compound having at least one structure selected from the group consisting of structures represented by the following formulas (1) to (8):

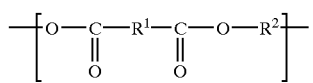

wherein $R^1$ is an alkylene group, alkylene-arylene-alkylene group or arylene group, and $R^2$ is an alkylene group, alkylene-arylene-alkylene group, arylene group, alkylsilylene group or alkylgermylene group,

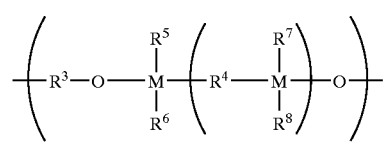

wherein M is Si or Ge, $R^3$ is an alkylene group, alkylene-arylene-alkylene group, arylene group, alkylsilylene group or alkylgermylene group, $R^4$ is an oxygen atom, alkylene group, alkylene-arylene-alkylene group, arylene group or single bond, $R^5$, $R^6$, $R^7$ and $R^8$ are each independently a hydrogen atom, alkyl group, aryl group, alkoxy group or thioalkyl group, and m is an integer of 0 to 2,

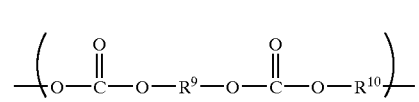

wherein $R^9$ and $R^{10}$ are each independently an alkylene group, alkylene-arylene-alkylene group, arylene group, alkylsilylene group or alkylgermylene group,

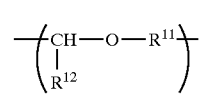

wherein $R^{11}$ is an oxyalkylene group or single bond, and $R^{12}$ is a hydrogen atom, alkyl group, alkylene-arylene-alkylene group or aryl group,

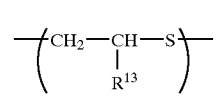

wherein $R^{13}$ is a hydrogen atom, alkyl group or aryl group,

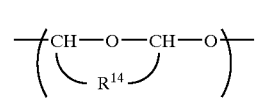

wherein $R^{14}$ is an alkylene group or a structure represented by the following formula (6)-1, (6)-2 or (6)-3:

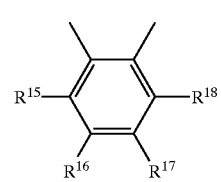

wherein $R^{15}$, $R^{16}$, $R^{17}$ and $R^{18}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms,

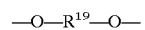

wherein $R^{19}$ is an alkylene group,

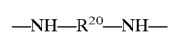

wherein $R^{20}$ is an alkylene group,

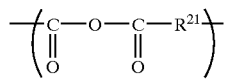 (7)

wherein $R^{21}$ is an alkylene group, alkylene-arylene-alkylene group or arylene group,

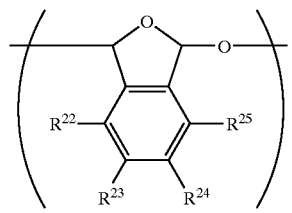 (8)

wherein $R^{22}$, $R^{23}$, $R^{24}$ and $R^{25}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms.

6. The composition of any one of claim 1, wherein the decomposable compound (A) is a base decomposable compound, the non-decomposable compound (B) is a base non-decomposable polymer, and the radiation sensitive decomposer (C) is a radiation sensitive base generating agent.

7. The composition of claim 6, wherein the decomposable compound (A) contains at least one compound having at least one structure selected from the group consisting of structures represented by the following formulas (9) to (12):

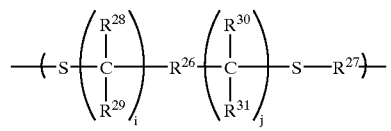 (9)

wherein $R^{26}$ is an alkylene group, aralkylene group or arylene group, $R^{27}$ is an alkylene group, aralkylene group, arylene group, alkylene-arylene-alkylene group, alkylsilylene group or alkylgermylene group, $R^{28}$, $R^{29}$, $R^{30}$ and $R^{31}$ are each independently a hydrogen atom, alkyl group, aryl group, alkoxyl group or thioalkyl group, and i and j are each independently 0 or 1,

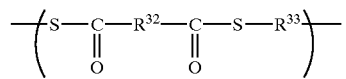 (10)

wherein $R^{32}$ is an alkylene group, aralkylene group or arylene group, and $R^{33}$ is an alkylene group, aralkylene group, arylene group, alkylene-arylene-alkylene group, alkylsilylene group or alkylgermylene group,

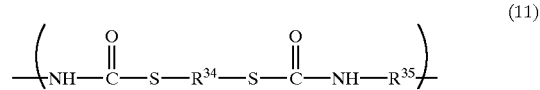 (11)

wherein $R^{34}$ and $R^{35}$ are each independently an alkylene group, aralkylene group, arylene group, alkylene-arylene-alkylene group, alkylsilylene group or alkylgermylene group,

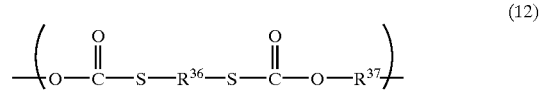 (12)

wherein $R^{36}$ and $R^{37}$ are each independently an alkylene group, aralkylene group, arylene group, alkylene-arylene-alkylene group, alkylsilylene group or alkylgermylene group.

8. The composition of any one of claims 1, wherein the stabilizer (D) is at least one selected from the group consisting of amino compound, epoxy compound, thuirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound and silyl compound.

9. The composition of claim 1 which contains a stabilizer (D) and further a catalyst for reacting the decomposable compound (A) with the stabilizer (D).

10. A refractive index pattern forming method comprising exposing a radiation sensitive refractive index changing composition comprising (A) a decomposable compound, (B) a non-decomposable compound, (C) a radiation sensitive decomposer and (D) a stabilizer to radiation and heating to react the stabilizer (D) with the decomposable compound (A) of an unexposed portion.

11. A refractive index pattern forming method comprising exposing a refractive index changing composition comprising (A) a decomposable compound, (B) a non-decomposable compound having a lower refractive index than the decomposable compound (A) and (C) a radiation sensitive decomposer to radiation through a pattern mask and treating the composition with a stabilizer (D) to react the decomposable compound (A) of an unexposed portion with the stabilizer (D).

12. A refractive index pattern forming method comprising exposing a refractive index changing composition comprising (A) a decomposable compound, (B) a non-decomposable compound having a lower refractive index than the decomposable compound (A) and (C) a radiation sensitive decomposer to radiation through a pattern mask and heating to decompose the decomposable polymer of an unexposed portion.

13. The method of claim 10, wherein the formed refractive index pattern has pores or does not have any pores in the exposed portion.

14. A refractive index pattern formed by the method of claim 10.

15. The refractive index pattern of claim 14 which consists of a first region having or not having any pores and a second region having a higher refractive index than the first region and not having any pores.

16. The refractive index pattern of claim 15, wherein the first region shows a smaller elastic modulus than the second region.

17. An optical material having a refractive index pattern formed by the method of claim 10.

18. The method of claim 11, wherein the formed refractive index pattern has pores or does not have any pores in the exposed portion.

19. The method of claim 12, wherein the formed refractive index pattern has pores or does not have any pores in the exposed portion.

20. A refractive index pattern formed by, the method of claim 11.

21. A refractive index pattern formed by method of claim 12.

22. The refractive index pattern of claim 20, which consists of a first region having or not having any pores and a second region having a higher refractive index than the first region and not having any pores.

23. The refractive index pattern of claim 21, which consists of a first region having or not having any pores and a second region having a higher refractive index than the first region and not having any pores.

24. The refractive index pattern of claim 22, wherein the first region shows a smaller elastic modulus than the second region.

25. The refractive index pattern of claim 23, wherein the first region shows a smaller elastic modulus than the second region.

26. An optical material having a refractive index pattern formed by the method of claim 11.

27. An optical material having a refractive index pattern formed by the method of claim 12.

* * * * *

UNITED STATES PATENT AND TRADEMARK OFFICE
CERTIFICATE OF CORRECTION

PATENT NO. : 6,828,078 B2
DATED : December 7, 2004
INVENTOR(S) : Nishimura et al.

It is certified that error appears in the above-identified patent and that said Letters Patent is hereby corrected as shown below:

<u>Title page,</u>
Items [45] and [*] Notice, should read as follows:
-- [45] **Date of Patent: *Dec. 7, 2004**

[*] Notice: Subject to any disclaimer, the term of this patent is extended or adjusted under 35 U.S.C. 154(b) by 323 days.

This Patent is subject to a terminal disclaimer. --.

Signed and Sealed this

Twenty-fifth Day of October, 2005

JON W. DUDAS
*Director of the United States Patent and Trademark Office*